United States Patent [19]
Ozawa et al.

[11] Patent Number: 5,739,898
[45] Date of Patent: Apr. 14, 1998

[54] EXPOSURE METHOD AND APPARATUS

[75] Inventors: Toshihiko Ozawa, Yokohama; Masaya Komatsu, Fukaya; Masato Shibuya, Ohmiya; Hiroshi Ooki, Yokohama; Masaomi Kameyama, Bunkyo-ku; Yoshifumi Tokoyoda, Chiba, all of Japan

[73] Assignee: Nikon Corporation, Japan

[21] Appl. No.: 312,241

[22] Filed: Sep. 26, 1994

Related U.S. Application Data

[63] Continuation-in-part of Ser. No. 191,383, Feb. 3, 1994, abandoned.

[30] Foreign Application Priority Data

| Mar. 8, 1994 | [JP] | Japan | 6-036750 |
| Mar. 9, 1994 | [JP] | Japan | 6-038794 |
| May 31, 1994 | [JP] | Japan | 6-118966 |
| Jul. 8, 1994 | [JP] | Japan | 6-157389 |
| Jul. 28, 1994 | [JP] | Japan | 6-177262 |
| Sep. 6, 1994 | [JP] | Japan | 6-212440 |

[51] Int. Cl.[6] .......................... G03B 27/32; G03B 27/42
[52] U.S. Cl. .............................................. 355/53; 355/77
[58] Field of Search ................................ 355/53, 77

[56] References Cited

U.S. PATENT DOCUMENTS

| 3,620,591 | 11/1971 | Riggs | 350/6 |
| 4,759,616 | 7/1988 | Marchant |  |
| 4,984,015 | 1/1991 | Okino | 355/68 |
| 5,245,470 | 9/1993 | Keum | 359/485 |
| 5,291,240 | 3/1994 | Jain | 355/53 |
| 5,333,035 | 7/1994 | Shiraishi | 355/53 X |
| 5,357,311 | 10/1994 | Shiraishi | 355/53 |
| 5,418,598 | 5/1995 | Fukuda et al. | 355/71 X |
| 5,499,137 | 3/1996 | Shiraishi | 355/53 X |

FOREIGN PATENT DOCUMENTS

| 50-17941 | 6/1975 | Japan . |
| 57-62052 | 4/1982 | Japan . |
| 61-91662 | 5/1986 | Japan . |
| 62-50811 | 3/1987 | Japan . |
| 63-58825 | 3/1988 | Japan . |
| 4-225358 | 8/1992 | Japan . |

OTHER PUBLICATIONS

Shibuya, M., *Evaluation Method for Optical Projection Lithography*, Oct. 28, 1993, pp. 29–37.
Shibuya, M. et al., *Resolution vs. Depth of Focus in the Resolution–Enhanced Optical System for Lithography*, SPIE Proc. Series, vol. 1780, Sep. 14–18, 1992, pp. 177–131.
Ooki, H. et al., *A Novel Super–Resolution Technique for Optical Lithography—Nonlinear Multiple Exposure Method*, Jpn. J. Appl. Phys., vol. 33 (1994), pp. L177–L179.
Wu, E.S., et al., *Two–Photon Lithography for Microelectronic Application*, SPIE vol. 1674 (1992), pp. 776–782.

(List continued on next page.)

*Primary Examiner*—Fred L. Braun
*Attorney, Agent, or Firm*—Pennie & Edmonds LLP

[57] ABSTRACT

The present invention relates to a projection exposure method and an exposure apparatus for projecting a pattern on a photo-mask through a projection optical system onto a predetermined photosensitive material. The photosensitive material is a nonlinear photosensitive material in which the effective light intensity distribution is nonlinear to the intensity of incident exposure light. Further, multiple exposure is made with plural patterns having a certain lateral shift therebetween, or multiple exposure is made with shifting the position of an identical pattern, whereby multiple exposure is effected with patterns different in intensity distribution on the photosensitive material. A high-resolution pattern can be formed over the resolution limit of projection optical system by the above arrangement.

30 Claims, 59 Drawing Sheets

OTHER PUBLICATIONS

Tagawa, S., *In the Photoresist, Two Photon Absorption or High–Density Excitation may be Occurred*, Nikkei MicroDevice, vol. Feb. 1987, pp. 91–100.

Dill, F. H. et al., *Characterization of Positive Photoresist*, IEEE Transactions on Electron Devices, vol. ED–22, No. 7, Jul. 1975, pp. 445–452.

Griffing, B.F., *Contrast Enhanced Photolithography*, IEEE Electron Device Letters, vol. EDL–4, No. 1, Jan. 1993, pp. 14–16.

Grigging, B.F., *Contrast Enhanced Photoresists—Processing and Modeling*, General Electric Corporate R & D Technical Information Series, Sep. 1982, Report No. 82CRD252.

Shen, Y.R., University of California, Berkeley, *The Principles of Nonlinear Optics*, Copyright © 1984 by John Wiley & Sons, Inc.

Brown, G.H., Ed., *Techniques of Chemistry—Photochromism*, vol. III, Copyright © 1971 by John Wiley & Sons, Inc.

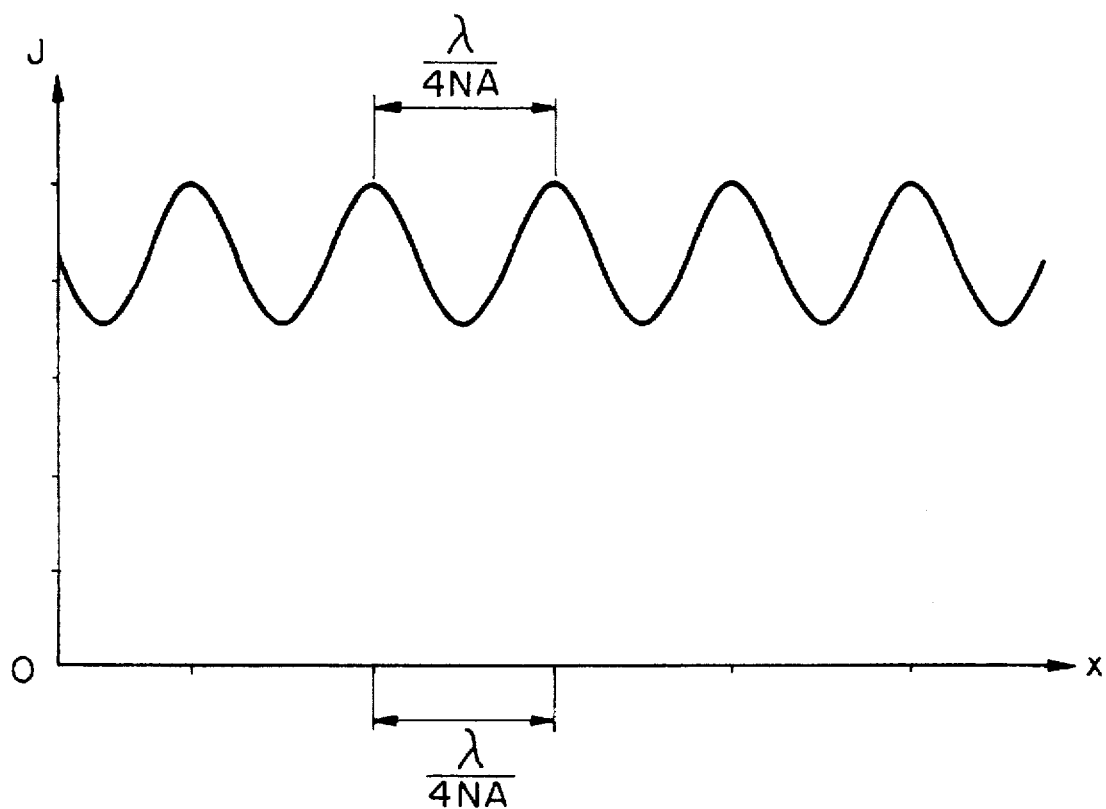

Fig./2A
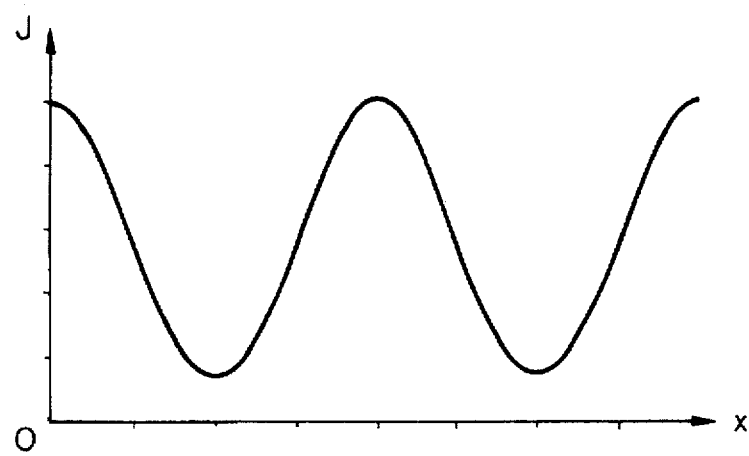
Fig./2B
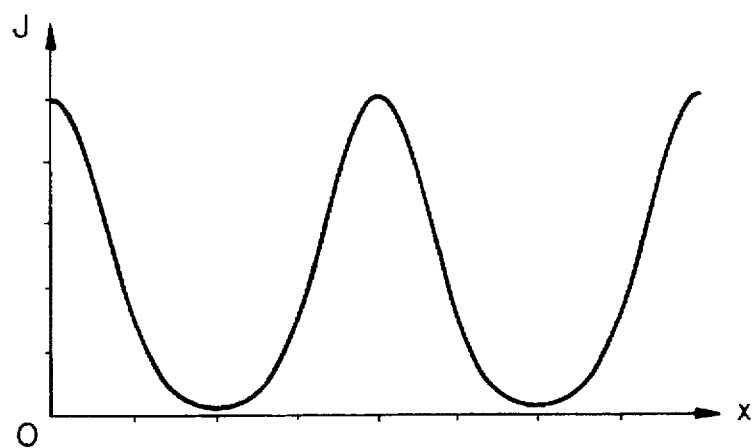

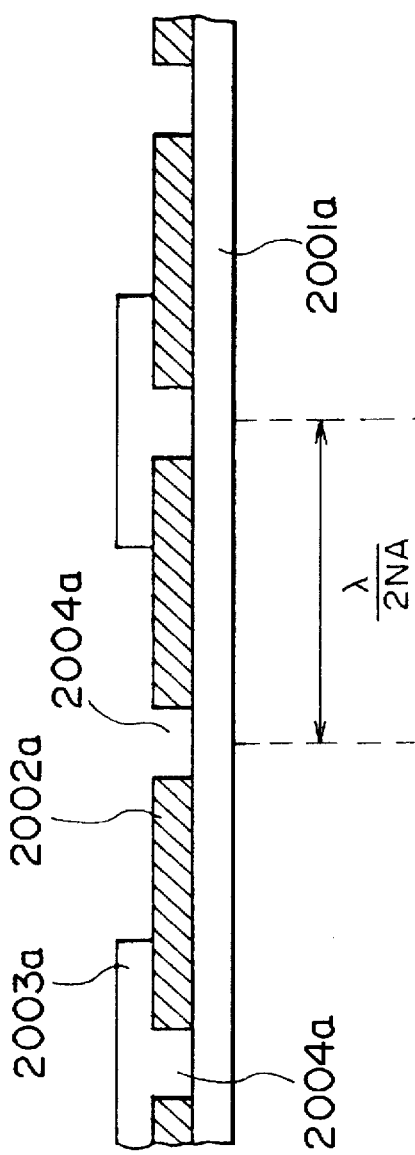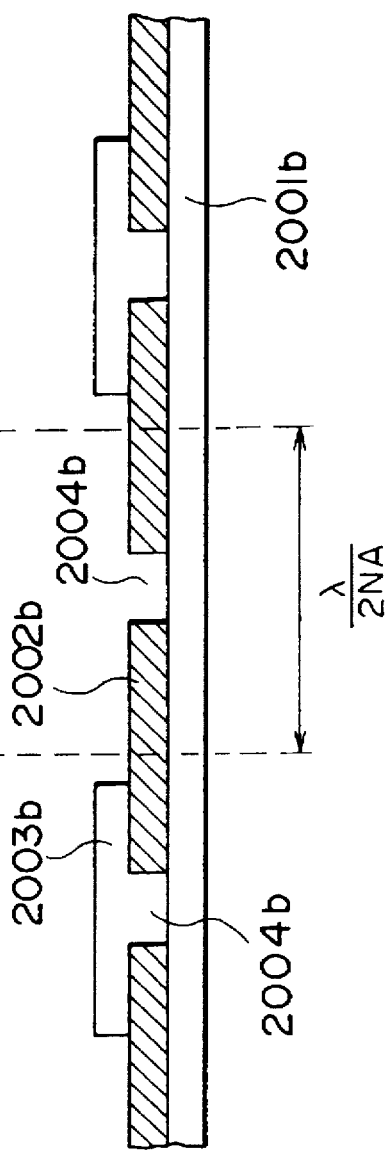
Fig. 32A
Fig. 32B

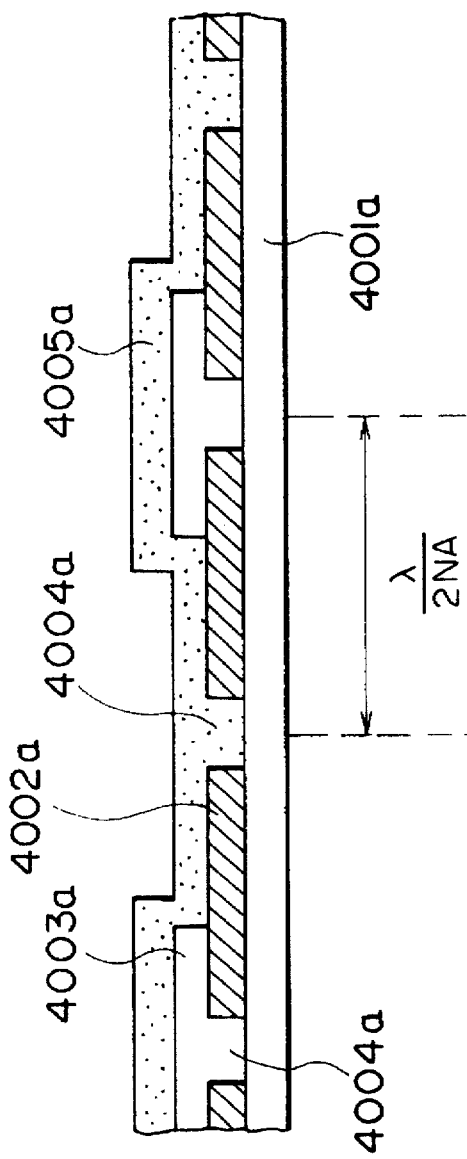
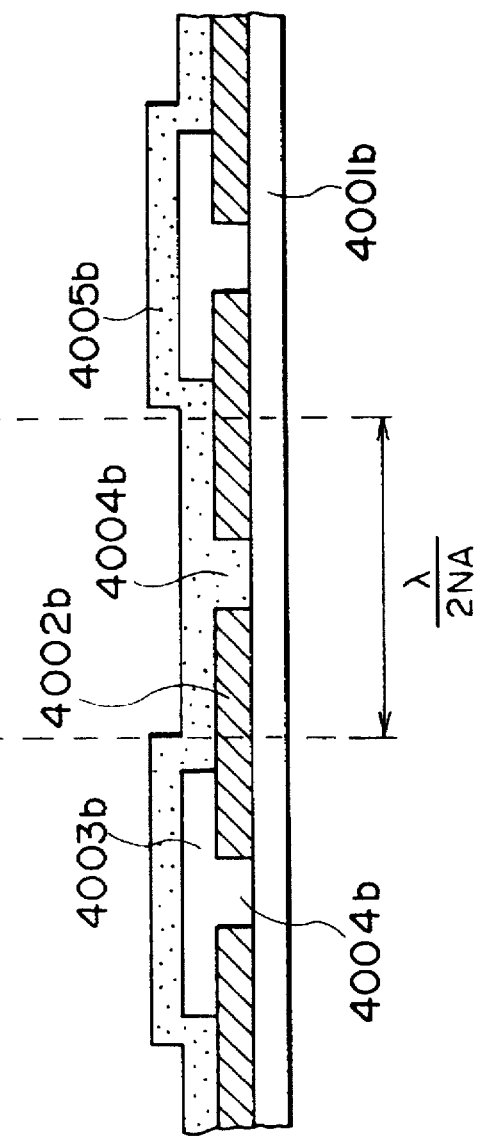
Fig. 50A
Fig. 50B

P

S

P

S

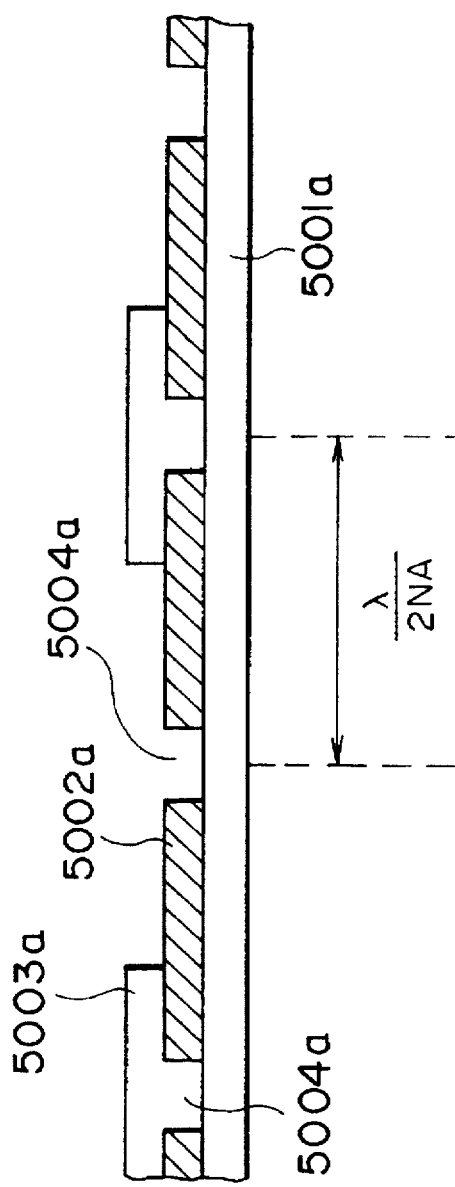
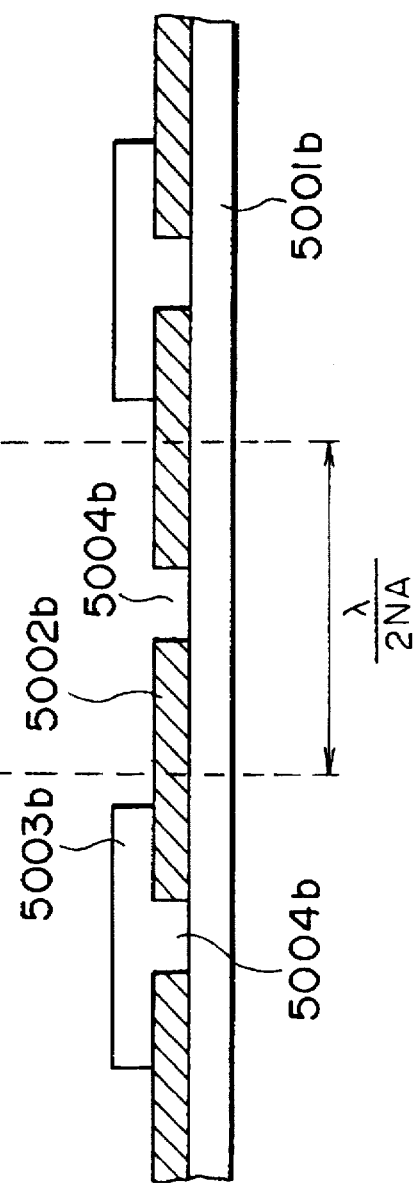

0.25μm

EXPOSURE METHOD AND APPARATUS

RELATED APPLICATIONS

This is a Continuation-In-Part application of application Ser. No. 08/191,383 filed on Feb. 3, 1994, now abandoned.

BACKGROUND OF THE INVENTION

1. Field of the Invention

The present invention relates to an exposure apparatus for producing semiconductor devices or liquid crystal display devices and so on, applying the photolithography technology, and more particularly to a projection exposure method therefor and a projection-type exposure apparatus.

2. Related Background Art

Conventional exposure methods employ such a process, for example, as disclosed in Japanese Patent Publication No. 62-50811 or EP. 90924, that predetermined transfer patterns such as circuit patterns are provided on a photo-mask or reticle and each transfer pattern is printed on a substrate by single exposure. In the process, the substrate is coated with a photosensitive material (photoresist) which has such a proportional relation that a latent image produced according to irradiated exposure light (hereinafter referred to as latent image $\xi$) is proportional to exposure intensity I. For example, conventionally generally used positive photoresists have a property as represented by the following equation.

$$\xi = \exp(-CD) \text{ and } D = I \cdot t \tag{1}$$

In the above equation, I is a light intensity at each point of the exposure pattern, t is an exposure time, and C is a characteristic constant depending upon the type of photoresist.

The Equation (1) can be generalized by the following equation.

$$\xi = \exp(-CD) \text{ and } D = J \cdot t = I^m \cdot t \tag{2}$$

In the above equation, m is an index for indicating the linearity of photoresist. Namely, a photoresist with m=1 has a linear characteristic satisfying Equation (1), while a photoresist with m≠1 shows a nonlinear characteristic. Further, the m-th power of light intensity I, that is, J ($=I^m$) is defined as effective light intensity peculiar to a photoresist for producing the latent image $\xi$ by light intensity I of exposure light irradiated onto the photoresist (hereinafter referred to as effective light intensity J).

Furthermore, assuming that image formation is completely incoherent, spectrum i of intensity distribution I(x) (hereinafter referred to as light intensity distribution) of exposure light for producing a latent image in the photoresist is given as follows with object spectrum $i_0$, OTF (Optical Transfer Function) of projection optical system in exposure apparatus being f, and spatial frequency $\nu$.

$$i(\nu) = i_0(\nu) \cdot f(\nu) \tag{3}$$

Now, a spatial frequency $\nu_0$, which is a limit frequency at which the OTF (i.e., f) becomes not significant in respect of process, is given as follows with wavelength $\lambda$ of exposure light, numerical aperture NA of projection optical system on the photosensitive material side (in the image space), and process constant $K_1$.

$$\nu_0 = 0.5 NA/(K_1 \cdot \lambda) \tag{4}$$

Further, the resolution limit of a projection optical system is theoretically determined by numerical aperture NA. In this case, $K_1 = 0.25$, and therefore a cutoff frequency $\nu_c$ of projection optical system is given as follows.

$$\nu_c = 2NA/\lambda \tag{5}$$

Accordingly, in order to achieve high-resolution exposure by the conventional technique, the wavelength $\lambda$ of exposure light must be decreased or the numerical aperture NA must be increased.

As described above, the conventional exposure methods and exposure apparatus had no other means to achieve high-resolution exposure than increasing the numerical aperture NA or decreasing the wavelength $\lambda$ of exposure light. However, since the depth of focus $F_d$ of a projection optical system is proportional to the wavelength $\lambda$ and to the inverse of the second power of numerical aperture NA, as shown by the following Equation (6), the depth of focus $F_d$ becomes shallower in both cases, which results in failing to secure the process latitude of the exposure apparatus. In addition, the scale of projection optical system must be increased or a special structure must be employed therefor, which makes it difficult to achieve a practical exposure apparatus. Further, the final resolution limit of the photosensitive material (photoresist) could not surpass (or go beyond) the resolution limit determined by the projection optical system.

$$F_d = K_2 \cdot \lambda/(NA)^2 \tag{6}$$

(where $K_2$ is the process constant.)

SUMMARY OF THE INVENTION

The present invention has been accomplished taking the above points in the conventional technology into consideration. It is an object of the present invention to provide a novel exposure method and a novel exposure apparatus which can achieve high-resolution exposure surpassing (beyond) the resolution limit of projection optical system with neither employing means to change the wavelength of exposure light nor greatly changing the structure of projection optical system (with neither increase in scale nor complexity of the system).

To achieve the above object, the present invention is directed to an exposure method and exposure apparatus for projecting patterns on a photo-mask (reticle) onto photosensitive material coated on a substrate through a projection optical system, in which the photosensitive material has nonlinear sensitivity characteristic by which a latent image is formed nonlinearly to the light intensity of incident exposure light and multiple exposure processes different in light intensity distribution are performed, whereby patterns in the photosensitive material are formed with higher resolution than the resolution limit of the projection optical system.

The photosensitive material with the nonlinear characteristic as described may be any with nonlinear characteristic, for example, those with such a nonlinear relation that the latent image ($\xi$) is emphasized according to the m-th power of incident light intensity (I) (i.e., $I^m$ where m>1), or conversely, those with such a nonlinear relation that the latent image ($\xi$) is relaxed according to the m-th power of incident light intensity (I) (i.e., $I^m$ where m<1).

An embodiment of the exposure method and exposure apparatus according to the present invention is arranged as follows. Plural types of patterns mutually spatially shifted are preliminarily prepared independent of each other on plural photo-masks, in accordance with the predetermined pattern to be formed in nonlinear photosensitive material.

The exposure processes are successively carried out to effect multiple exposure with plural light intensity distributions having certain spatial shift therebetween (which are light intensity distributions corresponding to the plural types of patterns as described above). Namely, the plural patterns are preliminarily prepared on the plural photo-masks in the relation of predetermined spatial shift therebetween, and the multiple exposure is effected based on these photo-masks to form a substantially higher-resolution exposure pattern in photosensitive material than the resolution limit of projection optical system.

Another embodiment of the exposure method and exposure apparatus according to the present invention is so arranged that a single photo-mask is prepared with a pattern corresponding to an exposure pattern of predetermined pattern to be formed in nonlinear photosensitive material and the multiple exposure is effected by shifting the photo-mask, whereby the exposure pattern is formed in the photosensitive material, with a substantially higher resolution than the resolution limit of projection optical system.

Still another embodiment of the exposure method and exposure apparatus according to the present invention is so arranged that exposure is effected with plural light intensity distributions spatially shifted each other by an arbitrary combination of the exposure processes as employed in the above two embodiments, i.e., by multiple exposure in an arbitrary combination of the multiple exposure using the plural types of photo-mask and the multiple exposure using a single specific photo-mask, whereby an exposure pattern is formed on the photosensitive material, with substantially higher resolution than the resolution limit of projection optical system.

It should be noted that the present invention is not limited to the above three embodiments described as relatively specific examples. The essence of the present invention is that multiple-exposure is effected onto nonlinear photosensitive material with two or more exposure patterns mutually spatially shifted, whereby an exposed pattern is formed in photosensitive material, with higher resolution than the resolution limit of the projection optical system.

An example of the above nonlinear photosensitive material is a resist having the two-photon absorption property as observed with aromatic materials or polystyrene materials (hereinafter referred to as a two-photon absorption resist). The nonlinearity-of such a two-photon absorption resist is described, for example, in "NIKKEI MICRODEVICES, FEBRUARY, 1987, pp. 91–101" or in "En S. Wu, et al, "TWO-PHOTON LITHOGRAPHY FOR MICROELECTRONIC APPLICATION," SPIE vol. 1674 Optical/Laser Microlithography V (1992), pp. 776–782."

Further, the above nonlinear photosensitivity may be obtained by coating the substrate with plural photosensitive materials having mutually different latent image depending upon the light intensity.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 6 is an illustration to show an effective light intensity distribution obtained by exposure in still another aspect of the first embodiment;

FIG. 12A and FIG. 12B are illustrations to show effective light intensity distributions for explaining the principle of the present invention;

FIG. 32A and FIG. 32B include cross-sectional views of reticles used in forming a one-dimensional pattern.

FIG. 50A and 50B show an example of photo-masks provided with a polarization film.

FIG. 60A and 60B include cross-sectional views to show patterns on a first photo-mask and on a second photo-mask used in the present invention.

DESCRIPTION OF THE PREFERRED EMBODIMENTS

Figure 1A:
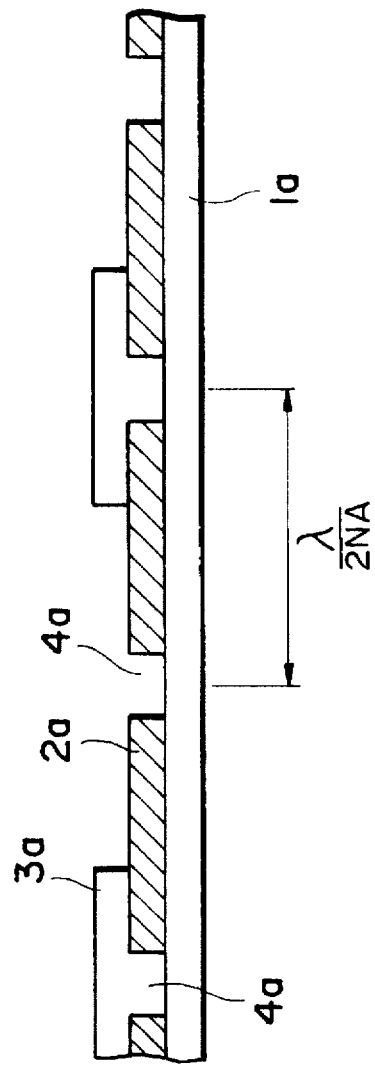
FIG. 1A and FIG. 1B are vertical sectional views to show the schematic structure of photo-mask employed in the first embodiment.

The basic principle of the present invention is first described in detail. The following description concerns only the most fundamental case, that is, a case in which double exposure is effected with two photo-masks, which are a photo-mask having a first pattern and a photo-mask having a second pattern, so as to achieve a resolution over the resolution limit of the projection optical system. A photosensitive material with nonlinear sensitivity property as stated herein means a material in which the latent image $\xi$ changes according to the m-th power (where m≠1) of light intensity I of incident exposure light. Further, an effective light intensity J is defined as an effective light intensity contributing to cause the latent image $\xi$ in the photosensitive material for light intensity I of exposure light irradiated from the projection optical system onto the photosensitive material. Then, an effective light intensity distribution J(x) is defined as the m-th power of the light intensity distribution I(x).

First described are various examples of studies conducted by Inventors before reaching the present invention. Then the principle and effect of the present invention will be described to clarify the concept of the present invention.

First considered is a first study example, in which only one exposure process is carried out with linear photosensitive material in the conventional exposure method and exposure apparatus. FIG. 12A shows an effective light intensity distribution J(x) of the linear photosensitive material in the case that an exposure pattern on the image plane in the photosensitive material takes a sinusoidal light intensity distribution as one-dimensionally seen. When single exposure is effected under incoherent illumination light, the light intensity distribution I(x) of the exposure pattern imaged on the photosensitive material through the projection optical system is given by the following equation, if the light intensity distribution of the object is expressed by $I_0(x)$ and the point spread function of projection optical system by F(x).

$$I(x)=I_0(x)*F(x) \tag{7}$$

In the above equation, x is a positional coordinate on the photosensitive material and the symbol * is an operator representing the convolution. Then, spectrum i of intensity on the image plane in the linear photosensitive material is given as follows by the convolution theorem of Fourier transformation.

$$i(v)=i_0(v)\cdot f(v) \tag{8}$$

In the above equation, v is a spatial frequency, $i_0$ a spectrum of intensity of the object, and f corresponds to the so-called OTF of the projection optical system. Accordingly, as apparent from FIG. 12A and Equation (8), the spectrum of effective light intensity distribution J(x) is not formed in a single exposure process over the cutoff frequency (2NA/v) of projection optical system and it is, therefore, impossible to surpass the resolution limit of projection optical system.

Let us consider a second study example, in which only one exposure process is carried out using photosensitive material with nonlinear sensitivity characteristic applied in the present invention, for example, two-photon absorption resist. Reference should be made as to the two-photon absorption resist, for example, to Proceedings of SPIE vol. 1674 (1992) pp. 776–778. The two-photon absorption resist has a property in which the effective light intensity distribution J(x) is proportional to the square (m=2) of light intensity distribution I(x). Then, if the intensity distribution of the exposure pattern is sinusoidal on the image plane in the two-photon absorption resist, the resultant effective light intensity distribution is sharper in some portions but duller in some other portions as shown in FIG. 12B. Although such a pattern of sharp peaks is partially with high contrast, the pitch of the pattern as shown in FIG. 12B never becomes smaller than that of light intensity distribution I(x) of the pattern, because Equation (8) is satisfied. Thus, the resolution cannot surpass the resolution limit of projection optical system. Therefore, it is understood that the higher resolution cannot be achieved simply by applying the nonlinear photosensitive material to the conventional exposure apparatus in place of the linear photosensitive material which has been generally used in the conventional apparatus.

Let us now consider a third study example, in which a nonlinear photosensitive material applied in the present invention is employed and double exposure is made at a same position onto the photosensitive material with a single pattern in a superimposed manner. Assuming the exposure is carried out under incoherent illumination light, the effective light intensity distribution J(x) is as follows with the intensity distribution of object being expressed by $I_0(x)$ and the point spread function of projection optical system by F(x).

$$J(x)=\{I(x)\}^2=\{I_0(x)*F(x)\}^2 \tag{9}$$

From this, the spectrum j of effective light intensity distribution is as follows by the convolution theorem of Fourier transformation.

$$j(v)=\{i_0(v)\cdot f(v)\}*\{i_0(v)\cdot f(v)\} \tag{10}$$

Since the effective light intensity distribution is given by Equation (9) in case of the two-photon absorption resist, the effective light intensity distribution is further sharper when compared with Equation (7) in case of the first study examples (see FIG. 12A and FIG. 12B).

While the effective light intensity distribution is sharper, the resolution is not raised in respect of the spatial frequency. Therefore, if such exposure is simply repeated twice, the resolution cannot surpass the resolution limit of projection optical system as in the second study result.

Figure 13:
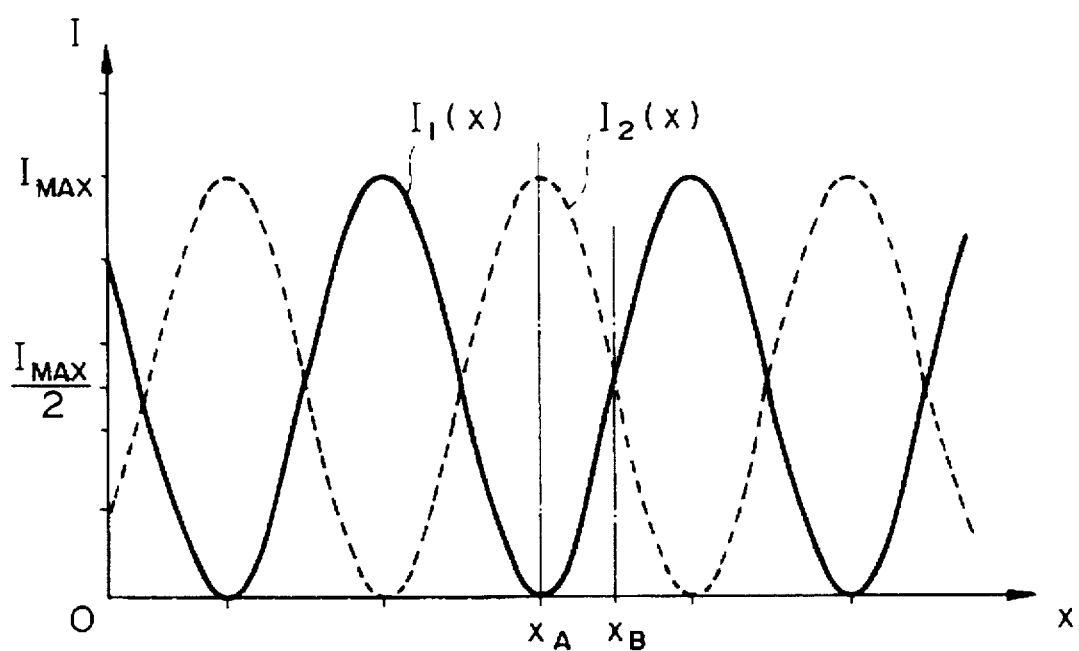
FIG. 13 is an illustration to show a light intensity distribution for explaining the principle of the present invention.
Figure 14A:
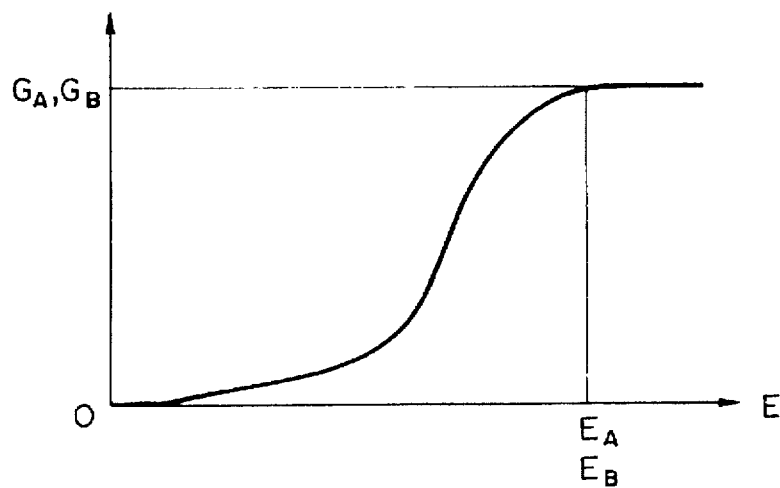
FIG. 14A, FIGS. 14B and FIG. 14C are drawings to illustrate the properties of a nonlinear photosensitive material in respect of development rate.

Now considered is a fourth study example, in which a linear photosensitive material which is conventionally generally used is employed and exposure is carried out twice with two types of intensity distributions mutually spatially shifted. For example, as shown in FIG. 13, first exposure irradiates the linear photosensitive material with an exposure pattern of a sinusoidal intensity distribution $I_1(x)$ as shown by the solid line (which is shown in one dimension for convenience), and second exposure irradiates the linear photosensitive material with an exposure pattern of a sinusoidal intensity distribution $I_2(x)$ shifted $\pi$ in phase as shown by the dotted line in FIG. 13. FIG. 14A shows the properties of the linear material about development rate against exposure, in which the horizontal axis represents the product of intensity I and exposure time t, which means exposure E. Since the exposure E corresponds to energy, the effective light intensity J and the exposure E are shown as substantially equivalent to each other.

Let us consider two different points $X_A$ and $X_B$ on the linear photosensitive material with these drawings. The intensity distribution $I_1(x)$ provides $I_1(X_A)=I_{MAX}$ as the intensity of light incident into a certain point $X_A$ on the linear photosensitive material, while the intensity distribution $I_2(x)$ provides $I_2(X_2)=0$ as the intensity of light incident into the certain point $X_A$ on the linear photosensitive material. Similarly, the intensity of light incident into another point $X_B$ spatially shifted by $\pi$ in phase from the point $X_A$ is obtained as $I_1(X_B)=I_{MAX}/2$ and $I_2(X_B)=I_{MAX}/2$. Accordingly, the exposure $E_A$ at point $X_A$ is calculated as follows.

$$E_A = \{I_1(X_A) + I_2(X_A)\} \cdot t$$
$$= \{I_{MAX} + 0\} \cdot t$$
$$= I_{MAX} \cdot t$$

Also, exposure $E_B$ at point $X_B$ is as follows.

$$E_B = \{I_1(X_B) + I_2(X_B)\} \cdot t$$
$$= \{I_{MAX}/2 + I_{MAX}/2\} \cdot t$$
$$= I_{MAX} \cdot t$$

Figure 15:
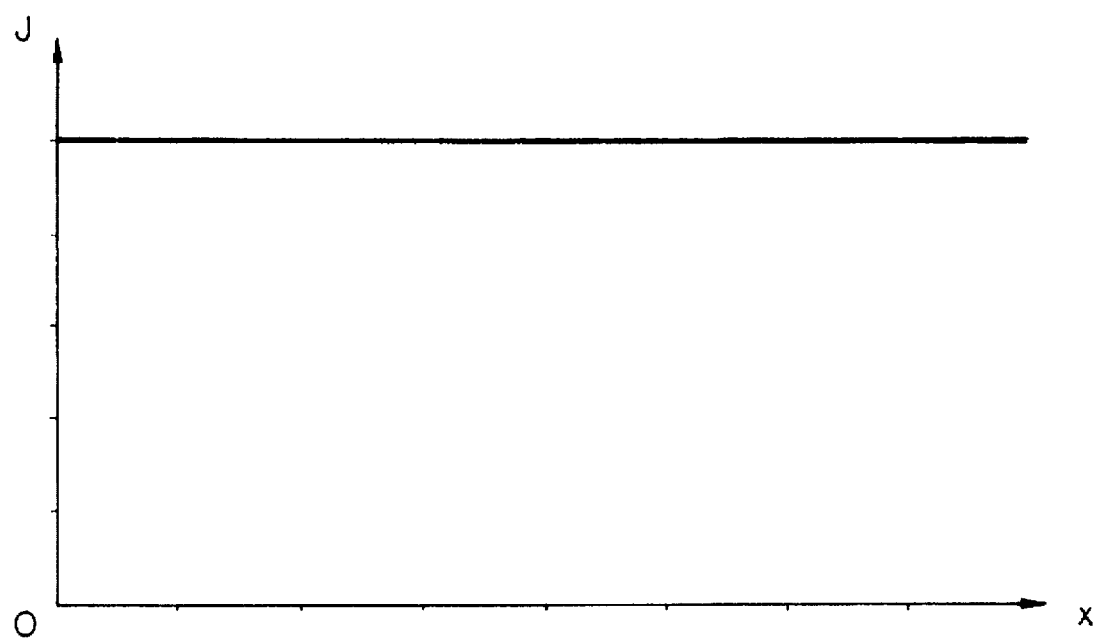
FIG. 15 is an illustration to show an effective light intensity distribution for further explaining the principle of the present invention.

Consequently, in case of the linear photosensitive material being used, development rate $G_A$ and $G_B$ at two different points $X_A$ and $X_B$ are equal to each other as shown in FIG. 14A. This means that when the exposures are carried out twice onto the linear photosensitive material with sinusaidal intensity distributions $I_1(x)$ and $I_2(x)$ spatially shifted by half period, no contrast appears after development (that is, the line-and-space pattern cannot be separated), failing to achieve higher resolution. Explaining this by the effective light intensity distribution, the distribution becomes uniform as shown in FIG. 15, which raises a problem that the desired exposure cannot be achieved to transfer the mask pattern.

The principle and effect of the present invention is next described taking the above studies into account. The present invention enables formation of finer patterns over the resolution limit of projection optical system by using a photosensitive material with nonlinear sensitivity characteristic and by carrying out multiple exposure processes with exposure patterns being mutually spatially shifted. To describe the basic concept of the present invention, let us consider an isolated pattern (point-like pattern) focused by the projection optical system in the case in which exposure is made twice onto two-photon absorption resist. In this case, the two-photon absorption resist makes the effective light intensity distribution of point image sharper. In this case, consideration suffices on the intensity distribution F(x) of point-like pattern by the projection optical system irrespective of the state of illumination light. Then, supposing the desired intensity distribution $I_0(x)$ is formed by superposing the images of point-like pattern, the effective light intensity distribution J(x) will be a superposition of intensities of light images obtained by focusing the point images, which is given by the following equation.

$$J(x)=I_0(x)*\{F(x)\}^2 \tag{11}$$

Since the effective light intensity distribution of the image of point-like pattern is expressed by $\{F(x)\}^2$, it is sharper than the point spread distribution $F(x)$ of the projection optical system, and is higher in resolution. By the Fourier transformation of the above Equation (11), the spectrum of the effective light intensity distribution is given by the following equation.

$$j(v)=i_0(v)\cdot\{f(v)*f(v)\} \tag{12}$$

Figure 16A:
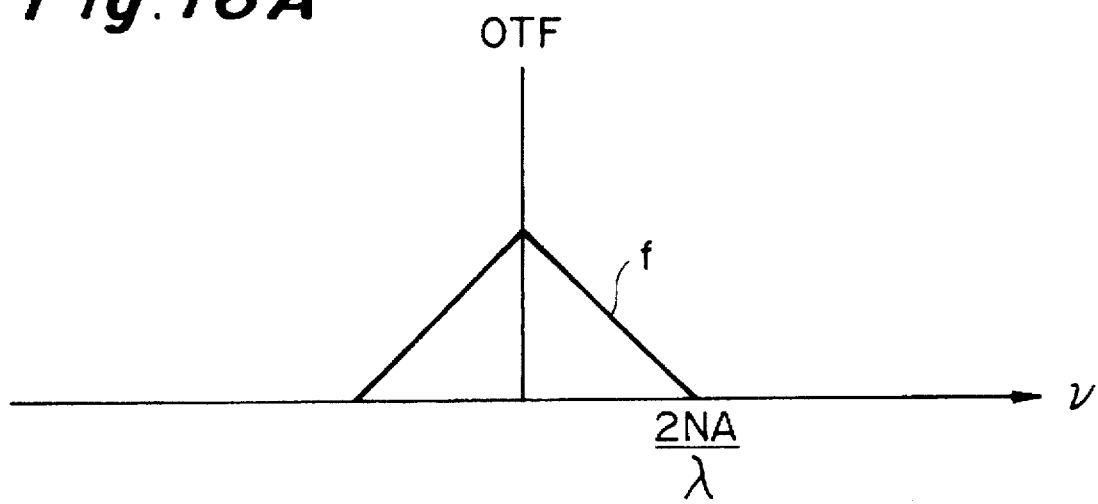
FIG. 16A and FIG. 16B are illustrations to show OTF for explaining the principle of the present invention.
Figure 16B:
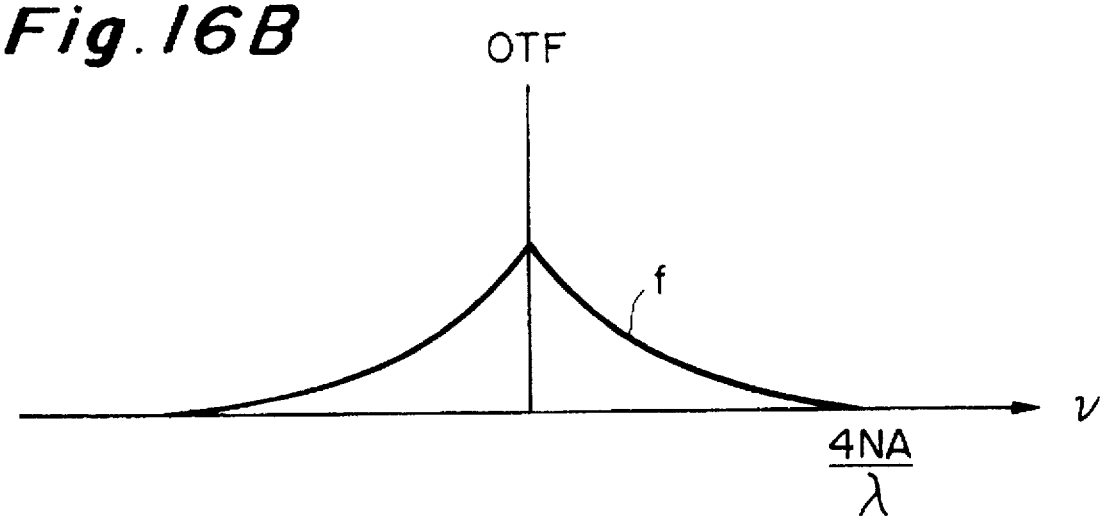

Accordingly, f*f can be considered as substantial OTF of projection optical system to obtain the effective light intensity distribution in the principle of the present invention. This means that the cutoff frequency is $2NA/\lambda$ in OTF (i.e., f) in the conventional technology as shown by Equation (8), whilst the cutoff frequency is $4NA/\lambda$ in the present invention, obtaining a doubled resolution. FIG. 16A and FIG. 16B schematically show the comparison of OTF. FIG. 16A shows the OTF of the conventional exposure method, while FIG. 16B shows the effective OTF in the case that the two-photon absorption resist is used. This suggests that if a latent image is formed by multiple exposure scanning such an isolated pattern and using the two-photon absorption resist, a finer pattern can be formed with a resolution beyond the resolution limit of projection optical system. As described above, the pattern can be formed over the resolution limit of optical system by the combination of multiple exposure of isolated pattern with the photosensitive material having the nonlinear sensitivity characteristic.

Further, in the case that multiple exposure is made with a pattern which is not perfectly isolated but nearly isolated, a resultant pattern can be also formed over the resolution limit of projection optical system in the photosensitive material similarly as in the case of completely isolated pattern. In this case, the spectrum j of effective light intensity distribution is as follows.

$$j(v)=\Sigma i_{oj}(v)\cdot\{f(v)*f(v)\} \tag{13}$$

In the above equation, $i_{oj}$ is an object spectrum of the j-th nearly isolated pattern. Also, expressing $\Gamma(v)=\Sigma i_{oj}(v)$ in Equation (13), $\Gamma(v)$ can be deemed as an object spectrum of an imaginary pattern constituted by superposing isolated patterns. The cutoff frequency of OTF (f) never exceeds $2NA/\lambda$ as shown by Equation (8) in the conventional spectrum of effective light intensity distribution, but in the present invention the cutoff frequency of the effective OTF of $\{f(v)*f(v)\}$ is $4NA/\lambda$ as shown by Equation (13), including a spectrum of effective light intensity distribution up to the cutoff frequency ($4NA/\lambda$).

Figure 14B:
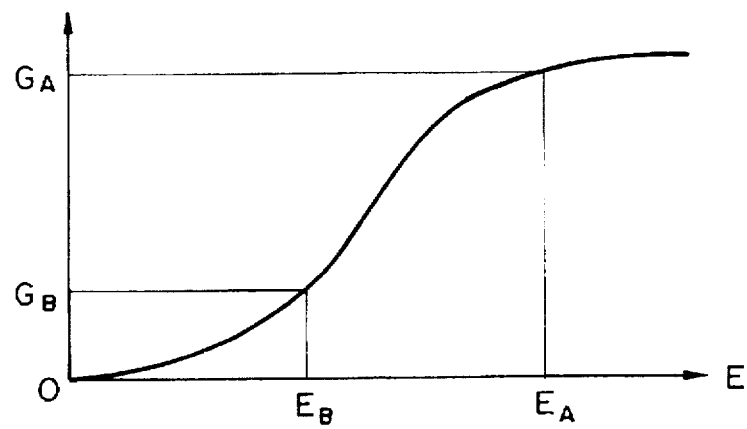

As described above, even with use of the nonlinear photosensitive material in the conventional exposure method, the pitch in the pattern formed in the photosensitive material can never surpass the resolution limit of projection optical system. In the present invention, in contrast, multiple exposure is effected onto the nonlinear photosensitive material with intensity distributions mutually spatially shifted so as to properly provide the object spectrum $\Gamma$, whereby the effective light intensity distribution can be formed with the pitch over the resolution limit of the projection optical system. The present invention is further described as to a relation between exposure and development rate with reference to FIG. 14B and FIG. 14C. The two types of intensity distributions with a mutual shift are those as shown in FIG. 13. In more detail, in the first exposure the nonlinear photosensitive material is irradiated by the exposure pattern of sinusoidal intensity distribution $\Gamma(x)$ as shown by the solid line in FIG. 13 and in the second exposure the nonlinear photosensitive material is irradiated by the exposure pattern of sinusoidal intensity distribution $I_2(x)$ spacially shifted by $\pi$ in phase as shown by the dotted line in FIG. 13. FIG. 14B shows the characteristics of the nonlinear photosensitive material about the development rate against exposure, in which the horizontal axis represents the product of intensity I and exposure time t, i.e., exposure E. Since the exposure E corresponds to energy, the effective light intensity J and the exposure E are shown as equivalent to each other.

Now let us consider two different points $X_A$ and $X_B$ on the nonlinear photosensitive material with these drawings. The intensity distribution $I_1(x)$ gives $I_1(X_A)=I_{MAX}$ as the intensity of light incident into a certain point $X_A$ on the nonlinear photosensitive material, and the intensity distribution $I_2(x)$ gives $I_1(X_A)=0$ as the intensity of light incident into the certain point $X_A$ on the nonlinear photosensitive material. Similarly, the intensity of light incident onto another point $X_B$ shifted $\pi$ in phase from the point $X_A$ is obtained as $I_1(X_B)=I_{MAX}/2$ and $I_2(X_B)=I_{MAX}/2$. Since the effective light intensity is proportional to the square of intensity in case of the two-photon absorption resist, the exposure $E_A$ at the point $X_A$ is obtained as follows.

$$E_A = [\{I_1(X_A)\}^2 + \{I_2(X_A)\}^2] \cdot t$$
$$= (I_{MAX})^2 \cdot t$$

Also, the exposure $E_B$ at point $X_B$ is as follows.

$$E_B = [\{I_1(X_B)\}^2 + \{I_2(X_B)\}^2] \cdot t$$
$$= \{(I_{MAX}/2)^2 + (I_{MAX}/2)^2\} \cdot t$$
$$= \{(I_{MAX})^2/2\} \cdot t$$

Accordingly, in case of the nonlinear photosensitive material being used, the development rate $G_A$ and $G_B$ at two different points $X_A$ and $X_B$ are different from each other as shown in FIG. 14B. This means that if exposure is carried out twice using the nonlinear photosensitive material with two different intensity distributions $I_1(x)$ and $I_2(x)$ which are spatially shifted each other, a finer pattern can be developed with the nonlinear photosensitive material after development than the first intensity distribution $I_1(x)$ and the second intensity distribution $I_2(x)$. In the described case, the density of line-and-space pattern can be doubled. As described above, the present invention can achieve the high-resolution exposure over the limit resolution of projection optical system.

Although the above description concerns the case in which the effective light intensity J is proportional to the square of light intensity I, which is the case of employing the two-photon absorption resist in which the latent image reaction intensity ($\xi$) is formed in proportion to the square of light intensity (I), the present invention is not limited to this example but may be applied to cases employing other types of photosensitive material having nonlinear sensitivity characteristic in which the effective light intensity distribution J is formed in proportion with the m-th power (m>1) of light intensity (I). In this case, the effective light intensity distribution of point-like pattern is expressed by the m-th power of the point spread function F(x). Therefore, the effective light intensity distribution of point-like pattern is sharper than the point spread function F(x). Equation (11) should be replaced by the following Equation (14).

$$J(x) = I_0(x) \cdot \{F(x)\}^m \quad (14)$$

The state of illumination light is not limited to the incoherent illumination. Finer patterns can be formed in nonlinear photosensitive material with oblique illumination or with various types of other modified illumination. The nonlinear photosensitive material may be irradiated by a beam emitted from a self-emitting object of course.

Further, by the convolution theorem of Fourier transformation of Equation (14), it is seen that a pattern (effective light intensity distribution) can be formed up to a frequency m times higher than the cutoff frequency of projection optical system. A further finer pattern may be formed by multiple exposure of imperfectly isolated patterns.

Figure 14C:
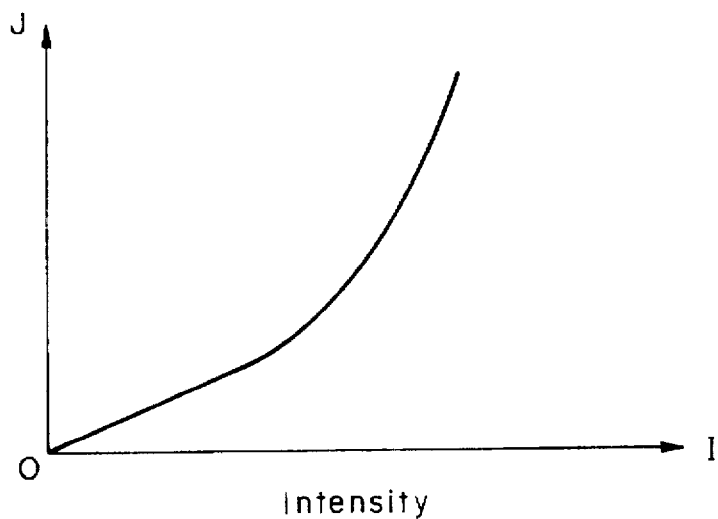

Although the above description concerns the case in which the power m in Equation (14) satisfies the relation of m>1, that is, the case that the effective light intensity distribution J is emphasized to the intensity I, the invention can be applied to cases in which a nonlinear photosensitive material with the relation of power m as m<1 is employed. With the nonlinear photosensitive material with m<1, fine patterns can be formed substantially over the resolution limit of projection optical system. The power m in Equation (14) may vary. For example, as shown in FIG. 14C, nonlinear photosensitive material may be employed with characteristics in which the latent image reaction changes in a nonlinear manner depending upon the intensity I.

If patterns are formed with high resolution and high contrast in nonlinear photosensitive material using a phase shift mask or employing the modified illumination technique during each exposure in multiple exposure processes, the effective light intensity distribution over the resolution limit of imaging optical system can be formed with high contrast.

As described above, semiconductor devices or liquid crystal devices can be attained with high-resolution patterns over the resolution limit of projection optical system by such an arrangement that a photosensitive material is employed with a nonlinear sensitivity characteristic in which the effective light intensity distribution J is nonlinear to the incident light intensity (I) and that multiple exposure processes with different light intensity distribution are carried out, for example, by shifting the pattern spatially from each other on the nonlinear photosensitive material.

Embodiment 1

Figure 1B:
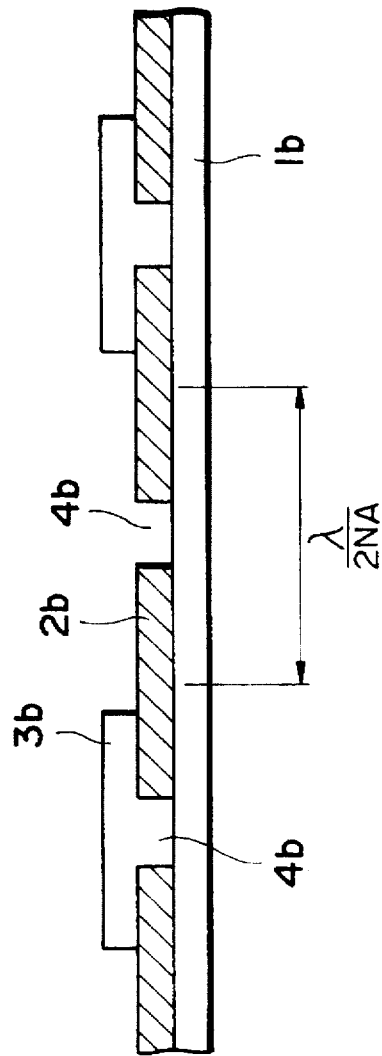

The first embodiment according to the present invention is described with FIGS. 1A and 1B to FIG. 6 and FIGS. 15 and 16B. FIG. 1A and FIG. 1B are vertical sectional views to show reticles as plates to be projected, employed in the present embodiment. Double exposure is effected on nonlinear photosensitive material in such a manner that after the first exposure is made with the first pattern on the reticle shown in FIG. 1A, second exposure is carried out with the second pattern on the reticle shown in FIG. 1B.

The first pattern in FIG. 1A has opaque portions 2a provided on an optically transparent reticle substrate 1a, and open portions 4a in which no opaque film is formed. A phase film 3a having the function of so-called phase-shifter is provided over either one of two mutually adjacent open portions 4a. The phase shifting mask is described in Japanese Patent Publication No. 62-50811.

The second pattern shown in FIG. 1B similarly has opaque portions 2b provided on an optically transparent reticle substrate 1b, and open portions 4b in which no oblique film is formed. Also, phase films 3b are arranged over alternate open portions 4b similarly as in the first pattern.

Exposure is made twice onto the identical nonlinear photosensitive material consecutively (separately) using the first and second patterns in such a positional relation that the open portions 4a in the first pattern spatially correspond to the opaque portions 2b in the second pattern and the open portions 4b of the second pattern to the opaque portions 2a in the first pattern.

Figure 2A:
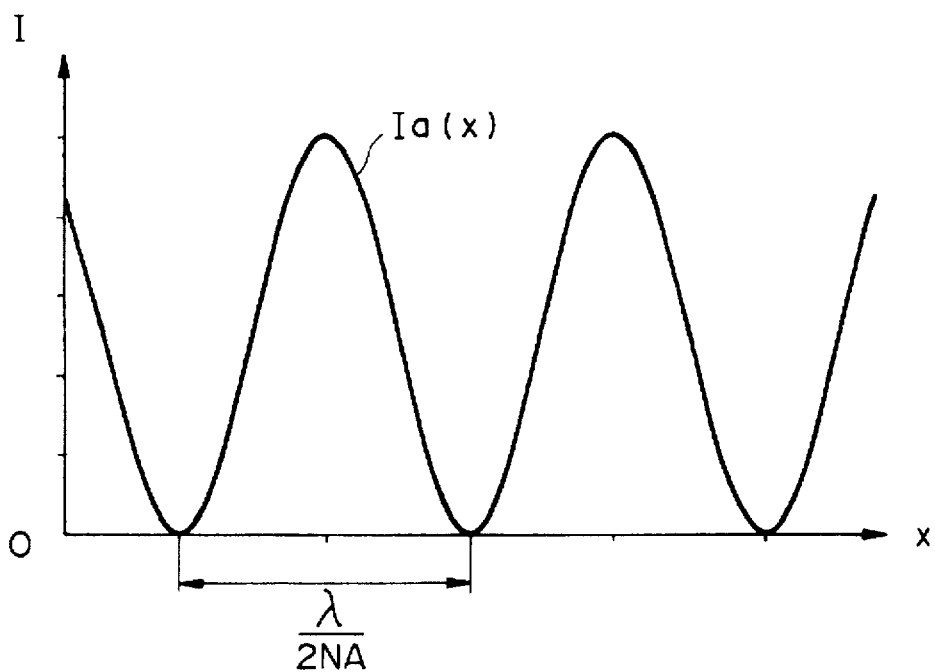
FIG. 2A and FIG. 2B are illustrations to show light intensity distributions obtained with the photo-mask in the first embodiment.
Figure 2B:
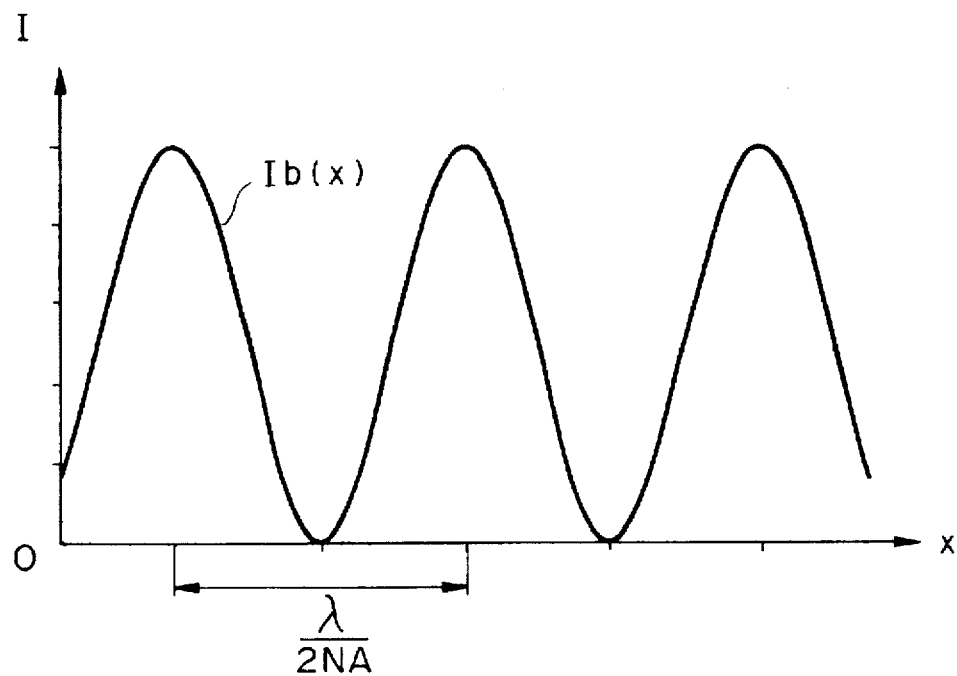

FIG. 2A and FIG. 2B show intensity distributions on the nonlinear photosensitive material, obtained upon exposure with the first and second patterns, respectively. In the present embodiment, sinusoidal intensity distributions Ia(x) and Ib(x) are produced upon respective exposure processes by coherent illumination and only±first-order diffracted light, as shown in FIG. 2A and FIG. 2B. By the double exposure processes the intensity distributions Ia(x) and Ib(x) have a relative spatial shift on the nonlinear photosensitive material.

To consider the highest possible resolution, suppose the two exposure processes produced the respective intensity distributions Ia(x) and Ib(x) having the frequency equal to the resolution limit of projection optical system. Namely, the numerical aperture NA is fully effectively used as the±first-order diffracted light passes through the periphery of the aperture of projection optical system. Then, the pitch of the pattern produced on the nonlinear photosensitive material in each exposure process is within the resolution limit ($\lambda$/2NA). Further, the intensity distributions are respectively expressed as follows.

$$Ia(x)=1+\cos(2\pi \cdot 2NA \cdot x/\lambda) \tag{15}$$

$$Ib(x)=1+\cos(2\pi \cdot 2NA \cdot x/\lambda + \pi) \tag{16}$$

Figure 3A:
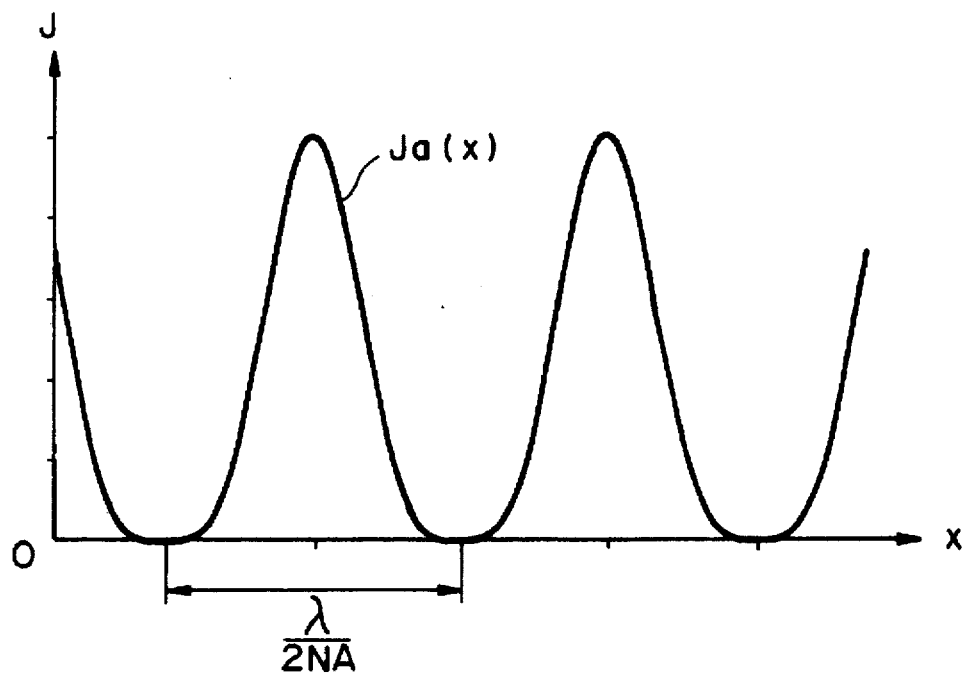
FIG. 3A and FIG. 3B are illustrations to show effective light intensity distributions obtained with the photo-mask in the first embodiment.
Figure 3B:
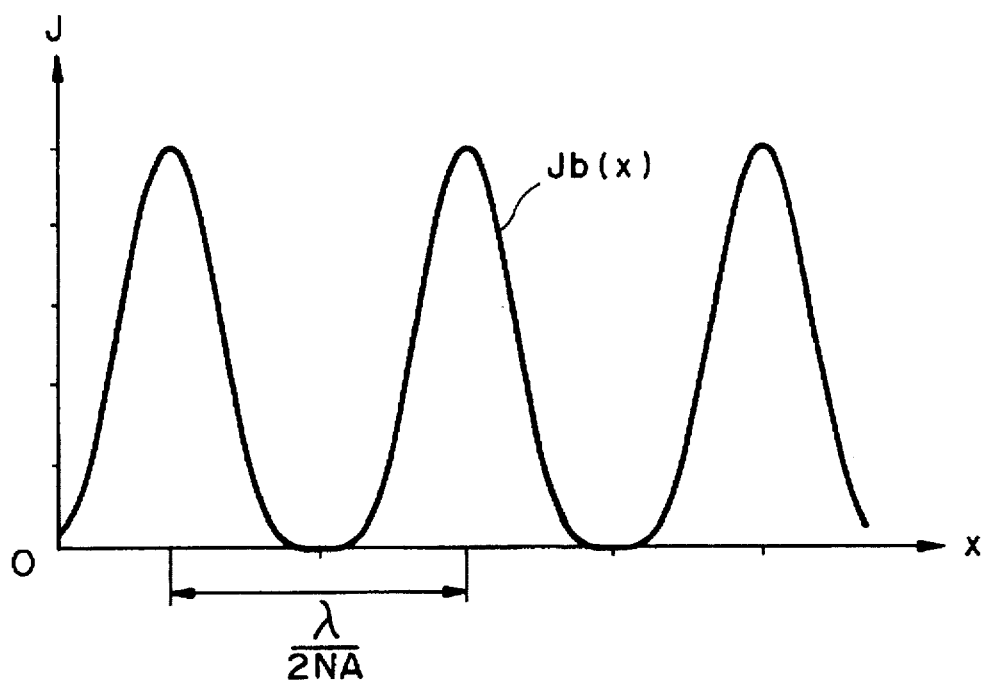

Since, in case of the two-photon absorption resist being used as the nonlinear photosensitive material, the effective light intensity distribution J in the resist is given by the square of the intensity distributions, effective light intensity distributions upon the two exposure processes are given by the following Equations (17) and (18), which are shown in FIG. 3A and FIG. 3B.

$$Ja(x)=\{Ia(x)\}^2=3/2+2\cos(2\pi \cdot 2NA \cdot x/\lambda)+\cos(4\pi \cdot 2NA \cdot x/\lambda)/2 \tag{17}$$

$$Jb(x)=\{Ib(x)\}^2=3/2+2\cos(2\pi \cdot 2NA \cdot x/\lambda+\pi)+\cos(4\pi \cdot 2NA \cdot x/\lambda)/2 \tag{18}$$

Then, the finally obtainable effective light intensity distribution $J_T(x)$ after the double exposure processes is a sum of Equations (17) and (18) as follows.

$$\begin{aligned} J_T(x) &= Ja(x)+Jb(x) \\ &= 3+\cos(4\pi \cdot 2NA \cdot x/\lambda) \end{aligned} \tag{19}$$

Figure 4:
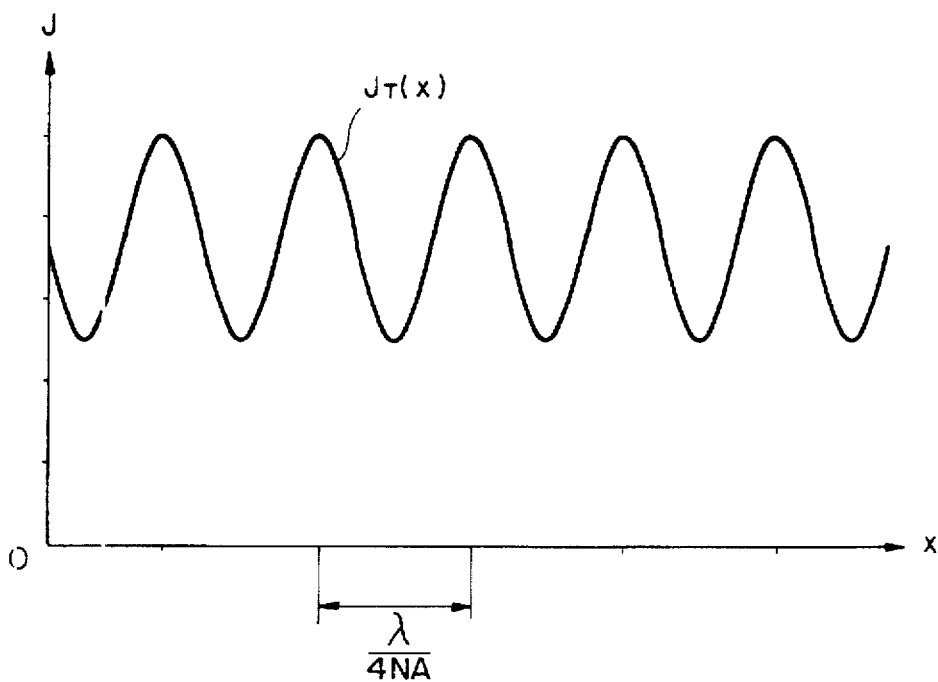
FIG. 4 is an illustration to show a synthesized effective light intensity distribution obtained with the photo-mask in the first embodiment.

As seen from the above Equation (19), the effective light intensity distribution $J_T(x)$ in this embodiment has a period of pitch ($\lambda$/4NA), which is half of the limit resolution ($\lambda$/2NA) of projection optical system. The effective light intensity distribution $J_T(x)$ is shown in FIG. 4. When development is carried out after the multiple (double in this embodiment) exposure processes, finer resist patterns will appear.

As apparent from Equation (12) and FIG. 16B, superposition of perfectly isolated patterns (point objects) forms a latent image containing the frequency corresponding to the pitch of $\lambda$/4NA. However, the profile of developed patterns could not be so good in this case because OTF (4NA/$\lambda$) is nearly zero. Thus, the present embodiment employs the phase shift masks as shown in FIG. 1A and FIG. 1B and the exposure under coherent illumination. Such an arrangement can permit formation of an effective light intensity distribution which can realize high contrast and high resolution.

On the other hand, in case of the conventional linear photosensitive material being used, the exposure is effected by the intensity distribution Ia(x)+Ib(x), which is a simple sum of two Equations (15) and (16), i.e., a simple sum of the intensity distributions shown in FIG. 2A and FIG. 2B. In that case, the effective light intensity distribution for the first and second patterns becomes constant as shown in FIG. 15, failing to achieve the principal purpose of exposure.

Figure 5:
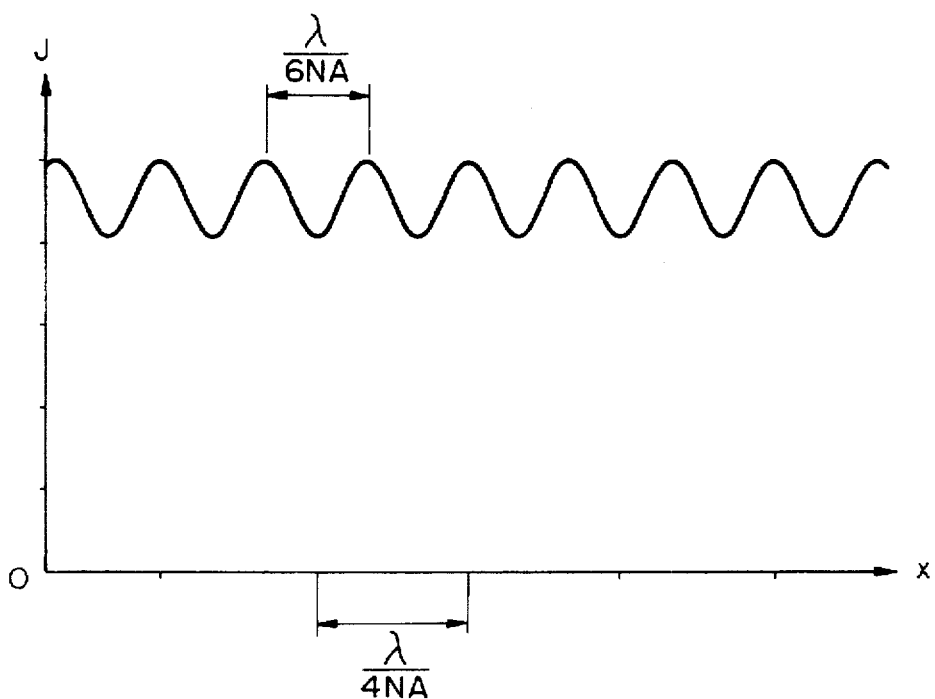
FIG. 5 is an illustration to show an effective light intensity distribution obtained by exposure in another aspect of the first embodiment.

The present embodiment showed an example in which the two-photon absorption resist was used to obtain the effective light intensity distribution by squaring (m=2) the intensity, but high resolution can also be expected with a nonlinear photosensitive material in which the effective light intensity distribution is obtained by nonlinearity of over the square of intensity (i.e., m>2). For example, FIG. 5 shows characteristics of a nonlinear photosensitive material in which the effective light intensity distribution is obtained by the third power (m=3) of light intensity distribution. FIG. 5 shows the effective light intensity distribution obtained after triple exposure processes with the transfer pattern shown in FIG. 1A being shifted by one third ($\lambda$/6NA) of the pitch ($\lambda$/2NA) between the processes. As shown in FIG. 5, this example provides such a periodic pattern that the pitch of lines and spaces is $\lambda$/6NA, which is three times finer than the resolution limit ($\lambda$/2NA) of projection optical system.

Similarly, high resolution can be attained with a nonlinear photosensitive material having nonlinearity in the range of 1<m<2. FIG. 6 shows an effective light intensity distribution obtained with a nonlinear photosensitive material in which the latent image is obtained according to the 1.5 (m=1.5) power of the light intensity and after double exposure processes using the patterns shown in FIG. 1A and FIG. 1B. This example can also provide the effective light intensity distribution two times finer than the resolution limit of projection optical system. Further, the contrast can be improved by employing phase shifting masks and coherent illumination.

Although the present embodiment was described as an example using the two-photon absorption resist as nonlinear photosensitive material, the present invention is not limited to this example. The nonlinear photosensitive material may be one of photosensitive materials which can enhance the contrast by another method, for example, by the CEL (Contrast Enhanced Lithography) method (Griffing, B. F. and West, P. R., IEEE, EDL Vol 1 p 14 (1983)). Further, the resist with nonlinear sensitivity characteristic may be employed as the upper layer resist in the so-called multi-layered resist method.

Embodiment 2

Another embodiment according to the present invention is next described. The first embodiment was an example in which the phase shift masks were employed with the patterns shown in FIG. 1A and FIG. 1B and the exposure was effected under coherent illumination. In contrast, the present embodiment shows an example in which an ordinary reticle without phase-shifter is employed and partially coherent illumination is used.

Figure 7A:
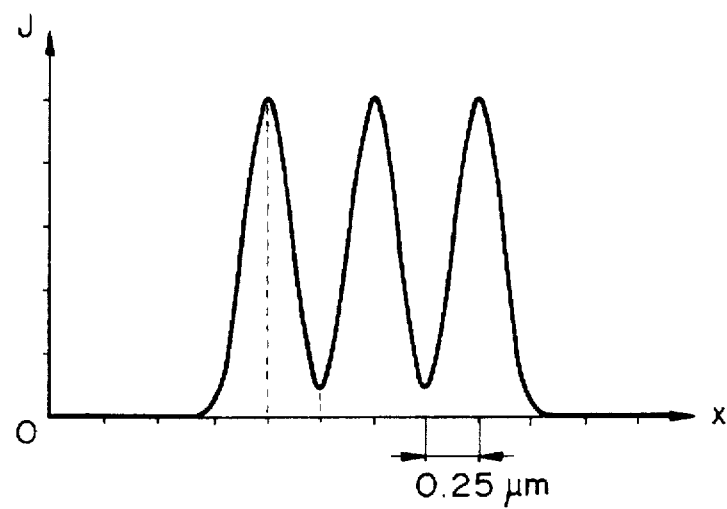
FIG. 7A is an illustration to show an effective light intensity distribution in the second embodiment.
Figure 7B:
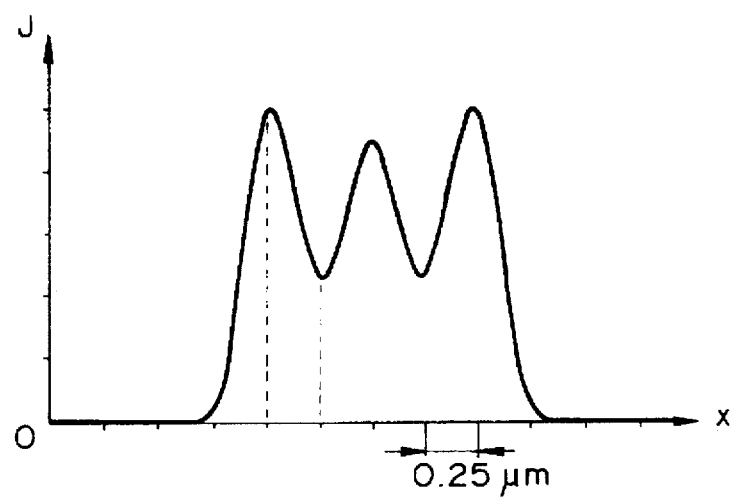
FIG. 7B is an illustration to show an effective light intensity distribution in a comparative example in order to describe the effect of the second embodiment.
Figure 7C:
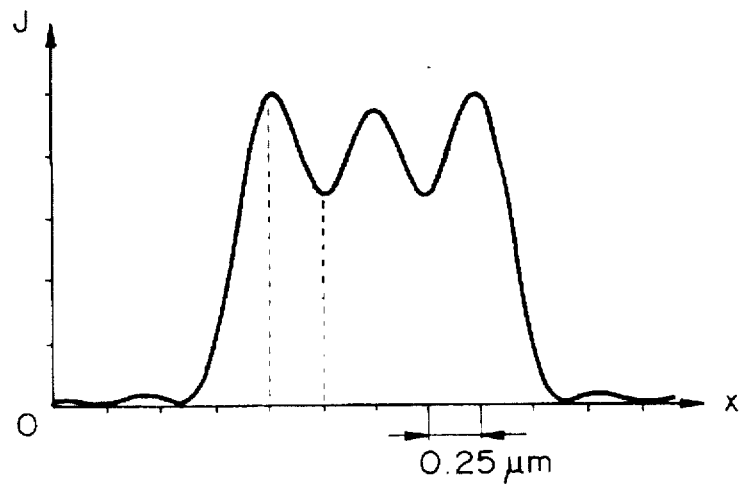
FIG. 7C is an illustration to show an effective light intensity distribution in another comparative example in order to describe the effect of the second embodiment.

The conditions of projection optical system are set as operating wavelength $\lambda$=0.365 $\mu$m, numerical aperture NA=0.5, coherence factor $\sigma$=0.6, and two-photon absorption resist being used as the nonlinear photosensitive material. FIG. 7A shows an effective light intensity distribution in the present embodiment, in which three lines of 0.25 $\mu$m wide are formed by three exposure processes by shifting a pattern of isolated line of 0.25 $\mu$m wide. FIG. 7B is given for comparison with the present embodiment and shows an effective light intensity distribution in a comparative example in which a two-photon absorption resist is used and three lines are formed in the photosensitive material by single exposure of a pattern of three lines of 0.25 $\mu$m wide without spatial shifting. FIG. 7C is given for further comparison with the present embodiment and shows an effective light intensity distribution in another comparative example in which a conventional linear photosensitive material is used and three lines are formed on the photosensitive material by single exposure of a pattern of three lines of 0.25 µm wide without spatial shifting.

The present embodiment can better provide a fine effective light intensity distribution as shown in FIG. 7A, so that fine patterns may appear after development. Though resist patterns after development are formed approximately in proportion to the latent image, high-contrast and high-resolution resist patterns can be formed by effecting an enhancement treatment upon development.

As described above, the present embodiment can provide high-contrast and high-resolution resist patterns even without using phase shifting mask.

Embodiment 3

Still another embodiment is now described. The third embodiment shows an example in which nonlinear photosensitive material employed has the power m of intensity smaller than 1 (m<1), i.e., the photosensitive material has m=0.5 for example. The effective light intensity distribution J(x) is given as follows for the intensity distribution I(x) of the nonlinear photosensitive material with m=0.5.

$$J(x)=\{I(x)\}^{0.5} \qquad (20)$$

In the above equation, x represents an x-coordinate position. In the present embodiment, the phase shifting mask as shown in FIG. 1A is used with coherent illumination.

Figure 8:
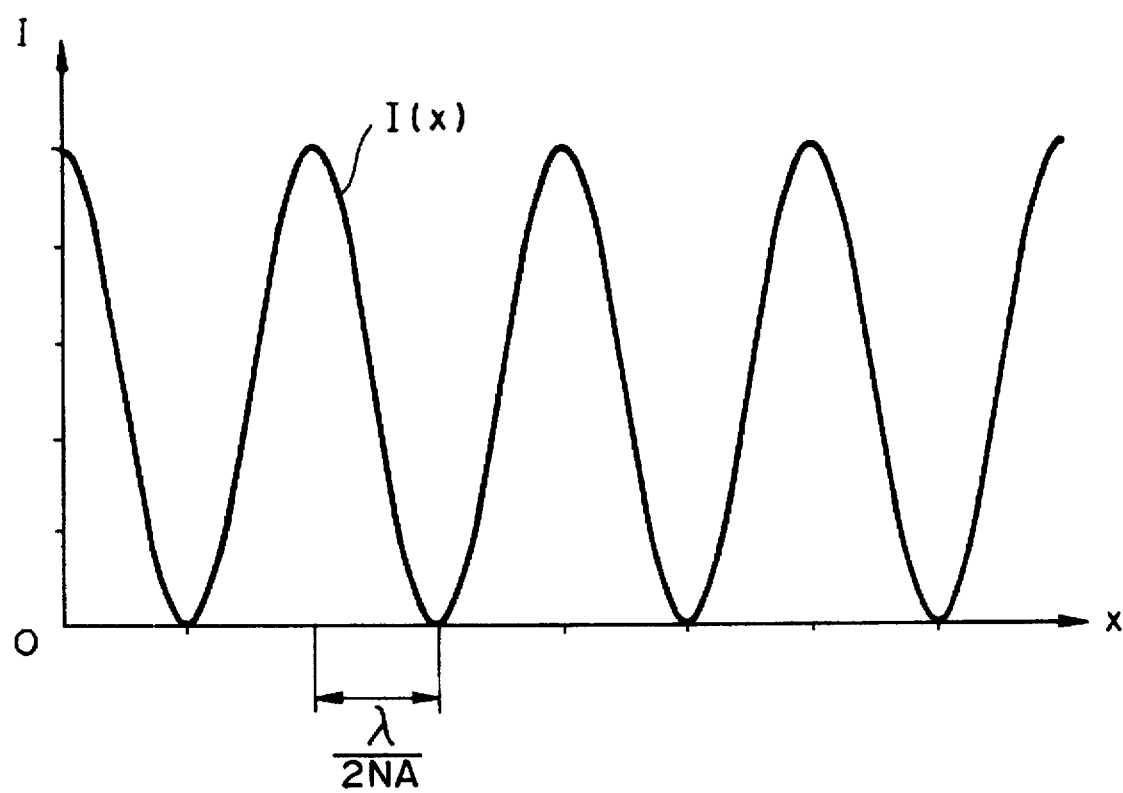
FIG. 8 is an illustration to show a light intensity distribution in the third embodiment.

As described above, the period of the pattern on this reticle is the resolution limit ($\lambda/2NA$) of projection optical system. FIG. 8 shows an intensity distribution I(x) on the image plane in the nonlinear photosensitive material, which is a sinusoidal distribution as defined by the following Equation (21).

$$I(x)=1+\cos(2\pi \cdot 2NA \cdot x/\lambda) \qquad (21)$$

Figure 9A:
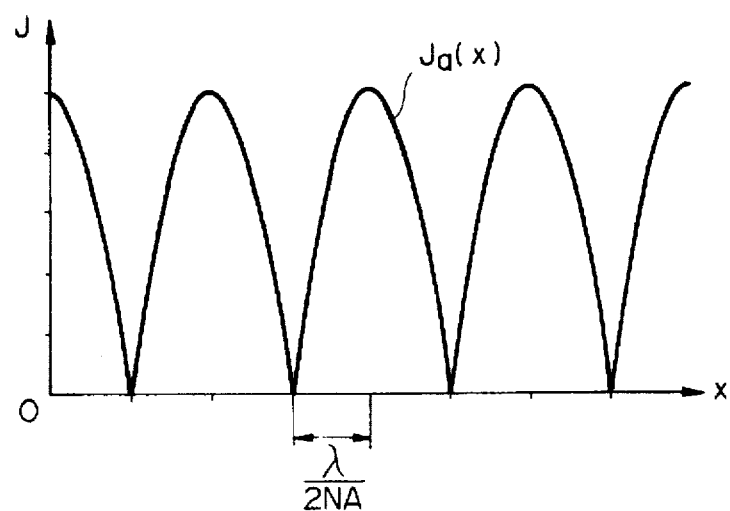
FIG. 9A is an illustration to show an effective light intensity distribution in the third embodiment.

Also, with the intensity distribution I(x), the effective light intensity distribution Ja(x) of the nonlinear photosensitive material is as shown in FIG. 9A and defined by the following Equation (22).

$$Ja(x)=\{1+\cos(2\pi \cdot 2NA \cdot x/\lambda)\}^{0.5} \qquad (22)$$

Single exposure would result in making the curve of J(x) gentler in bright portions and steeper in dark portions. But the resolution is kept equal to that of intensity distribution I(x), thus never surpasses the resolution limit of projection optical system.

Figure 9B:
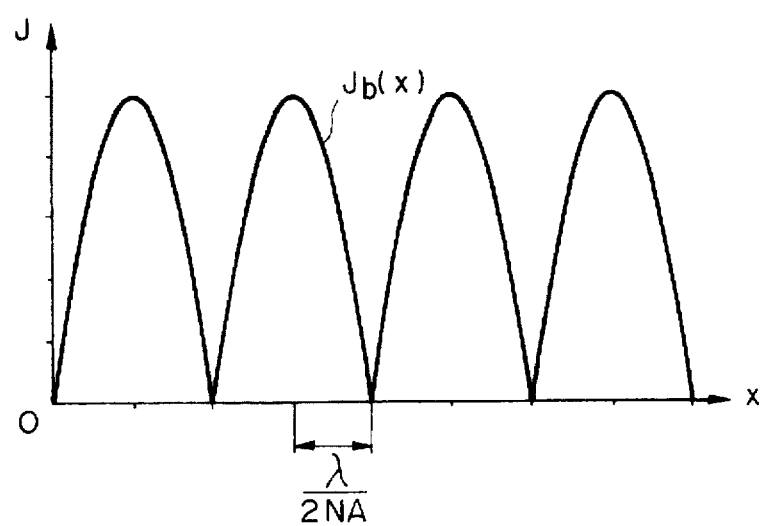
FIG. 9B is an illustration to further show an effective light intensity distribution in the third embodiment.

On the other hand, the present embodiment employs double exposure with patterns having lateral shift as shown in FIG. 1A and FIG. 1B, in the present embodiment, the first exposure is effected with the intensity distribution I(x) shown in FIG. 8 on the nonlinear photosensitive material and the second exposure with the intensity distribution (referred to as Ib(x)) corresponding to a half-period-shifted pattern from the intensity distribution I(x) shown in FIG. 8. Letting Jb(x) be the effective light intensity distribution for the second intensity distribution Ib(x), the effective light intensity distribution Jb(x) shown in FIG. 9B can be deemed as a half-period-shifted distribution from the effective light intensity distribution Ja(x) shown in FIG. 9A accordingly.

Figure 9C:
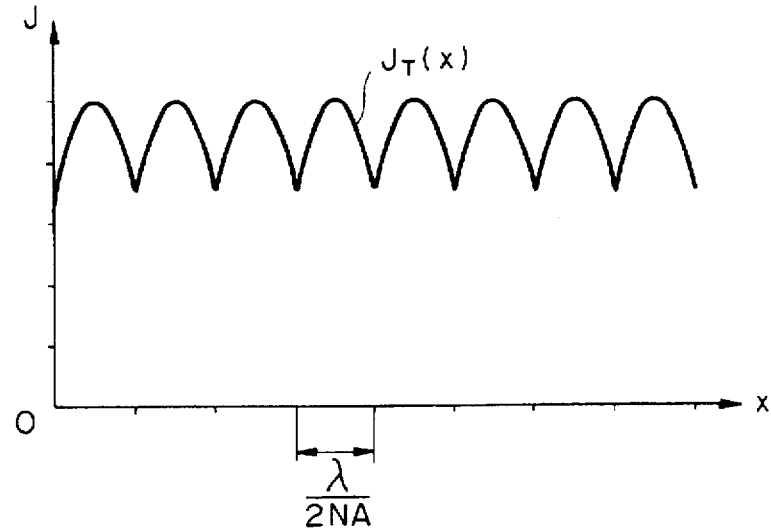
FIG. 9C is an illustration to show a synthesized effective light intensity distribution in the third embodiment.

The actual effective light intensity distribution $J_T(x)$ is obtained by superimposing the first and second effective light intensity distributions on each other. FIG. 9C shows the effective light intensity distribution $J_T(x)$. As seen from FIG. 9C, the effective light intensity distribution $J_T$ is obtained with a resolution ($\lambda/4NA$) which is the double of the resolution limit ($\lambda/2NA$) of projection optical system, forming fine developed patterns.

Let us compare the present embodiment with the case of linear photosensitive material with m=1. As shown in Embodiment 1, the effective light intensity distribution $J_T(x)$ becomes constant (=2). In other words, no lines and spaces pattern as shown in FIG. 9C appears but a uniform distribution is obtained, failing to achieve the main purpose of exposure.

As described above, the present embodiment can achieve the high resolution over the resolution limit of projection optical system, by employing the nonlinear material with m<1 and the multiple exposure with lateral shift.

It should be noted that in the above-described embodiments the nonlinear photosensitive material may be either positive resist or negative resist. However, the positive resist is more preferable as the nonlinear photosensitive material having the relation of m<1 to realize the fine patterns shown in FIG. 9C.

Embodiment 4

Figure 10A:
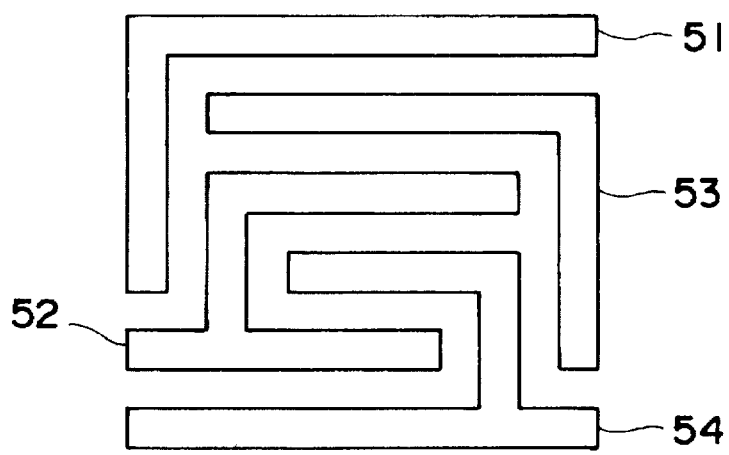
FIG. 10A is an illustration to show the shape of latent image pattern formed on a photosensitive material in the fourth embodiment.

A further embodiment shows an example of two-dimensional pattern in a more practical semiconductor element. FIG. 10A shows a desired pattern to be finally obtained, FIG. 10B a pattern of the first exposure reticle, and FIG. 10C a pattern on the second exposure reticle. Portions 51, 52, 53 and 54 transmit light, among which the light transmitting portions 52 and 54 are provided with phase film 52s, 54s. In the pattern shown in FIG. 10A, the smallest gap between the portions 51, 52, 53, 54 is the resolution limit of projection optical system, and an image with sufficient contrast can be formed by single exposure using the phase shifting mask for example. With the two-dimensional pattern as shown in FIG. 10A, some portions would remain unresolved even with any arrangement of phase shifter of 0° or 180°. In contrast, the present invention can permit a semiconductor element to have a very fine pattern as shown in FIG. 10A, which it has been impossible to resolve, by using the two-photon absorption resist and effecting such exposures that the first exposure is made with the pattern of FIG. 10B and thereafter the second exposure with the pattern of FIG. 10C.

Figure 10B:
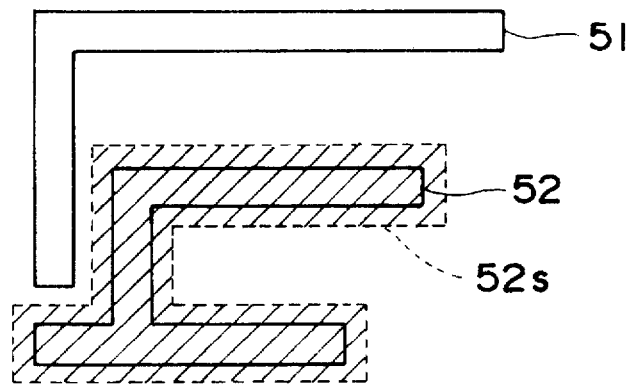
FIG. 10B is an illustration to show the shape of pattern on one of the photo-masks for forming the latent image pattern in FIG. 10A.
Figure 10C:
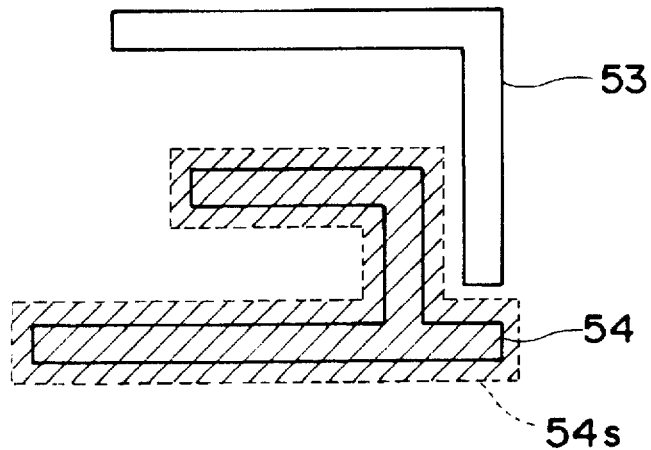
FIG. 10C is an illustration to show the shape of pattern on the other photo-mask for forming the latent image pattern in FIG. 10A.

The patterns shown in FIG. 10B and FIG. 10C are formed on separate reticles in the present embodiment, but the reticles may be replaced by an electrooptic element such as a liquid crystal plate, in which the transfer patterns in FIG. 10B and FIG. 10C can be formed by electrically changing the pattern transparent portions, substantially acting as a photo-mask.

Incidentally, it is effective in the present invention to use the phase shift pattern (phase film) in order to form a high-resolution pattern as in the first embodiment. It is also effective to use the annular illumination as proposed in Japanese Laid-open Patent Application No. 61-91662 or the so-called SHRINC illumination as proposed, for example, in Japanese Laid-open Patent Application No. 4-225358.

Embodiment 5

Figure 11:
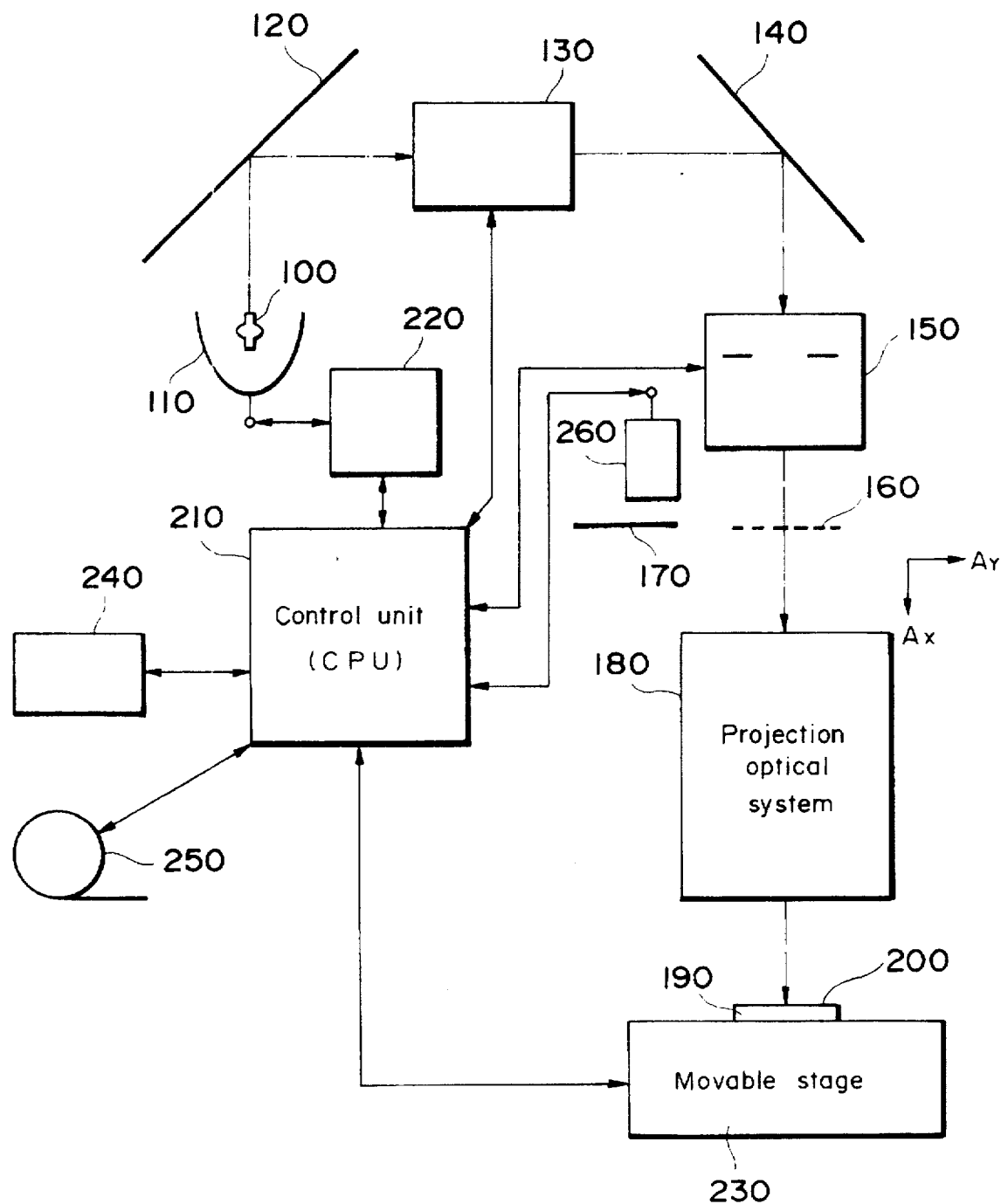
FIG. 11 is a scheme of an exposure apparatus in the fifth embodiment.

An embodiment of exposure apparatus according to the present invention is next described with the scheme of FIG. 11. The structure of the apparatus is first described referring to FIG. 11. A light source 100 emits an illumination beam for exposure. The illumination beam is collected by an elliptic mirror 110. Then the illumination beam is guided via a plane mirror 120 to a collimator lens 130. The collimator lens 130 forms a beam of nearly parallel rays. Further, the parallel beam is guided via a plane mirror 140 to enter a fly's eye integrator 150. A beam emerging from the fly's eye integrator 150 irradiates the exposure position 160 with uniform intensity. Plural reticles 170 are conveyed by an automatic conveying mechanism (not shown) to be set at or removed from the exposure position 160. When a reticle 170 is set at the exposure position 160, patterns formed thereon is illuminated by the illumination beam to transmit diffracted beams. The diffracted beam is focused by a projection optical system 180 on the surface of nonlinear photosensitive material 200 mounted on a semiconductor wafer 190 to effect exposure thereon.

A control unit 210 has a built-in microprocessor (CPU) having an operational function, which controls a drive circuit 220 for adjusting an angle of elevation of the elliptic mirror 110 to the light source 100, controls the drive of the three-dimensionally movable stage 230 for mounting of the semiconductor wafer 190 thereon, and gives a command for automatic mounting or dismounting of reticle 170 to the automatic conveying mechanism (not shown). The control unit 210 executes a process according to an instructed order input by an operator by means of an inputting device 240 such as a keyboard. Also, the control unit 210 is provided with a memory device 250 storing data and processing programs for executing various processes. Since the exposure is carried out with plural reticles 170, the automatic conveying mechanism has an optical reading device 260 for selecting one out of the reticles. Data read by the reading device 260 is transferred to the control unit 210 to be analyzed.

Next described is an example of series operations in the present invention. Under control of the control unit 210, the automatic conveying mechanism (not shown) conveys the first reticle out of two types of reticles for obtaining high resolution by double exposure and sets it at the exposure position 160. Patterns on the first reticle is projected onto the nonlinear photosensitive material 200. Then, the first reticle is removed and the second reticle is set at the exposure position 160. The first and second reticles are exchanged for each other as described, in case the patterns on the first and second reticles are preliminarily given a predetermined lateral shift to get the resolution over the limit of projection optical system 180. Then, the pattern on the second reticle is projected onto the nonlinear photosensitive material 200. Thus, a high-resolution pattern is obtained by the double exposure. Similar processes are carried out if multiple exposure is more than two processes. Then, the same exposure process is repeated for another type of reticle for projecting a next pattern onto the wafer.

Instead of exchanging the patterns on different reticles by an automatic conveying mechanism, a lateral shift may be produced by such an arrangement that after first exposure with a reticle, the identical reticle is moved by a predetermined amount in the direction Ay perpendicular to the optical axis Ax of projection optical system 180 then to carry out second exposure. The predetermined amount is ($\lambda$/4NA) as reduced coordinates on the wafer 190 in case of the example of the pattern in FIG. 1A as described above, in which the effective light intensity of photosensitive material is proportional to the square of intensity (m=2). Also, in case the effective light intensity is proportional to the cube of intensity (m=3), the predetermined amount may be effectively set to ($\lambda$/6NA) as reduced coordinates on the wafer 190.

For multiple exposure with a same reticle pattern, the wafer 190 itself can of course be arranged to move for each exposure process by a three-dimensionally movable stage 230 instead of moving the reticle.

Effective alignment between the multiple exposure processes is the so-called latent image alignment in which alignment is made by observing latent image.

Next, optimization of numerical aperture NA of the projection optical system in the case that photosensitive material having nonlinear sensitivity is used in exposure will be described.

The present invention relates to an exposure method and an exposure apparatus, more particularly to a projection exposure method and a projection-type exposure apparatus, used in fabricating semiconductor devices or liquid crystal plates.

There are conventionally used exposure methods in which, in fabricating semiconductor devices, liquid crystal display devices, thin-film magnetic heads, or the like, illumination light from a light source illuminates a photo-mask or reticle (hereinafter referred to totally as "reticle") with uniform illuminance and a pattern on the reticle is projected onto a wafer (or glass plate, or the like) coated with a photosensitive material to be printed there, and exposure apparatus for realizing the exposure methods.

In the conventional exposure methods, all of patterns desired to be exposed are provided on a same reticle and are printed on the substrate by single exposure. On that occasion, a latent image reaction density $\xi$ according to exposure intensity I appears in the photoresist coating on the substrate. For example, for positive photoresists presently used in general, it can be represented by the following equation.

(Eq 1-5)

$$\xi = \exp(-CD), D = I \cdot t$$

More generally, the following expression can be employed.
(Eq 1-6)

$$\xi = \exp(-CD), D = J \cdot t = I^m \cdot t$$

In the equation, I represents light intensity, t an exposure time, and C a constant determined by the photosensitive material. Further, m is an exponent indicating linearity of the photosensitive material, which is linear with m=1 while nonlinear with m≠1. For easy recognition, J replaces $I^m$ as in the above equation and J is called as a latent image density. Most of the photoresists presently used in general are linear with m =1.

In the above methods, assuming for simplicity that image formation is completely incoherent, a spectrum i of exposure intensity distribution I(x) for forming a latent image in the photoresist is given by the below equation with an object spectrum being $i_0$ and an OTF (Optical Transfer Function) of an optical system being f.
(Eq 1-7)

$$i(\nu) = i_0(\nu) \cdot f(\nu)$$

$\nu$: spatial frequency

Now, a spatial frequency $\nu_0$, which is a limit spatial frequency at which the OTF or f becomes not significant in respect of process, is given by the below equation with an exposure wavelength being $\lambda$ and a numerical aperture of projection optical system on the photosensitive material side being NA.
(Eq 1-8)

$$\nu_0 = 0.5 NA/(K_1 \cdot \lambda)$$

$K_1$: process constant

Further, the resolution limit of the optical system is theoretically determined by the numerical aperture NA, and in that case $K_1$=0.25, whereby a cutoff frequency $\nu_c$ of the optical system is given by the following equation.
(Eq 1-9)

$$\nu_c = 2NA/\lambda$$

Accordingly, in order to achieve high resolution, either a decrease of wavelength or an increase of numerical aperture NA was needed.

Further, there are recent demands to further enhance the resolution of the pattern projected onto the wafer with an increase in degree of integration for semiconductor devices, etc. Where the resolving power of the projection optical system is simply increased as described above in order to respond to such demands, there is a limit of the increase. In addition, the simple increase of the resolving power of the projection optical system would result in making the depth of focus shallower, which is not suitable for practical use. Thus, there have been various suggestions of techniques to improve the resolution as a whole in combination of the projection optical system with modification of the construction of the illumination optical system or with modification of the construction of the pattern on the reticle.

First, as a technique to devise the pattern arrangement of the reticle, there is a so-called phase shift method, as proposed by the present applicant in Japanese Patent Publication No. 62-50811, in which phase shifters are used to provide a phase difference between illumination beams passing through the pattern on the reticle. Further, as an example of a technique to devise the arrangement of the illumination optical system, there is a so-called modified light source method (also called as a modified illumination method or as an oblique illumination method), as proposed by the present applicant, in which illumination light from a light source is arranged to form a plurality of secondary light sources arranged at equal angular intervals around the optical axis and the reticle is illuminated with illumination beams from the plurality of (for example, four) secondary light sources.

The final resolution limit, however, has never surpassed the optically determined resolution limit by simply devising the arrangement of the illumination optical system or the arrangement of the pattern on the reticle in combination with the conventional exposure method as described above.

Also, conventionally, precise calculation based on the Fourier image-formation theory was applied or actual exposure was carried out in order to obtain best conditions for exposure, but analytic conditions for obtaining the best resolution inconveniently have been unclear.

It is, therefore, an object of the present invention, in view of the above points, to provide an exposure method and an exposure apparatus by which a pattern with high resolution surpassing the optically determined resolution limit is formed with little modifying the conventional exposure wavelength and optical system and further by which, with use of the phase shift method or the modified light source method, the pattern on the reticle can be printed with nearly best resolution on the wafer under given conditions.

To solve the above problems, the present invention provides an exposure method in which a mask is so arranged that a line-and-space pattern for transfer is formed of adjacent space portions having mutually inverse phases and in which the mask is illuminated with illumination light from a light source whereby an image of the pattern on said mask is projected onto a photosensitive material to e focused thereon:

wherein said photosensitive material has a nonlinear sensitivity property of being sensitive in proportion with the square of intensity of incident light, and a plurality of exposure processes different in light intensity distribution on the photosensitive material are carried out to form a pattern with high resolution surpassing a resolution limit of a projection optical system;

wherein a value of numerical aperture NA of said projection optical system is set within ±20% with respect to a value determined by the below equation, where $\sigma$ is a coherence factor of the illumination light, which corresponds to a value obtained by dividing a numerical aperture of an illumination optical system for performing said illumination by a numerical aperture of the projection optical system for performing said projection focusing, C' a contrast necessary on said photosensitive material, of the image of the pattern on said mask, d a depth of focus of said projection optical system, and $\lambda$ a wavelength of said illumination light.

$$NA = \frac{1}{(2)^{1/4}\sqrt{\pi\sigma}} \cdot \frac{\sqrt{1-\sqrt{\frac{2C}{1-C}}}}{\sqrt{1-1.5\sigma\left(\frac{1}{2-\sqrt{2C/(1-C)}}-0.45\right)}} \sqrt{\frac{\lambda}{d}} \quad \text{(Eq 1-10)}$$

Also, the present invention provides an exposure method in which illumination light from a light source forms four secondary light sources arranged at equal angular intervals around the optical axis and a mask on which a pattern for transfer is formed is illuminated with illumination light from said four secondary light sources whereby an image of the pattern on said mask is projected onto a photosensitive material to be focused thereon:

wherein said photosensitive material has a nonlinear sensitivity property of being sensitive in proportion with the square of intensity of incident light, and a plurality of exposure processes different in light intensity distribution on the photosensitive material are carried out to form a pattern with high resolution surpassing a resolution limit of a projection optical system;

wherein a value of numerical aperture NA of said projection optical system is set within the range of −20% to +10% with respect to a value determined by the below equation, where $\sigma_0$ is a coherence factor of the illumination light, which corresponds to a value obtained by dividing a numerical aperture of an illumination optical system for performing said illumination defined by light from the centers of said four secondary light sources by $2^{0.5}$ times a numerical aperture of the projection optical system for performing said focusing projection, $\sigma$ a coherence factor of each illumination light from said four secondary light sources, which corresponds to a value obtained by dividing a numerical aperture for each illumination light from said four secondary light sources where each illumination light from said four secondary light sources is outgoing from said illumination light source, by the numerical aperture of said projection optical system, C' a contrast necessary on said photosensitive material, of the image of the pattern on said mask, d a depth of focus of said projection optical system, $\lambda$ a wavelength of said illumination light, and a a constant of $2/\pi$.

$$NA = \frac{2-(2)^{1/4}-\sigma_0}{\sqrt{\pi\sigma}\,(4\sigma_0{}^2+\sigma^2)^{3/4}} \cdot \left(1-\frac{1+a^2}{2a}\sqrt{\frac{2C}{1-C}}\right)^{1/4}\sqrt{\frac{\lambda}{d}} \quad \text{(Eq 1-11)}$$

Further, the present invention provides an exposure apparatus having an illumination optical system for illuminating a mask on which a line-and-space pattern for transfer is formed of adjacent space portions having mutually inverse phases, with illumination light from a light source, and a projection optical system for projecting an image of the pattern on said mask onto a photosensitive material to focus the image thereon:

wherein said photosensitive material has a nonlinear sensitivity property of being sensitive in proportion with the square of intensity of incident light, and a plurality of exposure processes different in light intensity distribution on the photosensitive material are carried out to form a pattern with high resolution surpassing a resolution limit of the projection optical system;

wherein a value of numerical aperture NA of said projection optical system is set within ±10% with respect to a value determined by the below equation, where σ is a coherence factor of the illumination light, which corresponds to a value obtained by dividing a numerical aperture of said illumination optical system by a numerical aperture of said projection optical system, C' a contrast necessary on said photosensitive material, of the image of the pattern on said mask, d a depth of focus of said projection optical system, and λ a wavelength of said illumination light.

$$NA = \frac{1}{(2)^{1/4}\sqrt{\pi\sigma}} \cdot \frac{\sqrt{1-\sqrt{\frac{2C}{1-C'}}}}{\sqrt{1-1.5\sigma\left(\frac{1}{2-\sqrt{2C/(1-C')}}-0.45\right)}} \sqrt{\frac{\lambda}{d}}$$ (Eq 1-12)

Yet further, the present invention provides an exposure apparatus having an illumination optical system for arranging illumination light from a light source to form four secondary light sources arranged at equal angular intervals around the optical axis and illuminating a mask on which a pattern for transfer is formed, with illumination light beams from said four secondary light sources, and a projection optical system for projecting an image of the pattern on said mask onto a photosensitive material to focus the image thereon:

wherein said photosensitive material has a nonlinear sensitivity property of being sensitive in proportion with the square of intensity of incident light, and a plurality of exposure processes different in light intensity distribution on the photosensitive material are carried out to form a pattern with high resolution surpassing a resolution limit of the projection optical system;

wherein a value of numerical aperture NA of said projection optical system is set within the range of −20% to +10% with respect to a value determined by the below equation, where σ₀ is a coherence factor of the illumination light, which corresponds to a value obtained by dividing a numerical aperture of said illumination optical system defined by light from the centers of said four secondary light sources by $2^{0.5}$ times a numerical aperture of said projection optical system, σ a coherence factor of each illumination light from said four secondary light sources, which corresponds to a value obtained by dividing a numerical aperture for each illumination light from said four secondary light sources where each illumination light from said four secondary light sources is outgoing from said illumination light source, by the numerical aperture of said projection optical system, C' a contrast necessary on said photosensitive material, of the image of the pattern on said mask, d a depth of focus of said projection optical system, λ a wavelength of said illumination light, and a constant of 2/π.

$$NA = \frac{2-(2)^{1/4}-\sigma_0}{\sqrt{\pi\sigma}\,(4\sigma_0^2+\sigma^2)^{3/4}} \cdot \left(1-\frac{1+a^2}{2a}\sqrt{\frac{2C}{1-C'}}\right)\sqrt[1/4]{\frac{\lambda}{d}}$$ (Eq 1-13)

We proposed exposure methods using a so-called two-photon absorption photoresist, which is a photosensitive material having a nonlinear sensitivity property. The two-photon absorption photoresist is a photoresist which forms a latent image nucleus when absorbing two photons and which is represented as m=2 in (Eq 1-6), as detailed in Proceedings of SPIE, vol. 1674, pp 776–778, 1992. In the case of this photoresist, a latent image density distribution J(x) is formed in accordance with the square of an exposure intensity distribution I(x). Namely, for incoherent illumination, the following relation holds with a point spread function F(x) of an optical system and a light intensity distribution I₀(x) of object.
(Eq 1-14)

$$J(x)=I(x)^2\{I_0(x)*F(x)\}^2$$

Then, a spectrum j of the latent image density distribution is similarly given by the following equation from the convolution theorem of the Fourier transformation.
(Eq 1-15)

$$j(v)=\{i_0(v)\cdot f(v)\}*\{i_0(v)\cdot f(v)\}$$

Since the latent image density distribution is given in accordance with (Eq 1-14) for the two-photon absorption photoresist, the distribution is sharper than those for conventional photoresists. This will be specifically described with an example shown in FIG. 17A and FIG. 17B for sinusoidal exposure intensity distribution.

Figure 17A:
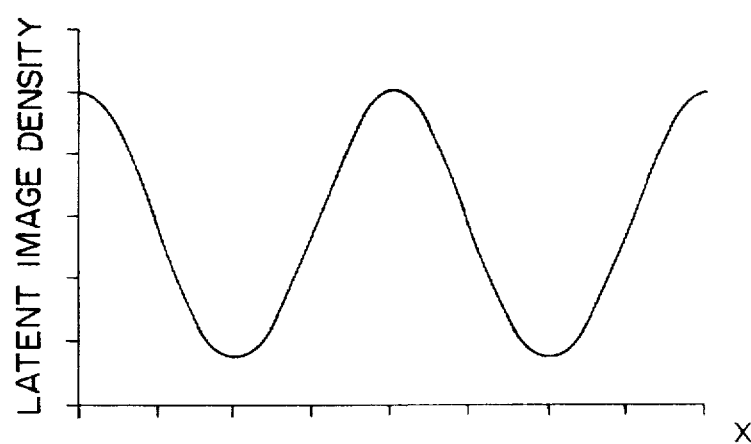
FIG. 17A and FIG. 17B include drawings for comparison of latent image density distribution between a conventional photoresist and a two-photon absorption photoresist.
Figure 17B:
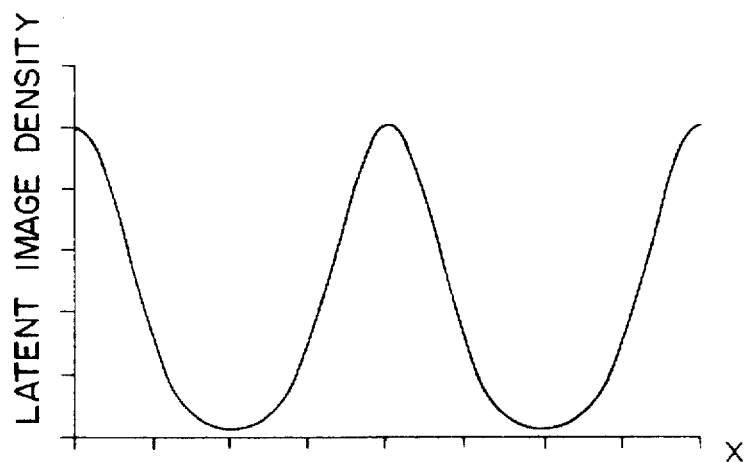

FIG. 17A shows a latent image density distribution in a normal photoresist, which is sinusoidal, similarly as the exposure intensity distribution. FIG. 17B shows a latent image density distribution in a two-photon absorption photoresist. Comparing FIG. 17A with FIG. 17B, the contrast of latent image in FIG. 17B is higher than that in FIG. 17A, but the pitch of the formed pattern in FIG. 17B is equal to that in FIG. 17A. Thus, simple use only of the two-photon absorption photoresist cannot make the pitch of the latent image density distribution formed finer than the pitch of an image formed by the optical system, thus never permitting the resolution to surpass the resolution limit of the optical system. Although there are components with frequencies surpassing the resolution limit of the optical system in the latent image density distribution from (Eq 1-15), the pitch of the formed pattern is still kept below the resolution limit of the optical system.

Next, let us consider image formation of point image by the optical system with the two-photon absorption photoresist. In this case, the two-photon absorption photoresist makes the latent image density distribution of point image sharper. It is sufficient for this case taking the point spread distribution F(x) by the optical system into consideration irrespective of the illumination state. Then, supposing a desired object intensity distribution I₀(x) is formed by superposition of point images and a latent image density distribution J(x) is formed thereby, the density distribution can basically be expressed by the following equation, because it is superposition of light intensities given by image formation of respective point images.
(Eq 1-16)

$$J(x) = I_0(x) * \{F(x)\}^2$$

Since the latent image density distribution of point image involves $\{F(x)\}^2$, it is sharper than the point spread distribution $F(x)$ by the optical system, thus realizing high resolution. By Fourier transformation of (Eq 1-16), the following equation is obtained.
(Eq 1-17)

$$j(v) = i_0(v) \cdot \{f(v) * f(v)\}$$

Then, f*f can be interpreted as OTF of the optical system to obtain the latent image density distribution by this method. This means that the cutoff frequency (4NA/λ) can be achieved against the cutoff frequency (2NA/λ) of the conventional OTF or f, thus doubling the resolution.

Figure 18A:
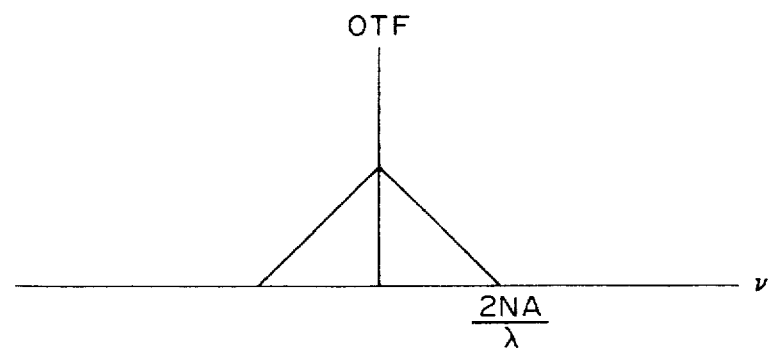
FIG. 18A and FIG. 18B include drawings for comparison of OTF between the case using the conventional photoresist and the case using the two-photon absorption photoresist.
Figure 18B:
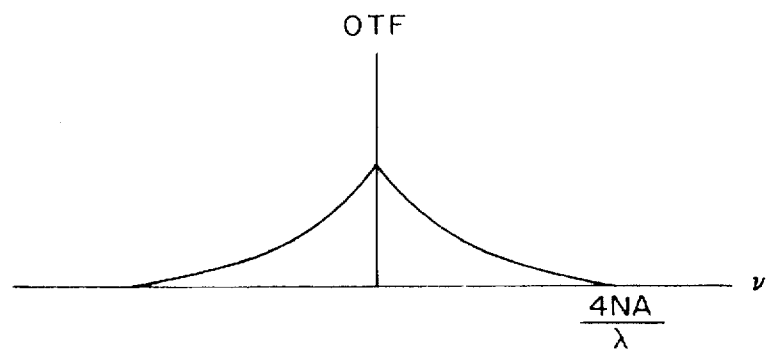

FIG. 18A and FIG. 18B diagrammatically show this comparison. FIG. 18A indicates the OTF in the conventional method, while FIG. 18B the OTF for the case where a two-photon absorption photoresist is exposed with isolated patterns. Therefore, a fine pattern can be formed with resolution over the resolution limit of the optical system when a latent image is formed using the two-photon absorption photoresist and performing a plurality of exposure processes based on isolated patterns. Accordingly, formation of a pattern with resolution over the resolution limit of the optical system becomes possible by the combination of the two-photon absorption photoresist with the plural exposure processes by isolated patterns.

Further, a pattern with resolution over the resolution limit of the optical system can also be formed, similarly as in the case of the isolated patterns, where a plurality of exposure processes are carried out using patterns which are not perfectly isolated but can be considered as nearly isolated. In this case, a spectrum j of latent image density distribution is defined by the following equation.

$$\begin{aligned} j(v) &= \Sigma i_{0j}(v) \cdot \{f(v) * f(v)\} \quad \text{(Eq 1-18)} \\ &= i'(v) \cdot \{f(v) * f(v)\} \\ i'(v) &= \Sigma i_{0j}(v) \end{aligned}$$

In the above equation, $i_{0j}$ represents object spectra of mutually nearly isolated patterns, and i' is considered as an object spectrum of an imaginary pattern constructed by superposition of the nearly isolated patterns. No spectra of conventional latent image density distributions can surpass the cutoff frequency (2NA/λ) of f, while the present invention permits a spectrum up to the cutoff frequency (4NA/λ) of $\{f(v) * f(v)\}$ to be formed as a latent image density distribution, as indicated by (Eq 1-13).

As described above, the pitch of formed pattern never surpasses the resolution limit of the optical system by the single use of the two-photon absorption photoresist in the conventional exposure method, while a latent image density distribution of pattern with a pitch surpassing the resolution limit of the optical system can be formed by performing a plurality of exposure processes different in light intensity distribution on such a photosensitive material so as to provide appropriate i'.

As described above, semiconductor devices can be obtained with patterns of high resolution surpassing the resolution limit of the projection optical system, using the photosensitive material having such a property that the latent image density, that is, the latent image reaction density is in proportion with the square of the intensity of incident light, and performing the plurality of exposure processes different in light intensity distribution on the photosensitive material.

For effecting exposure of reticle pattern with nearly best resolution on the wafer, the present invention employs such parameters for obtaining best resolution for either case of the phase shift method and the modified light source method, as the wavelength λ of illumination light, the coherence factor of illumination light (so-called σ value, and $\sigma_0$ as well for the modified light source method), which is a ratio between the reticle-side numerical aperture of illumination optical system and the reticle-side numerical aperture of projection optical system, the contrast C' necessary for image on the substrate, and the depth of focus d of the projected image (a depth of focus required by the projection optical system, taking into consideration factors such as the thickness of photoresist, warpage and bending of the substrate such as the wafer or the like, deviation of focus adjustment, etc.).

Then, either one of (Eq 1-10) to (Eq 1-13) is used to set a value of numerical aperture NA of the projection optical system to give best resolution when these parameters are given. As will be described in detail in the following embodiments, nearly best resolution can be obtained within ±20% for (Eq 1-10) and (Eq 1-12), but within the range of from −20% to +10% for (Eq 1-11) and (Eq 1-13) with respect to the setting value. Considerably good resolution can be obtained within ±10% for (Eq 1-10) and (Eq 1-12) with respect to the above setting value, and within the range of from −10% to +5% for (Eq 1-11) and (Eq 1-13) with respect to the above setting value.

Embodiments

First described is an embodiment in which a plurality of exposure processes different in light intensity distribution are carried out using the phase shift method and the two-photon absorption photoresist. Here is also described how to obtain an optimum value of numerical aperture NA of the projection optical system.

First described is a relation between the numerical aperture NA of projection optical system, the resolving power R, the wavelength λ, the coherence factor σ, and the defocus d, where the conventional exposure method is executed employing the phase shift method and a conventional photoresist.

Figure 19:
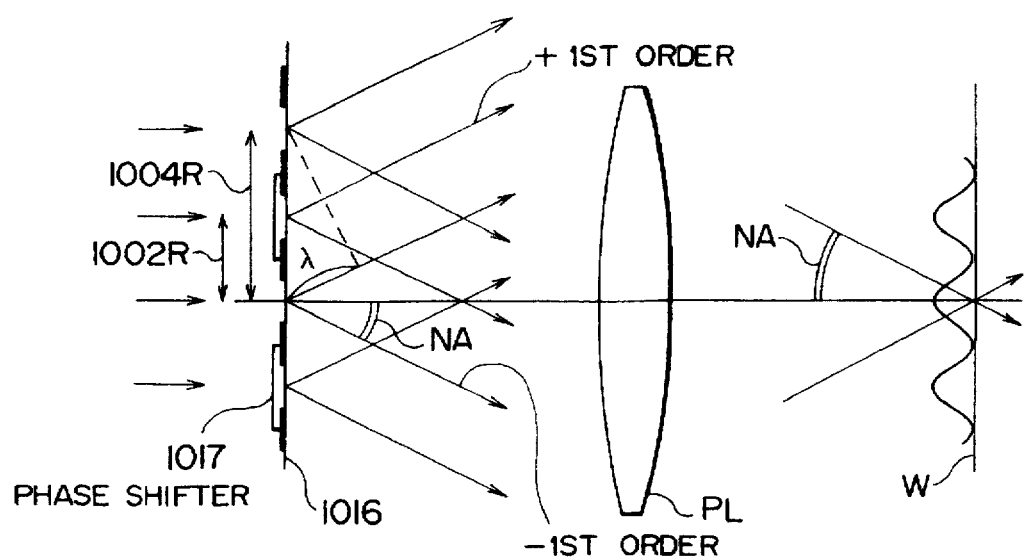
FIG. 19 is a drawing to illustrate the principle of the phase shift method.

The phase shift method is a technique for forming a high-resolution and high-contrast image by making a predetermined phase difference between opening portions in the reticle and utilizing the interference effect between the opening portions. (See Japanese Patent Publication No. 62-50811.) For example, if a phase difference of λ/2 (180°) is given between two adjacent opening portions in a line-and-space pattern on the reticle, the interference effect between them basically nullifies the zeroth-order diffracted light, and, therefore, consideration is necessary only for ±first-order diffracted light as shown in FIG. 19. In FIG. 19, there are line portions of light shielding film formed at the pitch 2R in the direction perpendicular to the plane of FIG. 19, and phase shifters 1017 are provided over every other space portion (at the pitch 4R) between the line portions. Since the fundamental frequency of an image focused on the wafer W is determined by an angle of divergence of two diffracted beams from the reticle 1016 in this case, a finer pattern can be expected to be formed than those by the conventional methods. The exposure intensity distribution I(x) on the wafer W is given by the below equation. It is noted that the following equations 1-19, 1-20, 1-21, and 1-22 are described in Optics, vol. 23, No. 1, pp 29–37, 1994; and these equations are described in SPIE, vol.1780 (1992) pp117–131 in detail.

$$I(x) = 1 + \cos(\pi \cdot x/R) \frac{2 - J_1(\pi - d - \sigma - NA)}{\pi - d - \sigma - NA/R} \quad \text{(Eq 1-19)}$$

Also, the contrast C of the image is given by the following equation.

$$I(x) = \frac{2 - J_1(\pi - d - \sigma - NA/R)}{\pi - d - \sigma - NA/R} \quad \text{(Eq 1-20)}$$

Further, expanding and approximating the Bessel function $J_1$ in (Eq 1-20), the following relation is obtained.

$$\pi - d - \sigma - NA/R = \sqrt{8(1-C)} \quad \text{(Eq 1-21)}$$

With a large coherence factor σ in the case of the phase shift method, (Eq 1-19) needs to be rewritten taking into consideration an eclipse due to the pupil of the projection optical system as in the case of the conventional method. However, no problem will result with (Eq 1-19) because the coherence factor σ in the actual phase shift method is small. Although it is assumed in (Eq 1-20) that all the ±first-order diffracted light passes through the pupil, the contrast on the Gauss plane (i.e., at a defocus amount d=0) is determined by the eclipse of ±first-order diffracted light. The following equation provides a relation between the resolving power R and the contrast C for that case.

$$\lambda/4R = \left(1 - 1.5\left(\frac{1}{2-C} - 0.45\right) - \sigma\right) \cdot NA \quad \text{(Eq 1-22)}$$

Figure 20A:
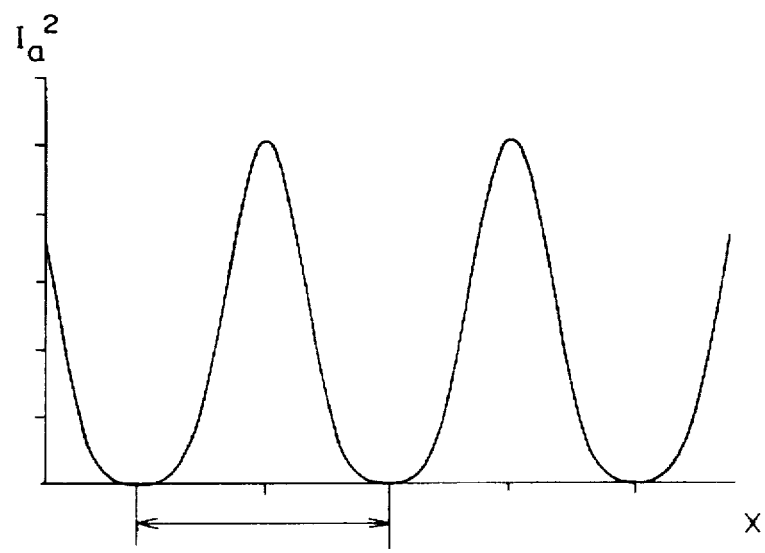
FIG. 20A and FIG. 20B include explanatory drawings in the case of performing the double exposure method using the two-photon absorption photoresist and the phase shift method.
Figure 20B:
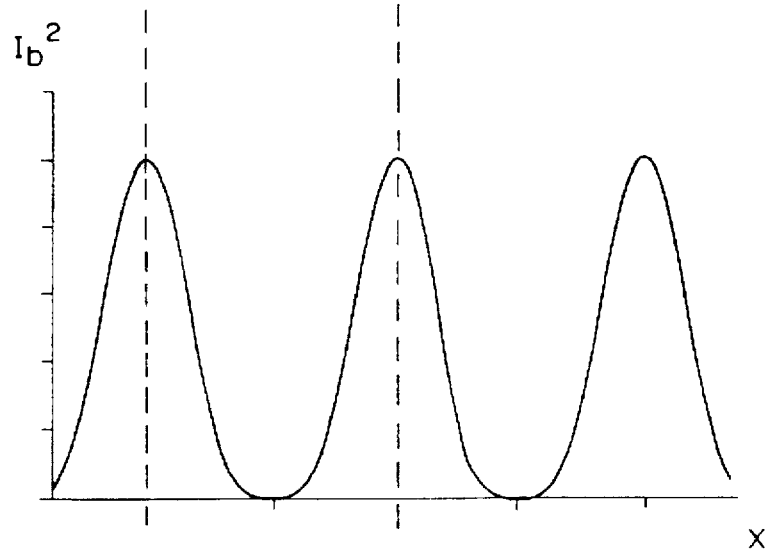
Figure 21:
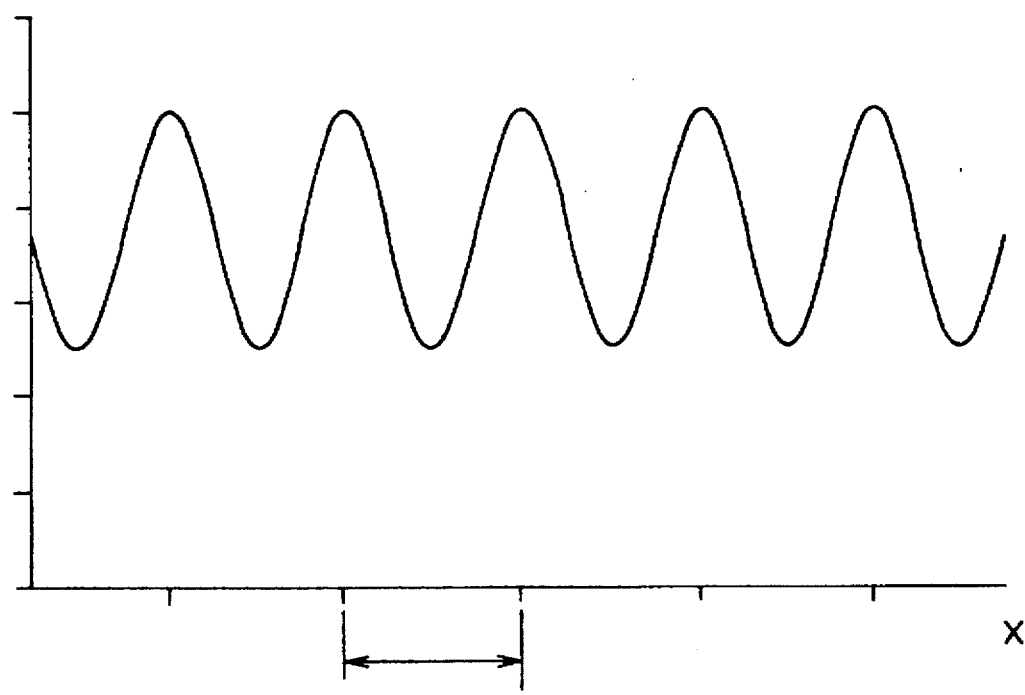
FIG. 21 is a drawing to show a finally obtained latent image density distribution in the case of performing the double exposure method using the two-photon absorption photoresist and the phase shift method.

Now, with exposure using the two-photon absorption photoresist instead of the conventional photoresist, a latent image density distribution as shown in FIG. 20A is obtained in the two-photon absorption photoresist coating the wafer. When second exposure is then performed after moving the reticle 1016 shown in FIG. 19 by a half pitch R in the direction perpendicular to the optical axis, a latent image density distribution as shown in FIG. 20B is obtained in the two-photon absorption photoresist coating the wafer. The latent image density distribution obtained by the second exposure is one resulting from shift of the latent image density distribution obtained by the first exposure by the half cycle. On this occasion, the respective latent image densities are emphasized by the two-photon absorption photoresist, as shown in FIG. 17B, so that portions with high light intensity become much higher while portions with low light intensity much lower. Adding the latent image density distribution obtained by the first exposure onto the latent image density distribution obtained by the second exposure, a latent image density distribution shown in FIG. 21 is obtained, thus enabling to form a pattern with resolution over the resolution limit of the optical system.

Considered as a method for the second exposure is either a method in which the second exposure is carried out after moving the wafer by an amount corresponding to movement of reticle 1016 by the half pitch R on the wafer W, or a method using another reticle having a pattern obtained by moving the pattern of reticle 1016 by the half pitch R in the direction of the optical axis. Further, conducting exposure twice as described will be hereinafter called as double exposure.

Here, considering the sensitivity property of photoresist, some photoresists could have slightly different effects as to the latent image density between the first exposure and the second exposure. It is preferred in that case that exposure amounts in the respective exposure processes be properly adjusted.

Incidentally, where the contrast C of the exposure intensity distribution I(x) formed in the first exposure is sinusoidal, the latent image density J is given by the following equation for double exposure using the two-photon absorption photoresist.

$$\begin{aligned}
J(x) &= I_1^2(x) + I_2^2(x) \quad \text{(Eq 1-23)} \\
&= (1 + C - \cos(\pi x/R))^2 + (1 - C - \cos(\pi x/R))^2 \\
&= (2 + C^2)\left(1 + \frac{C^2}{2+C^2} - \cos\frac{2\pi x}{R}\right) \\
&= (2 + C^2)\left(1 + C' - \cos\pi\frac{x}{R'}\right)
\end{aligned}$$

In the above equation, C is the contrast of the exposure intensity distribution I(x) in the first exposure, C' the contrast of the latent image after exposure, and R' the line width of the latent image. There are the following relations between C, C', R, and R'.

$$C' = \frac{C^2}{2+C^2} \quad C = \sqrt{\frac{2C'}{1-C'}} \quad \text{(Eq 1-24)}$$

$$R' = R/2R = 2R'$$

Substituting the relations of (Eq 1-24) into (Eq 1-21) and (Eq 1-22), the following relations are obtained.

$$\pi - d - \sigma - NA/2R' = \sqrt{8\left(1 - \sqrt{\frac{2C'}{1-C'}}\right)} \quad \text{(Eq 1-25)}$$

$$\frac{\lambda}{8R'} = \left(1 - 1.5\sigma\left(\frac{1}{2 - \sqrt{2C'/(1-C')}} - 0.45\right)\right) NA \quad \text{(Eq 1-26)}$$

Figure 22:
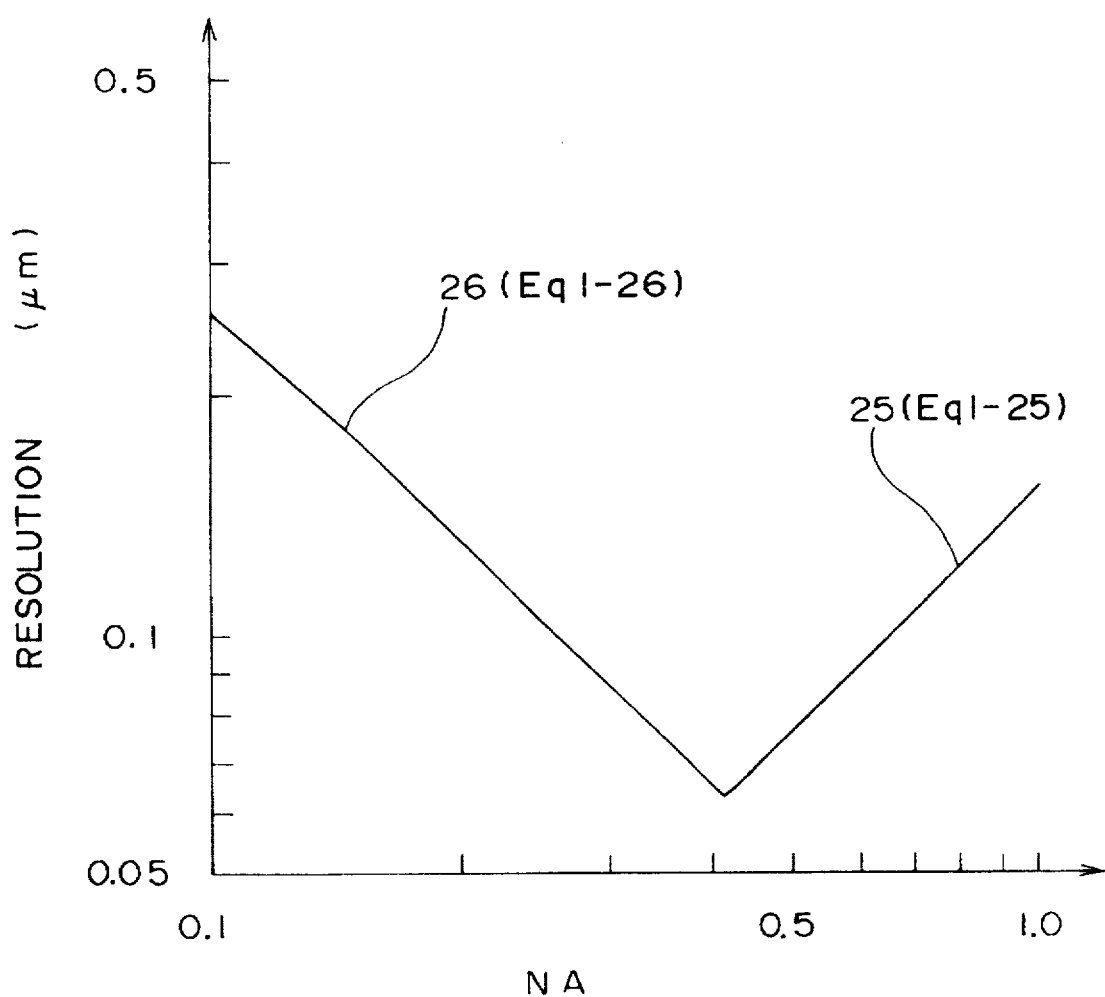
FIG. 22 is a drawing to show a relation between the numerical aperture and the resolution in the case using the phase shift method, where the wavelength $\lambda$, the coherence factor $\sigma$, the contrast C, and the defocus amount d are set as to be predetermined values.

(Eq 1-25) and (Eq 1-26) have the relation shown in FIG. 22. An intersection between (Eq 1-25) and (Eq 1-26) gives an optimum NA for double exposure using the two-photon absorption photoresist. Namely, eliminating R', the following relation is obtained.

$$NA = \frac{1}{(2)^{1/4}\sqrt{\pi\sigma}} - \quad \text{(Eq 1-27)}$$

$$\frac{\sqrt{1 - \sqrt{\frac{2C'}{1-C'}}}}{\sqrt{1 - 1.5\sigma\left(\frac{1}{2 - \sqrt{2C'/(1-C')}} - 0.45\right)}} \sqrt{\frac{\lambda}{d}}$$

It is seen from FIG. 22 that the resolution is not so degraded within ±20% from the optimum NA value.

Next described is an embodiment in which double exposure is carried out using the modified light source method and the two-photon absorption photoresist. Here is also described how to obtain an optimum value of numerical aperture NA of the projection optical system.

First described is how to obtain an optimum value of numerical aperture NA of the projection optical system for the case where the conventional exposure method is executed employing the modified light source method and the conventional photoresist.

Figure 23:
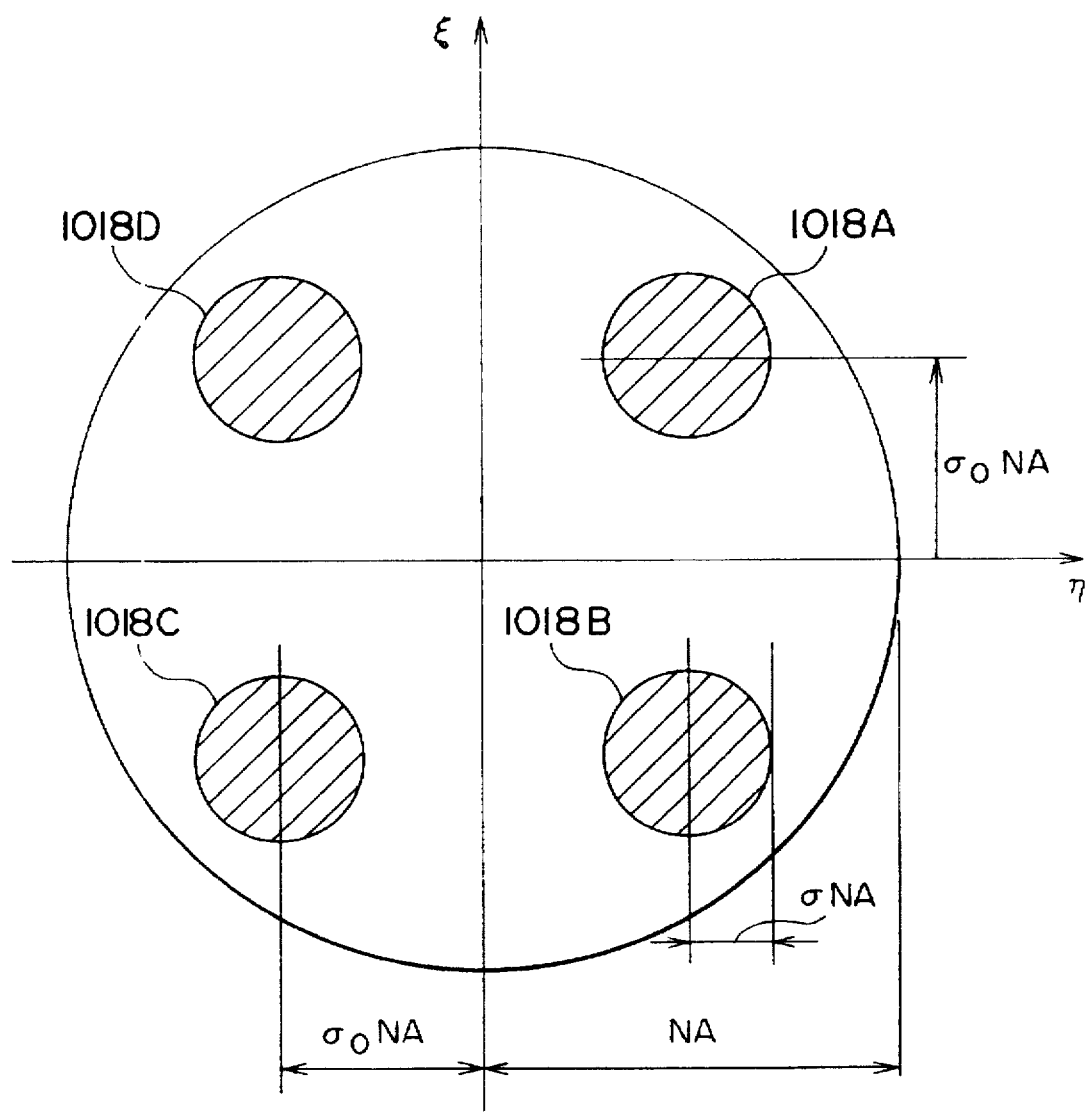
FIG. 23 is a drawing to show an example of layout of secondary light sources in the so-called modified light source method.

In the modified light source method an image is formed with the zeroth-order diffracted light and ±first-order diffracted light. FIG. 23 shows the shape of secondary light sources on the pupil of the projection optical system in the modified light source method. The secondary light sources are constructed of four small light sources 1018A to 1018D arranged at intervals of 90° around the optical axis. The small light sources 1018A to 1018D each have a radius of σ·NA, and a distance of each center of the small light source 1018A to 1018D from the ξ axis or from the η axis of the pupil coordinate system is $\sigma_0$·NA. This means that the coherence factor of illumination light from each of the four secondary light sources in the illumination optical system is σ and that $(1/2)^{1/2}$ of the coherence factor by the illumination light from each center of the four secondary light sources is $\sigma_0$. In this case, the exposure intensity I(x) of a projected image on the wafer, excluding a proportional constant, is expressed by the below equation. It is noted that the following equations 1-28, 1-29, 1-30, 1-31, 1-32, and 1-33 are described in Optics, vol. 23, No. 1, pp 29–37, 1994; and these equations are described in SPIE, vol.1780 (1992) pp117–131 in detail.

$$I(x) = 1 + a^2 + 2 - a - \cos(\pi - d(\sigma_0 NA/R - \lambda/4R^2)) - \quad \text{(Eq 1-28)}$$

$$\cos(\pi x/R) \cdot \frac{2 - J_1(\pi - d - \sigma - NA/R)}{\pi - d - \sigma NA/R}$$

In the above equation, a is a ratio of amplitude between the first-order diffracted light and the zeroth-order diffracted light, which is 2/π for a normal mask in which the width of transmitting portions is equal to that of shielding portions.

Also, the contrast C of the projected image is given by the following equation.

$$C = \frac{2 - a - \cos(\pi - d(\sigma_0 NA/R - \lambda/4R^2))}{1 + a^2} - \quad \text{(Eq 1-29)}$$

$$\frac{2 - J_1(\pi - d - \sigma - NA/R)}{\pi - d - \sigma - NA/R}$$

Further, expanding and approximating the cosine function and Bessel function, the contrast C becomes as follows.

$$C = \frac{2a}{1 + a^2} - \quad \text{(Eq 1-30)}$$

$$1 - \frac{\pi^2 d^2}{32R^2} \left( (16\sigma_0^2 + 4\sigma^2) NA^2 - \frac{8\sigma_0 \lambda}{R} NA + \frac{\lambda^2}{R^2} \right)$$

Then the resolving power R on the plane of Gaussian image for fine line width is given by the following equation.

$$R = \frac{\lambda/(2NA)}{\sqrt{\left(1 - 1.5 \left(\frac{C}{2a - a^2 - C} - 0.45\right) - \sigma\right)^2 - \sigma_0^2 + \sigma_0}} \quad \text{(Eq 1-31)}$$

Figure 24:
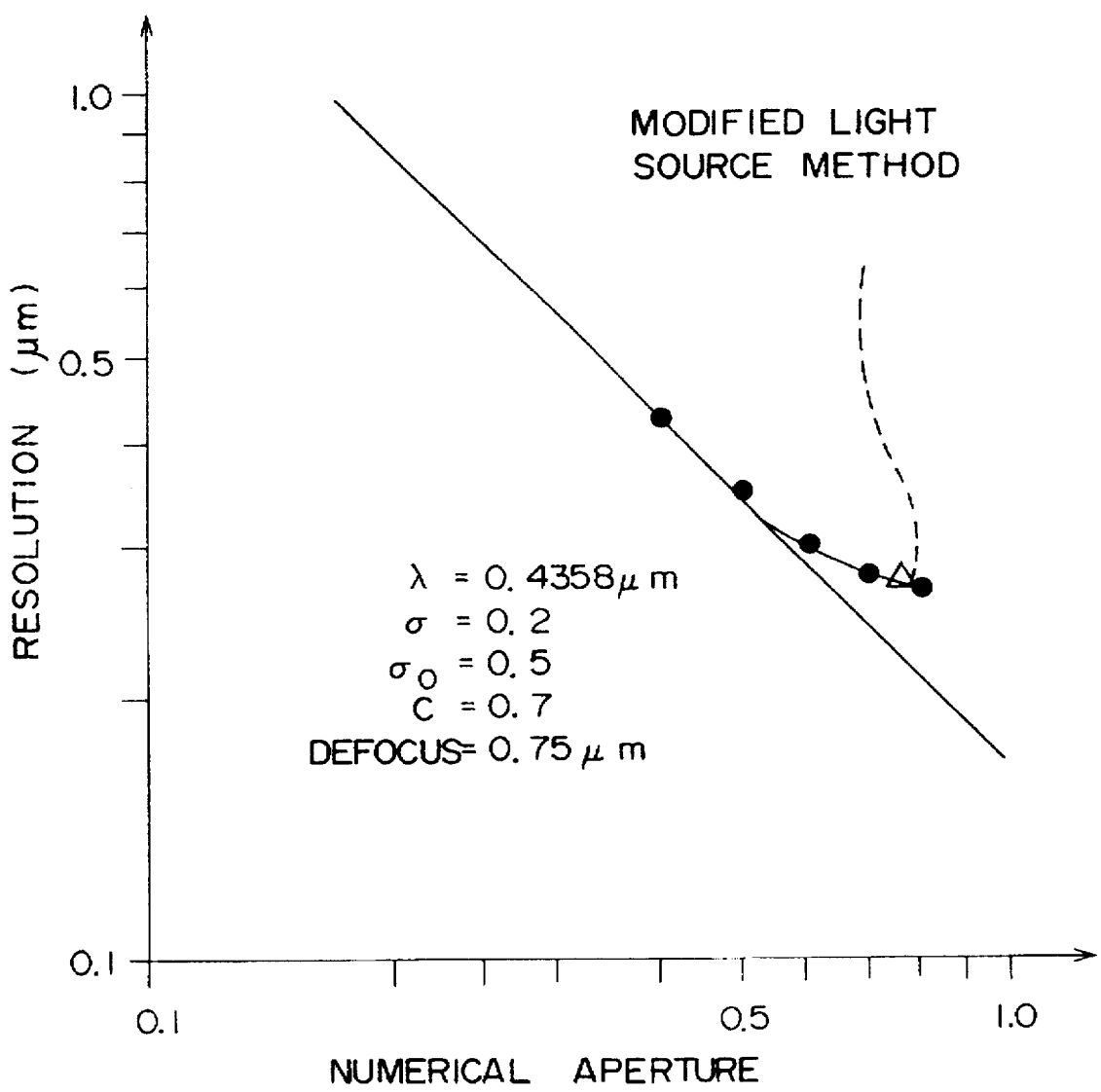
FIG. 24 is a drawing to show a relation between the numerical aperture and the resolution in the case using the modified light source method, where the wavelength $\lambda$, the coherence factor $\sigma$, the contrast C, and the defocus amount d are set as to be predetermined values.

FIG. 24 shows a relation between the numerical aperture NA of the projection optical system and the resolving power R for the case using the modified light source method. In FIG. 24, the solid line represents the results by (Eq 1-30) and (Eq 1-31) and solid dots by precise diffraction integration, from which it is understood that (Eq 1-30) is a good approximation. As the pattern size becomes rougher with an increase in defocus, the contrast rather tends to decrease. This is because a phase shift between image intensity distributions formed by the small light sources paired becomes larger. It is also given as a solution of (Eq 1-30), which is represented by the dot line in FIG. 24. Since this dot line is nearly vertical, an optimum numerical aperture NA in the modified light source method can be considered as an intersection between the solid line and the dot line. The point representing the optimum numerical aperture NA is indicated by a triangle in FIG. 24. The resolving power R is given by the following equation.

$$R = \frac{\sqrt{\pi\sigma}}{2(2)^{1/4}(4\sigma_0^2 + \sigma^2)^{1/4}(1 - (1 + a^2) \cdot C/2a)^{1/4}} - \sqrt{d\lambda} \quad \text{(Eq 1-32)}$$

$$= k_3 \sqrt{d\lambda}$$

In FIG. 24, the numerical aperture at the intersection between the solid line and the dot line is the optimum numerical aperture NA. From (Eq 1-30) and (Eq 1-32), the optimum numerical aperture NA is given by the following equation.

$$R = \frac{2(2)^{1/4}\sigma_0}{\sqrt{\pi\sigma} - (4\sigma_0^2 + \sigma^2)^{3/4}} - \left(1 - \frac{(1 + a^2)}{2a} - C\right)^{1/4} - \sqrt{\frac{\lambda}{d}} \quad \text{(Eq 1-33)}$$

Here, formation of a pattern with resolution over the resolution limit of the optical system becomes possible by the present invention using the two-photon absorption photoresist and performing the double exposure, similarly as in the previous embodiment.

For the case where the nonlinear photoresist (m=2) is used and double exposure is carried out by the modified light source method, substituting the following into (Eq 1-33), $$C = \sqrt{\frac{2C}{1 - C}} \quad \text{(Eq 1-34)}$$

The optimum NA is given by the following equation.

$$NA = \quad \text{(Eq 1-35)}$$

$$\frac{2 - (2)^{1/4} - \sigma_0}{\sqrt{\pi\sigma} (4\sigma_0^2 + \sigma^2)^{3/4}} - \left(1 - \frac{1 + a^2}{2a} \sqrt{\frac{2C}{1 - C}}\right)^{1/4} \sqrt{\frac{\lambda}{d}}$$

In the present embodiment the resolution is not so degraded within −20% from the optimum NA value, similarly as in the embodiment using the phase shift method. However, if the upper limit exceeds +10%, the resolution is degraded, as seen from FIG. 24.

If the phase shift mask as disclosed in Japanese Laid-open Patent Application No. 4-162039 (generally called as a halftone phase mask) is used with the above modified light source method using the two-photon absorption photoresist and performing the double exposure, the ratio between the zeroth-order diffracted light and the first-order diffracted light becomes 1, thus enabling to achieve an excellent effect of improved contrast.

The above two embodiments described only the examples about the two-photon absorption photoresist, but, for cases with m=3 or m=0.5, the best numerical aperture NA of the projection optical system can similarly be obtained by first attaining a general way of obtaining the optimum value of numerical aperture NA of the projection optical system and next substituting an equation taking the nonlinearity of the photoresist into consideration, into it.

Further, an embodiment of the apparatus of the present invention will be described below with reference to the drawing.

Figure 25:
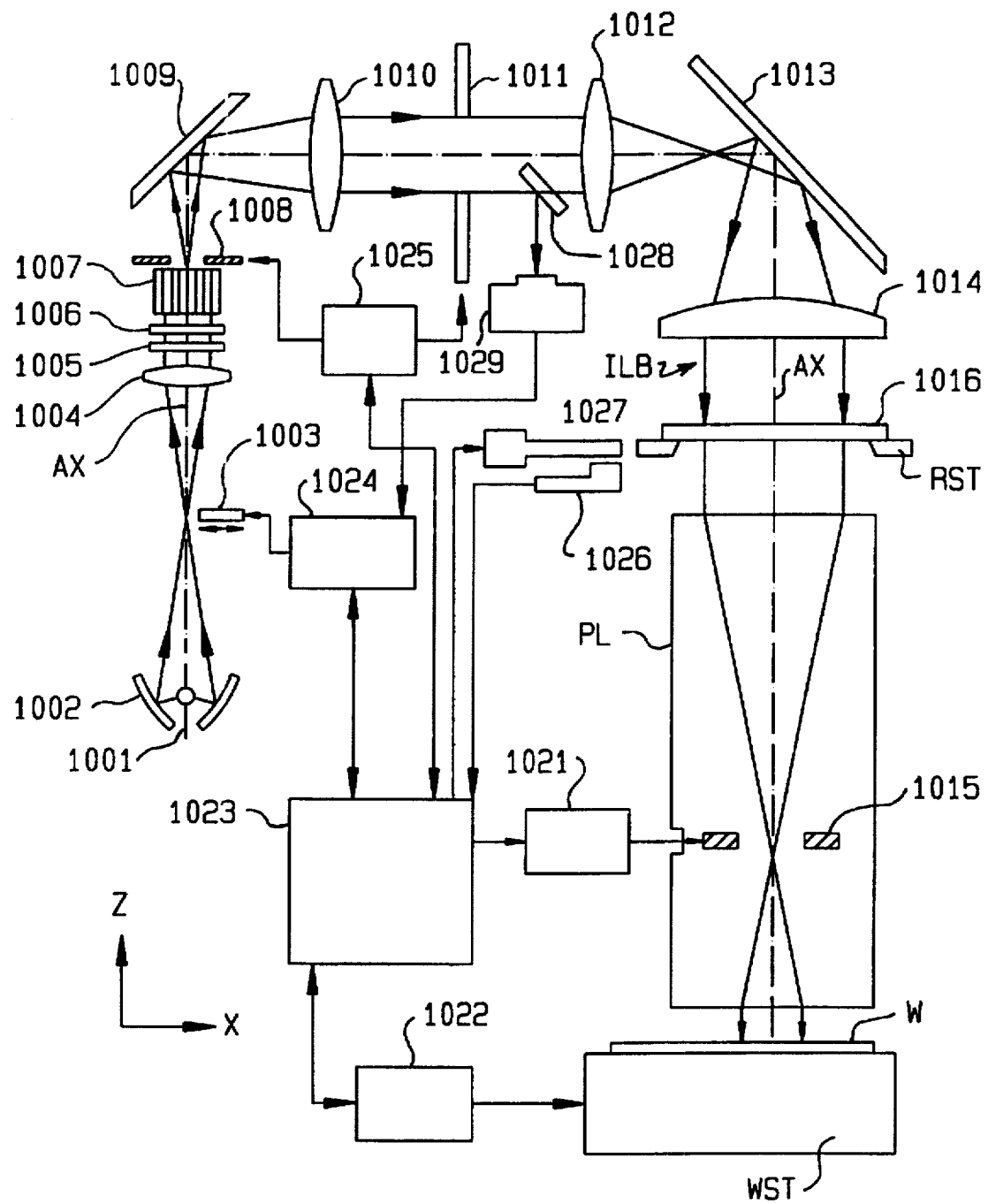
FIG. 25 is a structural drawing to show an embodiment of an exposure apparatus of the present invention.

FIG. 25 shows schematic structure of a projection exposure apparatus of the present embodiment. In FIG. 25, illumination light emitted from a mercury lamp 1001 is reflected by an elliptic mirror 1002, and thereafter is led through an input lens 1004 and then through a first filter plate 1005 and a second filter plate 1006 for letting light in a predetermined wavelength band pass, then to enter a fly's eye lens 1007. A shutter 1003 for switching between transmission and interruption of illumination light is provided near the second focal point of the elliptic mirror 1003, and a main control system 1023 for controlling operations of the entire apparatus controls the switching of the shutter 1003 through a drive unit 1024.

A variable aperture stop for illumination light (hereinafter referred to as "variable σ stop") 1008 is located on the rear (reticle-side) focal plane of the fly's eye lens 1007. The illumination light from numerous secondary light sources in the variable σ stop 1008 is reflected by a mirror 1009, and thereafter is led via a first relay lens 1010, a variable field stop (reticle blind) 1011, a second relay lens 1012, a mirror 1013, and a condenser lens 1014 then to illuminate a pattern area of the photo-mask with uniform illuminance. In this case, the plane on which the variable field stop 1011 is located is conjugate with the plane on which the pattern of reticle 1016 is formed, and the plane on which the variable σ stop 1008 is located is conjugate with the plane of the pupil of the projection optical system PL (Fourier transform plane of the pattern area of the reticle 1016). The main control system 1023 sets apertures of the variable o stop 1008 and variable field stop 1011 to respectively predetermined shapes through the drive unit 1025.

Specifically, when the aperture of the variable σ stop 1008 is set as circular about the optical axis, the conventional illumination method results, whereby the coherence factor (σ value) of the illumination light can be adjusted by controlling the diameter of the aperture. Where four apertures are provided in the variable σ stop 1008 about the optical axis, the modified light source method results. Further, exposure by the phase shift method becomes possible by providing some parts of the pattern on the reticle 1016 with phase shifters.

Also, the reticle 1016 is held on a reticle stage RST and a reticle reader 1026 is located near the reticle stage RST. When the reticle 1016 is loaded onto the reticle stage RST by an unrepresented reticle loader system, the reticle reader 1026 reads reticle information (bar code or the like) formed on the reticle 1016 and supplies the thus read reticle information to the main control system 1023. By this, the main control system 1023 can identify the contents of the reticle 1016 (type of pattern, minimum line width of pattern, etc.) currently held on the reticle stage RST, and optimizes the type of aperture and the size of aperture in the variable σ stop 1008 depending upon the result of identification. Further, depending upon the contents of the reticle 1016, the reticle 1016 is finely moved by a reticle moving unit 1027 in a direction perpendicular to the optical axis of the projection optical system PL.

Then, under the illumination light ILB emergent from the condenser lens 1014, an image of the pattern on the reticle 1016 is projected through the projection optical system PL onto a wafer W coated with a nonlinear photoresist. The wafer W is mounted on a wafer stage WST, which is composed of an XY stage for positioning the wafer W in the XY plane perpendicular to the optical axis AX of the projection optical system PL, a Z stage for positioning the wafer W in the Z-direction parallel to the optical axis AX, and so on. Depending upon the contents of the reticle 1016, the XY stage is very finely moved in the X direction or in the Y direction. The main control system 1023 controls the motion of the wafer stage WST through a wafer drive unit 1022, whereby a desired shot area on the wafer W is positioned in the image field of the projection optical system PL and a position of the shot area (focus position) along the optical axis of the projection optical system PL is set at the position of the image plane of the projection optical system PL.

In this example, a variable aperture stop 1015 is provided on the pupil plane of the projection optical system PL (i.e., on the Fourier transform plane with respect to the plane on which the pattern of photo-mask R is formed). The drive unit 1021 sets the diameter of aperture in the variable aperture stop 1015 to an optimum value in accordance with an instruction from the main control system 1023. The present embodiment can employ either one of the conventional illumination method and the modified illumination method by the aperture(s) set in the variable σ stop 1008. The phase shift method can also be used according to the type of reticle 1016 mounted on the reticle stage RST. In each of the cases using the respective methods, exposure is conducted while the coherence factor σ of the illumination light and the numerical aperture NA of the projection optical system PL are set as respective optimum values to maximize the resolution of the pattern image projected onto the wafer W.

Further, where the intensity of light from the light source changes with time, an appropriate exposure amount can be obtained by properly changing the exposure time as to match with an output signal from an integral exposure monitor 1029. Generally, the integral exposure monitor 1029 measures the intensity of a very small portion of beam between the variable field stop 1011 and the second relay lens 1012. A reflective mirror 1028 is set between the variable field stop 1011 and the second relay lens 1012 so that it guides the beam to the integral exposure monitor 1028. An output from the integral exposure monitor 1029 is transmitted to a driving device and further the driving device moves a shutter 1003. The integral exposure monitor 1029 can an exposure time in proper even when the first exposure is different from the second exposure in a light intensity.

The exposure method and exposure apparatus of the present invention can form a pattern with resolution surpassing the resolution limit which is optically given, and, where the phase shift method or the modified light source method is employed, they show an advantage that exposure can be made with nearly best resolution by setting the numerical aperture of the projection optical system within a predetermined range. The exposure method of using the phase shift patterns or mask is described in Optics, vol.23, No.1, pp 29–37, 1994; and in SPIE vol.1780, Lens and Optical Systems Design, pp 117–131, 1992.

Next, an exposure method according to present invention using a reticle having separated line patterns and the photosensitive material having a nonlinear sensitivity will be described.

The present invention relates to an exposure method, particularly to a projection-type exposure method, used in fabricating semiconductor devices or liquid crystal plates.

In the conventional exposure methods, all of patterns desired to be exposed are provided on a same reticle and are printed on the substrate by single exposure. On that occasion, a latent image reaction density ξ according to exposure intensity I appears in the photoresist coating on the substrate.

$$\xi = \exp(-CD), D = J \cdot t = I^m \cdot t \qquad (2\text{-}1)$$

In the equation, I represents light intensity, t an exposure time, and C a constant determined by the photosensitive material. Further, m is an exponent indicating linearity of the photosensitive material, which is linear with m=1 while nonlinear with m≠1. For easy recognition, J replaces $I^m$ as in the above equation and J is called as a latent image density. Most of the photoresists presently used in general are linear with m=1.

Using a general linear photoresist and assuming for simplicity that image formation is completely incoherent, a spectrum i of exposure intensity distribution I (x) for forming a latent image in the photoresist is given by the below equation with an object spectrum being $i_0$ and an OTF (Optical Transfer Function) of an optical system being f.

$$i(v)=i_0(v) \cdot f(v) \qquad (2\text{-}2)$$

v: spatial frequency

Now, a spatial frequency $v_0$, which is a limit spatial frequency at which the OTF or f becomes not significant in respect of process, is given by the below equation with an exposure wavelength being $\lambda$ and a numerical aperture of projection optical system on the photosensitive material side being NA.

$$v_0 = 0.5 NA/(K_1 \cdot \lambda) \qquad (2\text{-}3)$$

$K_1$: process constant

Further, the resolution limit of the optical system is theoretically determined by the numerical aperture NA, and in that case $K_1=0.25$, whereby a cutoff frequency $v_c$ of the optical system is given by the following equation.

$$v_c = 2NA/\lambda \qquad (2\text{-}4)$$

Accordingly, in order to achieve high resolution, either a decrease of wavelength or an increase of numerical aperture NA was needed.

Figure 26:
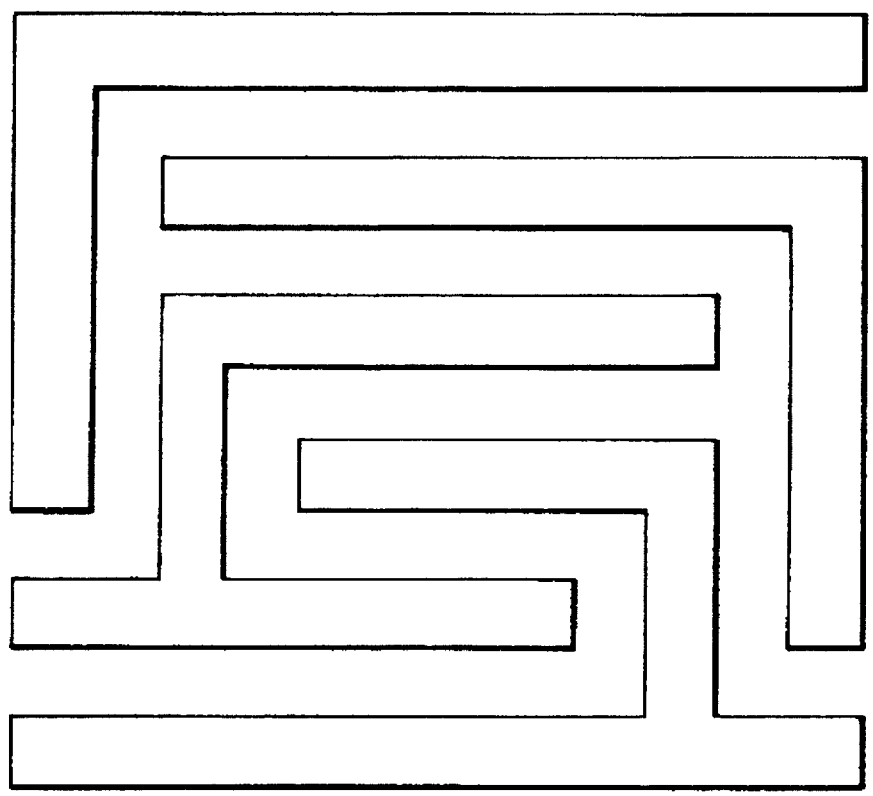
FIG. 26 is a drawing of a two-dimensional pattern to be formed by the first embodiment.

In conventionally general exposure methods for two-dimensional pattern, a pattern, for example as shown in FIG. 26, was used without modification as a reticle pattern and was subjected to full exposure on a linear photoresist through the projection optical system.

The above conventional exposure methods require either an increase in numerical aperture NA or a decrease in wavelength $\lambda$ in order to achieve high resolution. However, since the depth of focus Fd of the projection optical system is proportional to the wavelength $\lambda$ and inversely proportional to the square of NA, as expressed by the following equation, the depth of focus becomes shallower in either case.

$$Fd = K_2 \cdot \lambda/NA^2 \qquad (2\text{-}5)$$

$K_2$: process constant

Also, the optical system becomes larger and specialized, which is not suitable for practical use. Further, the final resolution limit on the photosensitive material has never surpassed the resolution limit determined by the projection optical system.

The present invention has been accomplished in view of the above problems, and an object of the present invention is to provide an exposure method which can form a two-dimensional pattern with high resolution surpassing the resolution limit of projection optical system with little modification of the conventional exposure wavelength and optical system.

To solve the above problems, the present invention provides a projection exposure method for projecting a pattern on a photo-mask onto a predetermined photosensitive material through a projection optical system, wherein the pattern on said photo-mask is separated into line patterns in each of which lines extend only in the longitudinal direction, the thus separated line patterns each are further separated into new line patterns with a pitch arranged every several said lines, said photosensitive material is one a latent image reaction density of which has a nonlinear sensitivity property against intensity of incident light, and a plurality of exposure processes using said new line patterns thus separated are carried out, thereby enabling to form a two-dimensional pattern with high resolution surpassing the resolution limit of the projection of optical system.

In the above exposure method, the pitch of the new line patterns separated is preferably set as to be not smaller than the resolution limit of the projection optical system.

Further, the above exposure method is preferably so arranged that where one of the new line patterns separated includes separate lines on a same line and a space between the lines separately formed is narrower than the resolution limit of the projection optical system, one of said separate lines is further separated as a further new line pattern from the other, and the further new line patterns separated should be used.

First, in order to describe the most basic concept of the present invention, here is considered formation of point image by the optical system in the use of a so-called two-photon absorption photoresist with m=2. In this case, the two-photon absorption photoresist makes the latent image density distribution of point image sharper. It is sufficient for this case taking the point spread distribution F(x) by the optical system into consideration irrespective of the illumination state. Then, supposing a desired object intensity distribution $I_0(x)$ is formed by superposition of point images and a latent image density distribution J(x) is formed thereby, the density distribution can basically be expressed by the following equation, because it is superposition of light intensities given by image formation of respective point images.

$$J(x) = I_0(x) * \{F(x)\}^2 \qquad (2\text{-}6)$$

Since the latent image density distribution of point image involves $\{F(x)\}^2$, it is sharper than the point spread distribution F(x) by the optical system, thus realizing high resolution. By Fourier transformation of Equation (2-6), the following equation is obtained.

$$j(v) = i_0(v) \cdot \{f(v) * f(v)\} \qquad (2\text{-}7)$$

Then, f*f can be interpreted as OTF of the optical system to obtain the latent image density distribution by this method. This means that the cutoff frequency $(4NA/\lambda)$ can be achieved against the cutoff frequency $(2NA/\lambda)$ of the conventional OTF or f, thus doubling the resolution.

Figure 36A:
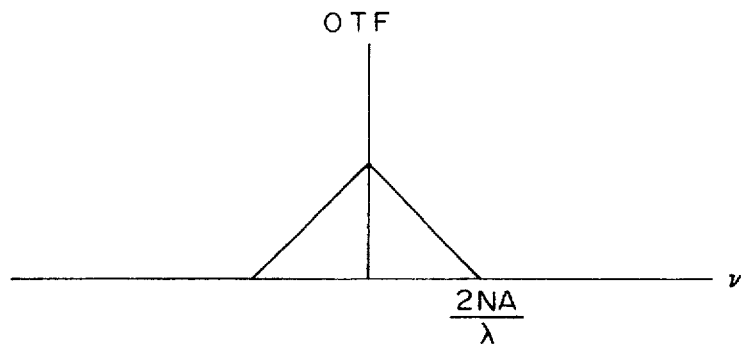
FIG. 36A and FIG. 36B include explanatory drawings of OTF.
Figure 36B:
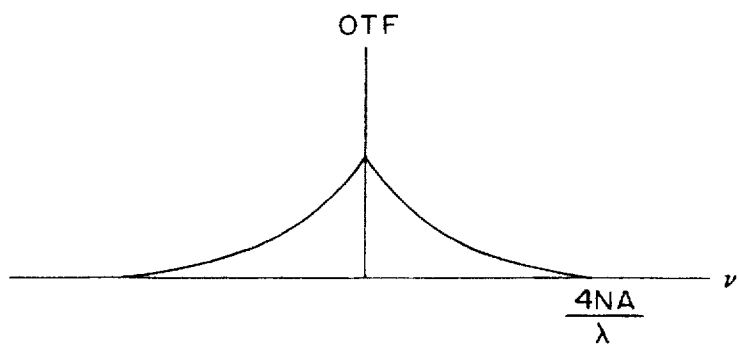

FIG. 36A and FIG. 36B diagrammatically show this comparison. FIG. 36A indicates the OTF in the conventional method, while FIG. 36B the OTF for the case where a two-photon absorption photoresist is exposed to isolated patterns. Therefore, a fine pattern can be formed with resolution over the resolution limit of the optical system when a latent image is formed using the two-photon absorption photoresist and performing a plurality of exposure processes based on isolated patterns. Accordingly, formation of a pattern with resolution over the resolution limit of the optical system becomes possible by the combination of the photosensitive material having the nonlinear sensitivity property with the plural exposure processes by isolated patterns.

Further, a pattern with resolution over the resolution limit of the optical system can also be formed, similarly as in the case of the isolated patterns, where a plurality of exposure processes are carried out using patterns which are not perfectly isolated but can be considered as nearly isolated. In this case, a spectrum j of latent image density distribution is defined by the following equation.

$$j(v) = \Sigma i_{0j}(v) \cdot \{f(v)*f(v)\} \quad (2\text{-}8)$$
$$= i'(v) \cdot \{f(v)*f(v)\}$$
$$i'(v) = \Sigma i_{0j}(v)$$

In the above equation, $i_{0j}$ represents object spectra of mutually nearly isolated patterns, and i' is considered as an object spectrum of an imaginary pattern constructed by superposition of the nearly isolated patterns. No spectra of conventional latent image density distributions can surpass the cutoff frequency (2NA/λ) of f, while the present invention permits a spectrum up to the cutoff frequency (4NA/λ) of {f(v)f(v)} to be formed as a latent image density distribution, as indicated by Equation (2-8).

As described above, the pitch of formed pattern never surpasses the resolution limit of the optical system by the single use of the photosensitive material having the nonlinear sensitivity property in the conventional exposure method, while in the present invention a latent image density distribution of pattern with a pitch surpassing the resolution limit of the optical system can be formed by performing a plurality of exposure processes different in light intensity distribution on such a photosensitive material so as to provide appropriate i'.

Although the above description is given with the so-called two-photon absorption photoresist in which the latent image density J is in proportion to the square of the exposure intensity I, that is, in which the latent image reaction density ξ is formed according to the square of the exposure intensity i, the present invention is by no means limited to it. The present invention may employ any photosensitive materials having the nonlinear sensitivity property as long as the latent image reaction density ξ is formed according to the m-th power (m>1) of the exposure intensity I. In this case, the latent image density distribution is expressed by the m-th power of the light intensity distribution F(x) of point image, so that it is a sharper distribution than the light intensity distribution F(x) of point image and the above equation (2-6) can be rewritten as follows.

$$J(x)=I_0(x)*\{F(x)\}^m \quad (2\text{-}9)$$

Further, the illumination state is not limited to the incoherent illumination, but may be any of the oblique illumination and various modified illumination methods, similarly forming a very fine pattern. Of course, a self-emitting object can be used.

With the Fourier transformation of Equation (2-9), it is seen from the convolution theorem of the Fourier transformation that a pattern (latent image density distribution) can be formed up to a frequency of m times the cutoff frequency of the optical system. There is a possibility of forming a further finer pattern by a plurality of exposure processes with patterns which are not completely isolated from each other in each exposure.

Although the above description concerned the cases where the power m was greater than 1 (m>1) in the above Equation (2-9), that is, where the latent image density J was emphasized more than the light intensity I, simulation results verified that a fine pattern with resolution over the resolution limit of the projection optical system could substantially be formed where the power m was smaller than 1 (m<1). Such a sensitivity property is also effective that the power m in Equation (2-9) is not constant but changes depending upon the light intensity I.

Next described is a method for forming a high-resolution pattern surpassing the resolution limit of the projection optical system in the case of a one-dimensional pattern (line pattern) using the two-photon absorption photoresist and performing a plurality of exposure processes.

Figure 33A:
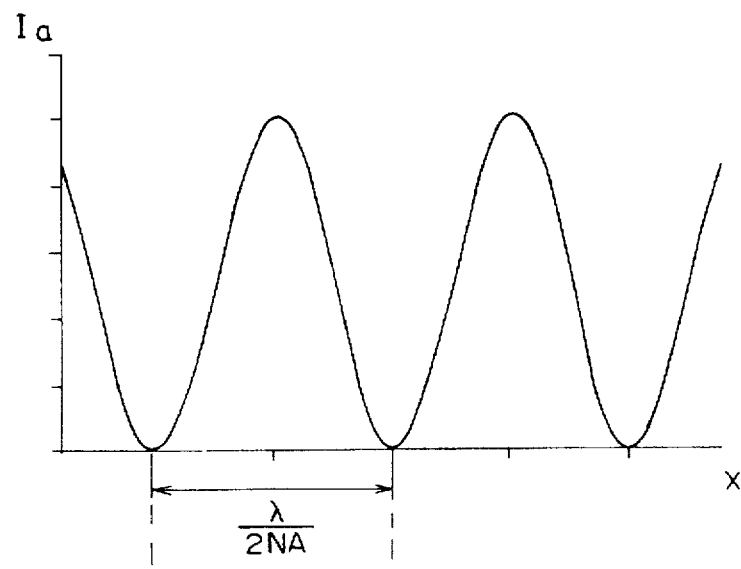
FIG. 33A and FIG. 33B include drawings of exposure intensity distributions for respective exposure processes in forming the one-dimensional pattern.

In this case, exposure is carried out using reticles shown in FIG. 32A and FIG. 32B. The reticle shown in FIG. 32A consists of a transparent substrate 2001a, open portions 2004a, opaque portions 2002a, and phase shifters 2003a. Also, a distance between a certain open portion and a next open portion is λ/2NA, which is the resolution limit of the optical system on the image plane, and a phase shifter 2003a is provided for every other open portion 2004a. When exposure is made on the two-photon absorption photoresist through the projection optical system, using this reticle, the exposure intensity distribution shown in FIG. 33A is given on the two-photon absorption photoresist.

Figure 33B:
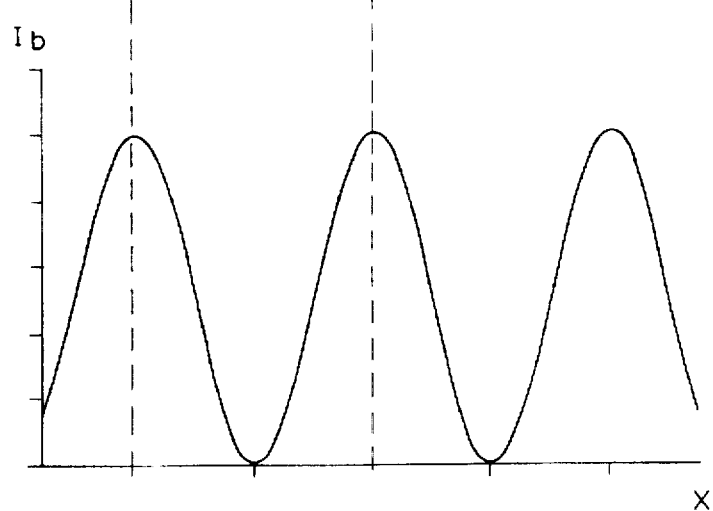

Then the reticle shown in FIG. 32A is exchanged for the reticle shown in FIG. 32B, and exposure is effected therewith. The reticle shown in FIG. 32B consists of a transparent substrate 2001b, open portions 2004b, opaque portions 2002b, and phase shifters 2003b, arranged as if the reticle shown in FIG. 32A and FIG. 32B is shifted by a half cycle of the pitch. Such second exposure gives the exposure intensity distribution shown in FIG. 33B on the two-photon absorption photoresist. The exposure intensity distribution shown in FIG. 33B corresponds to one obtained by shifting the exposure intensity distribution shown in FIG. 33A by a half cycle of the pitch.

Figure 34A:
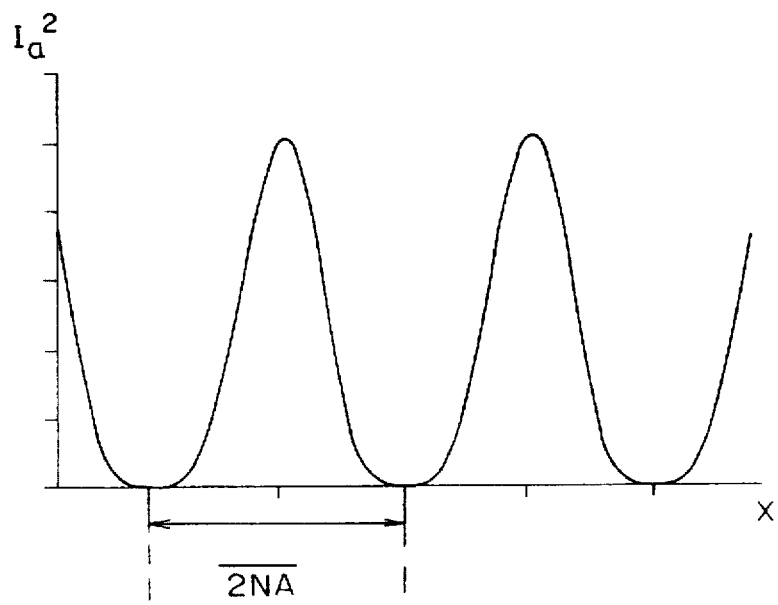
FIG. 34A and FIG. 34B include drawing of latent image density distributions for respective exposure processes in forming the one-dimensional pattern.
Figure 34B:
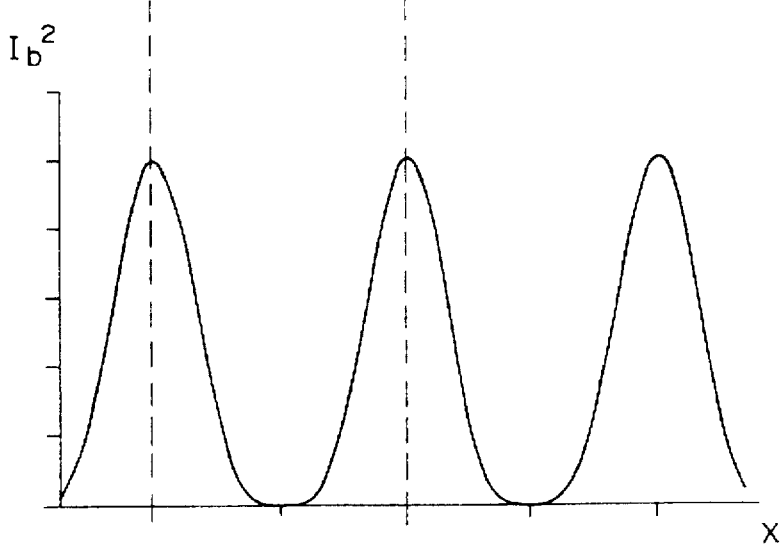
Figure 35:
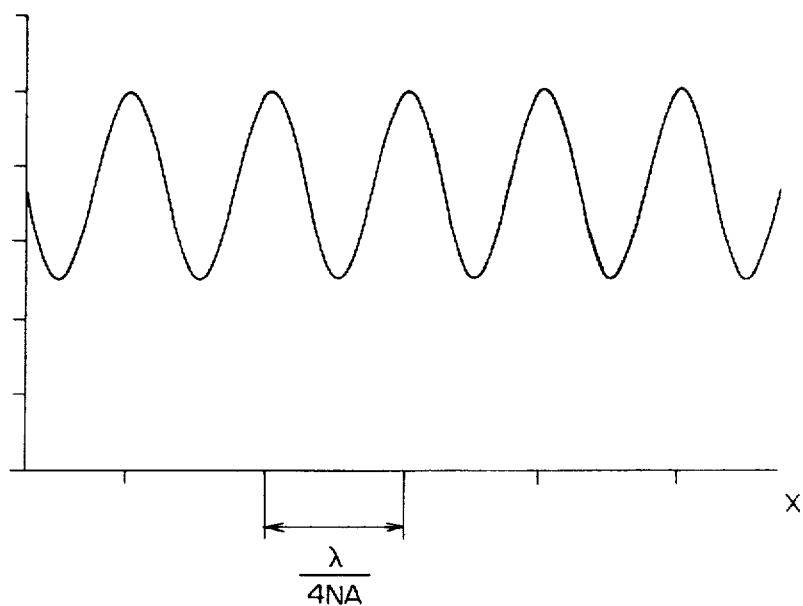
FIG. 35 is a drawing of latent image density distribution in a two-photon absorption photoresist in forming the one-dimensional pattern.

With the two exposure intensity distributions different in pattern as described above, from Equation (2-1), the first exposure intensity distribution gives the latent image density distribution shown in FIG. 34A in the two-photon absorption photoresist and the second exposure intensity distribution gives the latent image density distribution shown in FIG. 34B in the two-photon absorption photoresist. Since these two latent image density distributions are formed in the same two-photon absorption photoresist, addition of these two latent image density distributions results in the latent image density distribution shown in FIG. 35, in which a fine pattern is formed at the pitch of a half of the resolution limit of the optical system.

Next described is a method for forming a high-resolution pattern surpassing the resolution limit of the projection optical system for the cases of two-dimensional pattern.

For example, let us consider a case where a high-resolution pattern surpassing the resolution limit of the projection optical system is formed using the pattern shown in FIG. 26 and the two-photon absorption photoresist. If the pattern is separated every open portion, any way of separation cannot form a pattern with high resolution being a half of that of the conventional projection optical system. On the other hand, one-dimensional patterns permit a pattern with high resolution being a half of that of the conventional projection optical system to be formed as described above.

Figure 27A:
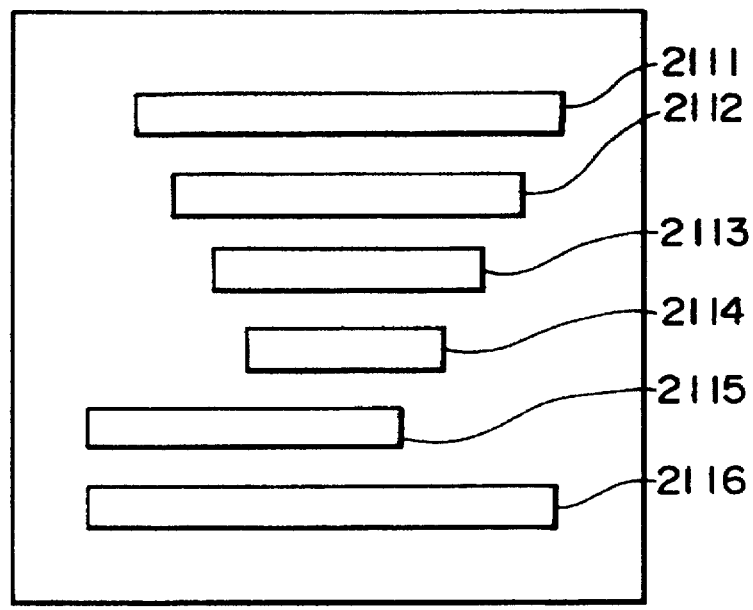
FIG. 27A and FIG. 27B include drawings of line patterns decomposed in the first embodiment.
Figure 27B:
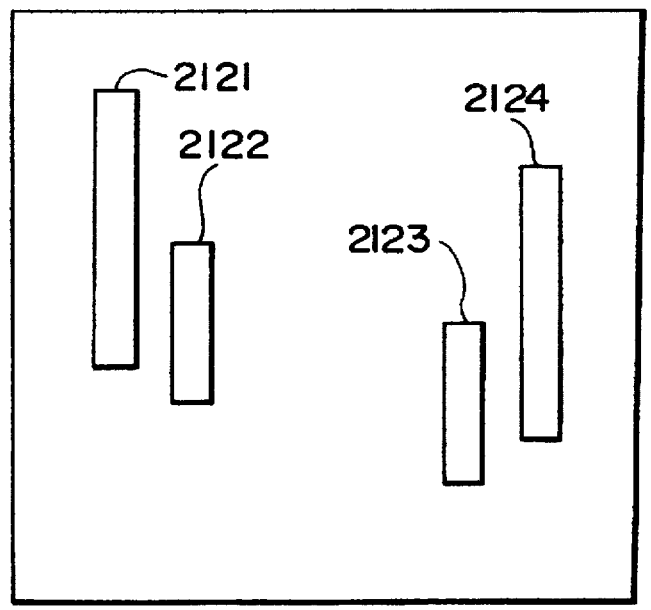

Therefore, the two-dimensional pattern is first decomposed into one-dimensional patterns in the present invention, as shown in FIG. 27A and FIG. 27B. After the decomposition into one-dimensional patterns, the one-dimensional patterns decomposed are separated, as shown in FIGS. 28A to 28D or in FIGS. 29A to 29D, so as to enable to use the above technique for forming a fine pattern with the pitch being a half of the resolution limit of the optical system with one-dimensional patterns. The formation of fine pattern with resolution surpassing the resolution limit of the optical system becomes possible by exposure using the two-photon absorption photoresist and the thus separated one-dimensional patterns shown in FIGS. 28A to 28D or in FIGS. 29A to 29D.

The embodiment is described below. Here is described a method for forming an image in the size of a half of the resolution limit by the conventional projection optical system from the pattern shown in FIG. 26 and with illumination of coherent light, using the two-photon absorption photoresist (m=2) and the phase shifters.

In the pattern shown in FIG. 26 there are lines extending in the vertical direction and in the horizontal direction in the plane of the drawing. Then the pattern shown in FIG. 26 is decomposed as shown in FIG. 27A and 27B, thus obtaining a line pattern having only lines horizontally extending in the plane of the drawing as shown in FIG. 27A and a line pattern having only lines vertically extending as shown in FIG. 27B.

The line pattern having the lines horizontally extending in the plane of the drawing as shown in FIG. 27A consists of elements 2111, 2112, 2113, 2114, 2115, and 2116 of open portions, which will be open portions in a reticle pattern, arranged in the named order from the top of the drawing. Also, the line pattern having the lines vertically extending as shown in FIG. 27B consists of elements 2121, 2122, 2123, and 2124 of open portions, which will be open portions in a reticle, arranged in the named order from the left of the drawing.

Figure 28A:
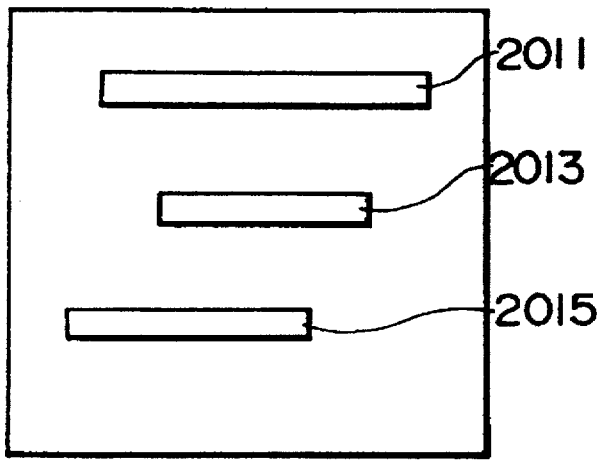
FIGS. 28A to 28D include drawings of line patterns separated in the first embodiment.
Figure 28C:
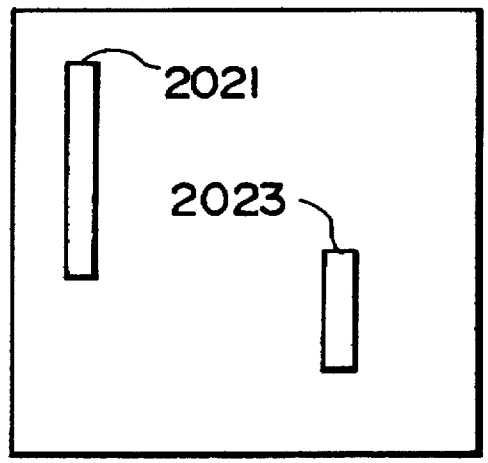
Figure 28B:
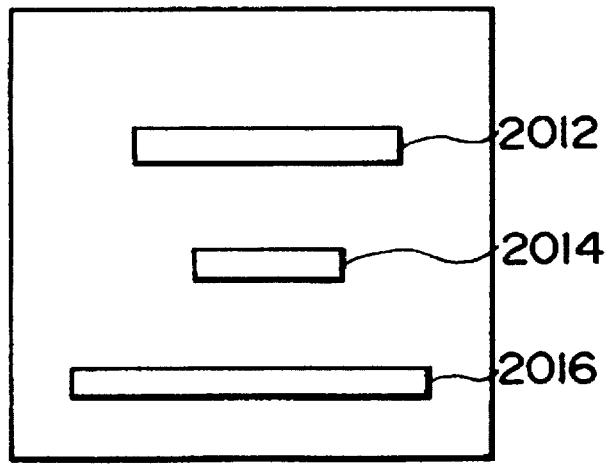

Further, the line pattern shown in FIG. 27A is separated into a pattern shown in FIG. 28A and a pattern shown in FIG. 28B so that the decomposed line pattern with the horizontally long lines shown in FIG. 27A can permit a plurality of exposure processes using the two-photon absorption photoresist. In th present embodiment, the elements of open portions are separated into the pattern shown in of FIG. 28A and the pattern shown in FIG. 28B every other element. In more detail, the pattern shown in FIG. 28A has open portions 2011, 2013, and 2015 while the pattern shown in FIG. 28B open portions 2012, 2014, and 2016. The open portions 2011, 2013, and 2015 are based on the elements 2111, 2113, and 2115 of open portions in the line pattern shown in FIG. 27A. Similarly, the open portions 2012, 2014, and 2016 are based on the elements 2112, 2114, and 2116 of open portions in the line pattern shown in FIG. 27B.

Figure 28D:
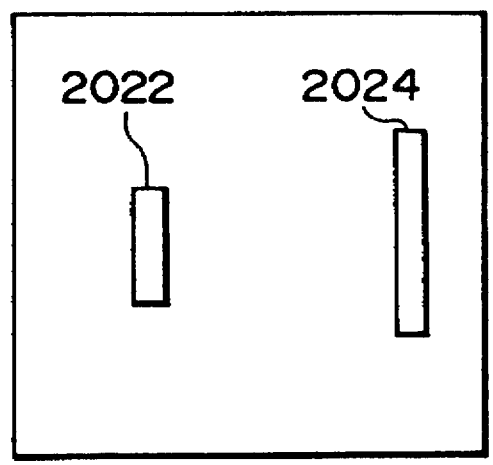

The decomposed line pattern with the vertically long lines shown in FIG. 27B is also separated into line patterns shown in FIG. 28C and FIG. 28D, similarly as the horizontally decomposed line pattern was separated. In the present embodiment, the line pattern is separated into the pattern shown in FIG. 28C and the pattern shown in FIG. 28D every other open portion. The pattern shown in FIG. 28C has open portions 2021 and 202 pattern the pattern shown in FIG. 28D has open portions 2022 and 2024. The open portions 2021 and 2023 are based on the elements 2121 and 2123 of open portions in the line pattern shown in FIG. 27B. Also, the open portions 2022 and 2024 are based on the elements 2122 and 2124 of open portions in the line pattern shown in FIG. 27B.

Figure 29A:
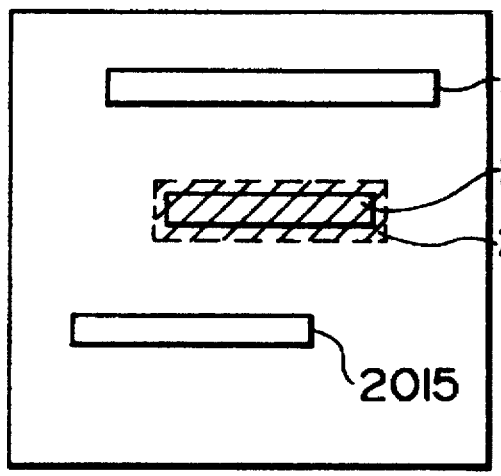
FIGS. 29A to 29D include drawings of reticle patterns with phase shifters in the first embodiment.
Figure 29C:
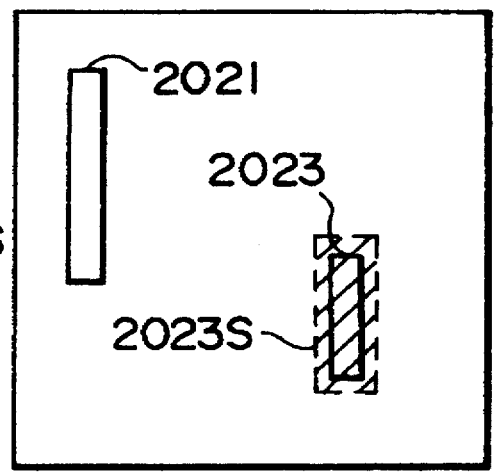
Figure 29B:
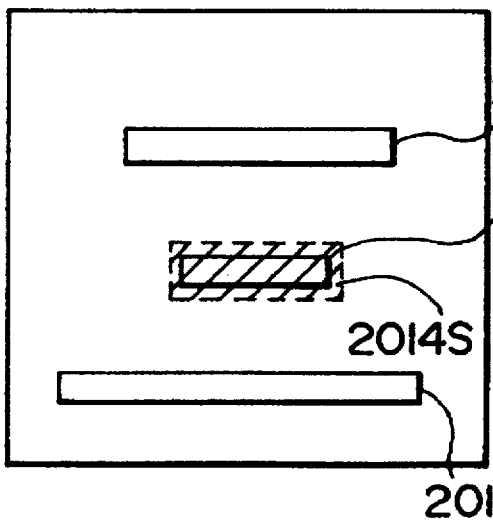
Figure 29D:
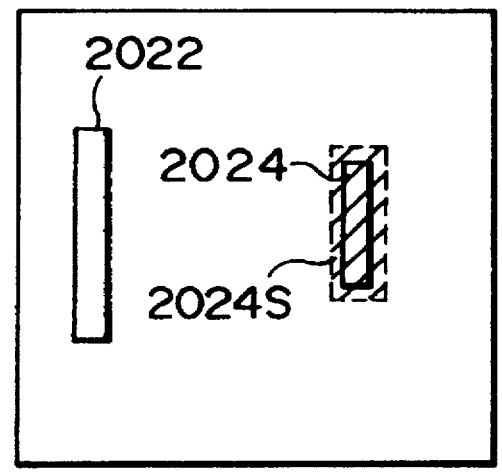

Here, the resolution limit by incoherent light is the spacing between the open portions shown in FIG. 28A and FIG. 28B on the image plane. However, where the patterns shown in FIG. 28A and FIG. 28B are actually used as reticles in an exposure apparatus, the patterns cannot be resolved, because the light source emits coherent light. Therefore, when the patterns shown in FIG. 28A and FIG. 28B are actually used as reticles in the exposure apparatus, a phase shifter is provided every other open portion as shown in FIG. 29A and FIG. 29B. As shown in FIG. 29A and FIG. 29B, the present embodiment is so arranged that among the three open portions in each pattern, the middle open portions 2013 and 2014 are provided with respective phase shifters 2013S and 2014S. Such a modification is of course possible that a phase shifter is given for each of open portions 2011, 2012, 2015, 2016 located on the sides in the patterns shown in FIG. 28A and FIG. 28B and no phase shifter is given for the middle open portions 2013 and 2014.

The patterns shown in FIG. 28C and FIG. 28D are also arranged, similarly as the patterns shown in FIG. 28A and FIG. 28B, so that a phase shifter 2023S or 2024S is given for every other open portion, i.e., for each of open portions 2023 and 2024. Here, the case of the present embodiment does not necessarily need the phase shifters, because the line patterns with vertically extending lines shown in FIG. 28C and FIG. 28D include lines apart more than the resolution limit by coherent light in the plane of the drawing. In the case of the present embodiment the phase shifters 2023S and 2024S are provided in order to obtain an image with better contrast.

In actual exposure, the line patterns shown in FIG. 29A to FIG. 29D, produced as described above, are successively used. Using the two-photon absorption photoresist, the reticle patterns are projected one by one through the projection optical system, whereby a two-dimensional pattern which is complex and very fine can be formed with resolution being a half of that of the conventional projection optical system. On this occasion, there is no specific order for projection of the reticle patterns shown in FIG. 29A to FIG. 29D. Also, the two-photon absorption photoresist may be one of those described in Proceeding of SPIE, vol. 1674, pp 776-778, 1992.

The second embodiment is next described. Here is described a method for forming an image with resolution being one third of the resolution limit by the conventional projection optical system from a pattern shown in FIG. 30A and with illumination of coherent light, using a nonlinear photoresist of m=3 (hereinafter referred to as a three-photon absorption photoresist for convenience' sake) and the phase shifters.

Figure 30A:
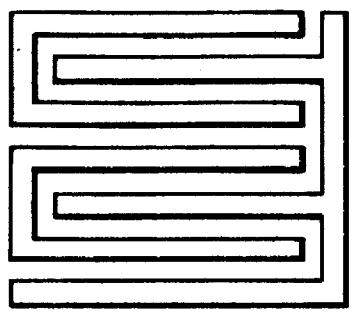
FIGS. 30A to 30F include a drawing of a two-dimensional pattern to be formed by the second embodiment, and drawings of reticle patterns in the second embodiment.

The pattern shown in FIG. 30A includes lines extending in the vertical direction and in the horizontal direction in the plane of the drawing. Then the pattern shown in FIG. 30A is decomposed into a line pattern having only lines horizontally extending in the plane of the drawing as shown in FIG. 31A and a line pattern having only lines vertically extending in the plane of the drawing as shown in FIG. 31B, similarly as in the first embodiment.

Figure 31A:
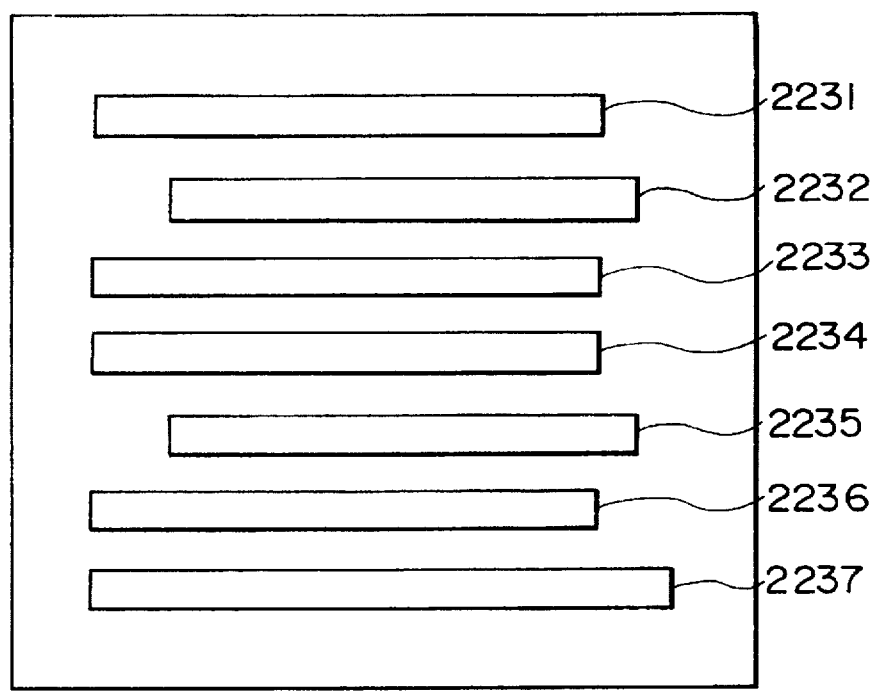
FIG. 31A and FIG. 31B include drawings of line patterns decomposed in the second embodiment.
Figure 31B:
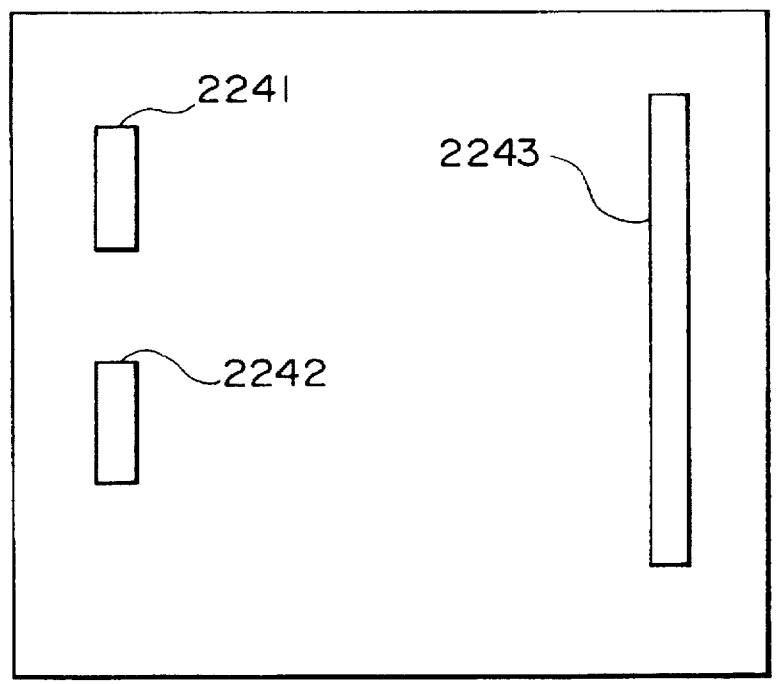

The line pattern having the lines horizontally extending in the plane of the drawing as shown in FIG. 31A consists of elements 2231, 2232, 2233, 2234, 2235, 2236, and 2237 of open portions, which will be open portions in a reticle, arranged in the named order from the top of the drawing. Also, the line pattern having the lines vertically extending in the plane of the drawing as shown in FIG. 31B consists of an element 2241 of open portion, which will be an open portion in a reticle, in the left upper portion of the drawing, an element 2242 of open portion on the left lower portion of the drawing, and an element 2243 of open portion on the right side of the drawing.

Further, the decomposed line pattern with the lines horizontally extending in the plane of the drawing as shown in FIG. 31A is separated similarly as in the first embodiment so as to enable to perform a plurality of exposure processes using the three-photon absorption photoresist. Since the present embodiment employs the three-photon absorption photoresist, the lines are separated every three lines.

Figure 30D:
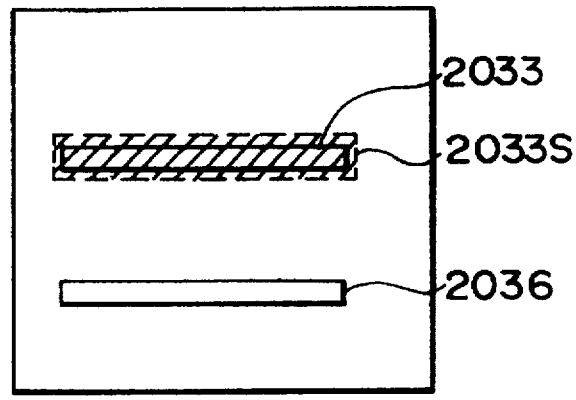
Figure 30B:
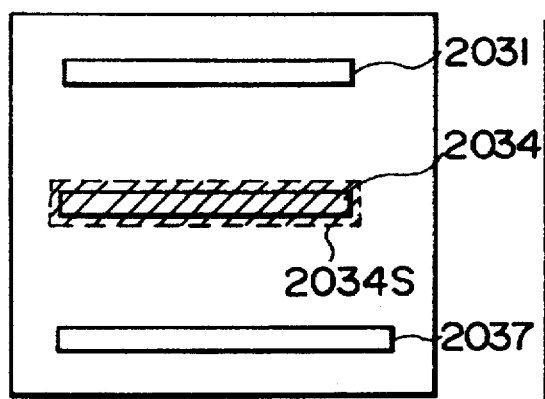

Further, similarly as in the first embodiment, a phase shifter is provided every other open portion in order to realize resolution up to the resolution limit under illumination of incoherent light. Through the above steps the reticle patterns shown in FIG. 30B, FIG. 30C, and FIG. 30D are obtained. The reticle pattern shown in FIG. 30B consists of an open portion 2031, an open portion 2034 on which a phase shifter 2034S is provided, and an open portion 2037 arranged in the named order from the top of the drawing. The reticle pattern shown in FIG. 30C consists of an open portion 2032 on which a phase shifter 2032S is provided, and an open portion 2035 arranged in the named order from the top of the drawing. The reticle pattern shown in of FIG. 30D consists of an open portion 2033 on which a phase shifter 2033S is provided, and an open portion 2037 arranged in the named order from the top of the drawing. The open portions 2031, 2032, 2033, 2034, 2035, 2036, and 2037 shown in FIGS. 30A to 30F are based on the elements 2231, 2232, 2233, 2234, 2235, 2236, and 2237 of open portions, respectively, shown in FIG. 31A and FIG. 31B. Here, the resolution limit of the optical system under incoherent illumination is a spacing between the open portions shown in FIG. 30B, FIG. 30C, and FIG. 30D.

In the case of the decomposed line pattern with the lines vertically extending in the plane of the drawing as shown in FIG. 31B, the elements of open portions present on the left side of the drawing are separate from each other on a same line. In addition, a spacing between the element of open portion and the element of open portion separate from each other is narrower than the resolution limit of the optical system. Therefore, the line on the left lower side of the drawing is separated out as another line pattern. Then, a phase shifter is provided every other open portion for the patterns having the vertically extending lines as thus separated, similarly as for the patterns shown in FIG. 30B, FIG. 30C, and FIG. 30D.

Figure 30E:
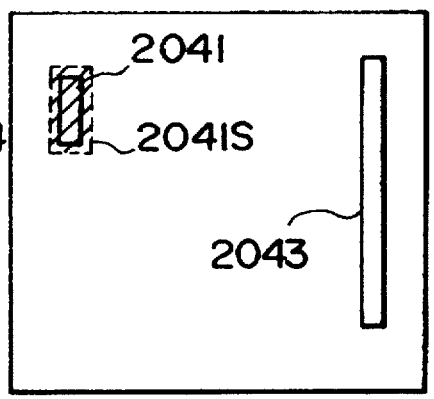
Figure 30C:
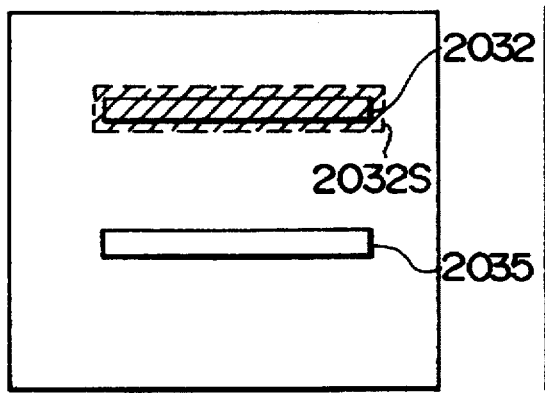
Figure 30F:
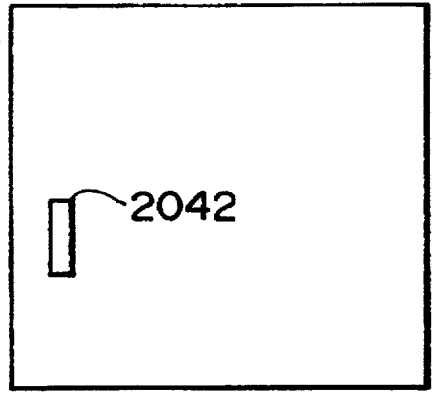

The thus obtained reticle patterns are shown in FIG. 30E and FIG. 30F. The reticle pattern shown in FIG. 30E consists of an open portion 2041 on which a phase shifter 2041S is provided, and an open portion 2043 arranged in the named order from the left of the drawing. Also, the reticle pattern shown in FIG. 30F consists only of an open portion 2042 on the left lower side of the drawing. In the case of the present embodiment the phase shifter 2041S can be omitted, because the lines in the line pattern having the vertically extending lines as shown in FIG. 30E are separated from each other more than the resolution limit by coherent light. It should be, however, noted that the light intensity will not be zero at the center between the lines if the phase shifter 2041S is omitted in contrast, with provision of the phase shifter 2041S the light intensity becomes zero at the center between the lines, thus providing an image with better contrast.

In actual exposure, the thus produced line patterns shown in FIG. 30B to FIG. 30F are successively used, so that, using the three-photon absorption photoresist, the reticle patterns are projected through the projection optical system to form a two-dimensional pattern which is complex and very fine, with the pitch being one third of the resolution limit of the conventional projection optical system. On this occasion, there is no specific order for projection of the reticle patterns shown in FIGS. 30B to 30F.

Although the above description showed the method for forming a two-dimensional pattern surpassing the resolution limit of the optical system with the phase shifters and coherent light source, the present invention is also effective to cases using an incoherent light source. For example, using the patterns shown in FIGS. 28A to 28D as reticles without modification, a two-dimensional pattern can be obtained with the pitch being three quarters of the resolution limit of the optical system.

Further, the above description showed only the examples where the pattern had the lines vertically and horizontally extending in the plane of the drawing, but the present invention is also effective to other cases, for example, to a case of hexagonal pattern which has lines vertically extending in the plane of the drawing, lines inclined 60° to the right from the vertical direction in the plane of the drawing, and lines inclined 60° to the left from the vertical direction in the plane of the drawing.

As described above, the present invention realized formation of two-dimensional pattern with high resolution surpassing the resolution limit of the projection optical system by using a photosensitive material having the nonlinear sensitivity property of the latent image reaction density against the intensity of incident light and performing a plurality of exposure processes using decomposed and separated line patterns.

Next, an exposure method or apparatus using two or more exposure wavelength will be described.

The present invention relates to an exposure apparatus, particularly to a projection-type exposure apparatus and a projection exposure method, used in fabricating semiconductor devices or liquid crystal plates.

The present invention is related to the technique for enabling to form a finer pattern by using a photosensitive material with nonlinear sensitivity property to intensity of incident light and performing a plurality of exposure processes with a change of light intensity distribution on the photosensitive material.

To improve the exposure technique, two or more exposure wavelengths are used and a pattern on a reticle is constructed using optical filters having different transmittances for the two or more different exposure wavelengths. Also, some cases employ a photosensitive material consisting of two or more types of photoresists having different sensitivity properties for the two or more different wavelengths.

Specifically, an exposure method employs a photosensitive material having a nonlinear sensitivity property of latent image reaction density against the intensity of incident light and performs a plurality of exposure processes different in light intensity distribution on the photosensitive material, thereby enabling to form a pattern with high resolution surpassing the resolution limit of the projection optical system, wherein light beams having two or more different wavelengths are used as exposure light to illuminate a photo-mask in which members for selectively transmitting the two or more different wavelengths are provided.

Also, the photosensitive material may be two or more photosensitive materials having respective sensitivity properties different from each other.

Further, a projection exposure apparatus is so arranged that a photosensitive material has a nonlinear sensitivity property of latent image reaction density against intensity of incident light and exposure is repeated plural times with relative movement by a predetermined amount between the photosensitive material and a photo-mask for each exposure, thereby forming a latent image density distribution of a finer pattern than a pattern on the photo-mask. which has a light source for emitting light beams having two or more different wavelengths as exposure light, in which said photo-mask has selectively transmitting members having different transmittances for said two or more wavelengths, and in which said photo-mask is illuminated with rays emitted from said light source, whereby a latent image density distribution of a fine pattern is formed without relative movement by a predetermined amount between said photosensitive material and said photo-mask for each exposure.

Figure 38:
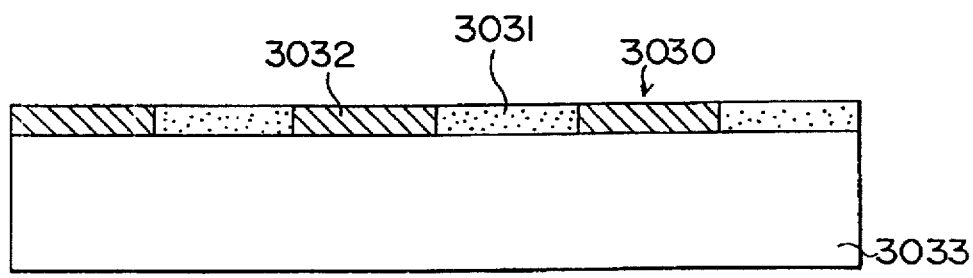
FIG. 38 is a cross-sectional view of schematic construction of a reticle in the first embodiment.
Figure 39:
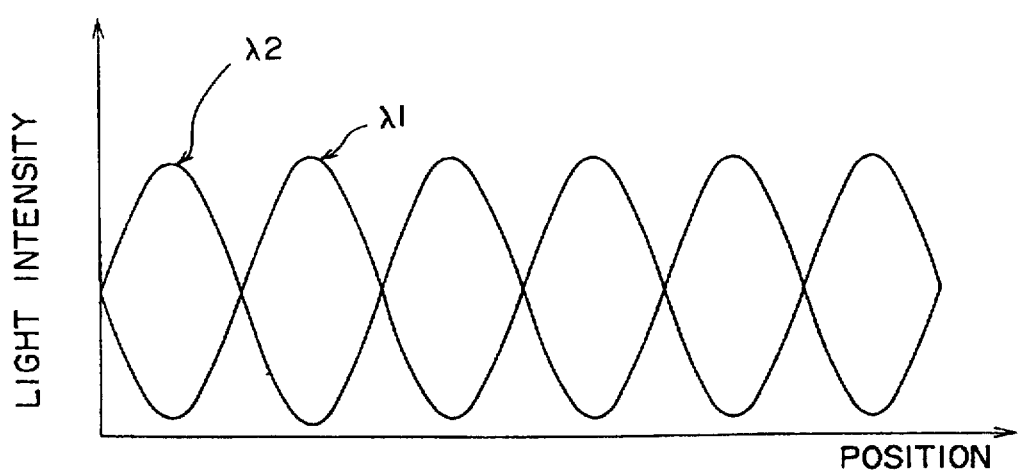
FIG. 39 shows light intensity distributions on an image plane in the first embodiment.

The operation of the present invention will be described based on the first embodiment according to the present invention as shown in FIG. 38 and FIG. 39. Different exposure wavelengths λ1, λ2 are used, and a one-dimensional periodic pattern is used as a photo-mask 3030 as shown in FIG. 38. Further, the periodic pattern is constructed in such a manner that portions 3031 transmitting the exposure wavelength λ1 and non-transmitting the exposure wavelength λ2 and portions 3032 non-transmitting the exposure wavelength λ1 and transmitting the exposure wavelength λ2 are alternately arranged. Using this photo-mask, a light intensity distribution upon projection with exposure wavelength λ1 is inverted 180° relative to a light intensity distribution upon projection with exposure wavelength λ2 on the image plane, as shown in FIG. 39. Namely, the light intensity distributions inverted in bright and dark portions can be formed without necessitating any mechanical shift. Under the above, the resolution limitation in the projecting optical system correspond to the light intensity distribution in each wavelength thereof. In the above method, it is possible to form a line-and-space pattern with superpassing the resolution limitation of the optical system.

A generally effective technique to increase degrees of freedom of the pattern on the photo-mask is addition of portions transmitting the both wavelengths λ1 and λ2 and portions transmitting neither λ1 nor λ2 to the portions transmitting λ1 and non-transmitting λ2 and the portions non-transmitting λ1 and transmitting λ2.

Figure 40:
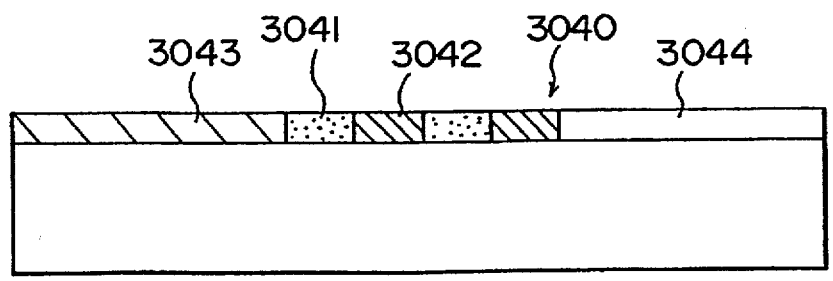
FIG. 40 is a cross-sectional view of schematic construction of a reticle in the second embodiment.

Also, for exposure of complex pattern, it is generally required to form a light intensity distribution completely independent of the wavelengths λ1 and λ2. It can be considered in that case that formation of a pattern with a plurality of portions could be complicated as shown in FIG. 40. The complexity of pattern is rather less for two wavelengths, but it becomes greater and greater for three or more wavelengths. Then, if a synthetic photosensitive material comprising two or more types of photosensitive materials having different sensitivity properties for two wavelengths is used as the photosensitive material, a pattern can be formed more easily.

Employed is a synthetic photosensitive material consisting of two or more types of photosensitive materials having different sensitivity properties, for example, a photosensitive material sensitive to the wavelength λ1 but not sensitive to the other wavelengths and a photosensitive material sensitive to the wavelength λ2 but not sensitive to the other wavelengths. In this case, illumination with wavelength λ1 causes only the λ1 transmitting portions on the photo-mask to transmit the light, which forms a first light intensity distribution. Next illumination with wavelength λ2 causes only the λ2 transmitting portions to transmit the light, independent of transmission or non-transmission of λ1, and the light forms a second light intensity distribution. These first and second light intensity distributions make two components contained in the synthetic photosensitive material exposed independently of each other.

Embodiments

Figure 37:
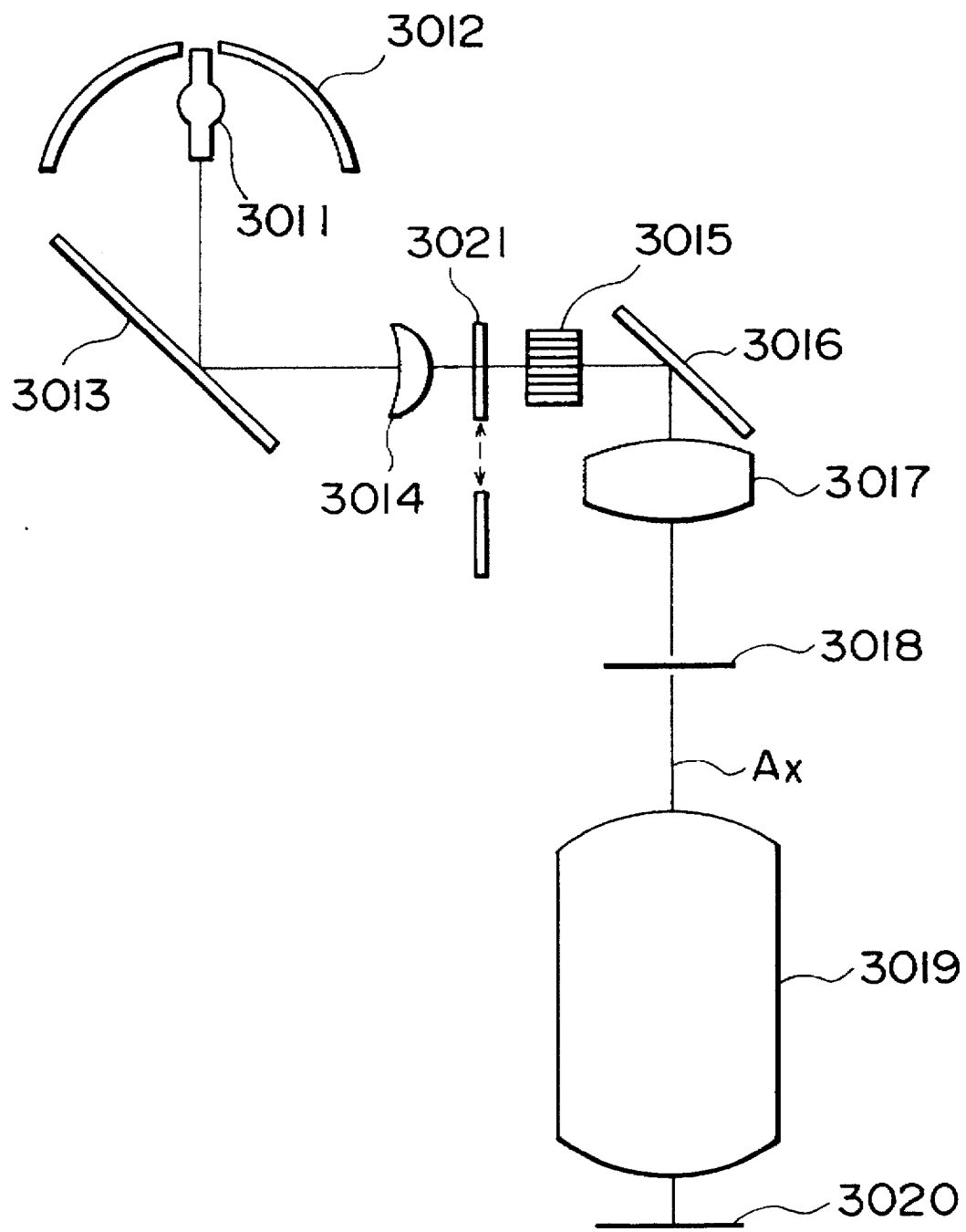
FIG. 37 shows an exposure apparatus in the present invention.

FIG. 37 is a drawing to show schematic entire structure of an exposure apparatus in the present invention. A beam of illumination light from a light source 3011 which can emit beams of two or more different wavelengths is collected by an elliptic mirror 3012 and then guided by a mirror 3013 into a collimator lens 3014, where the beam becomes a bundle of nearly parallel rays. The beam then passes through an interference filter 3021, which is a wavelength selecting means detachably arranged, then to enter a fly's eye integrator 3015. Beams emergent from the fly's eye integrator 3015 are guided by a mirror 3016 into a main condenser 3017 to uniformly illuminate a reticle 3018 as a photo-mask.

A predetermined pattern on the photo-mask 3018 is projected by a projection optical system 3019 onto a wafer 3020 coated with a photosensitive material. Exchanging the interference filter 3021 for another filter having a different wavelength property, as shown by the arrows in the drawing, the wavelength λ1 is selected for first exposure and the wavelength λ2 for second exposure as exposure wavelength. Here, it is of course that the projection optical system 3019 is arranged to have no chromatic aberration for the two wavelengths λ1, λ2.

Although this example is so arranged that the interference filter 3021 is located in the illumination optical system between the collimator lens 3014 and the fly's eye integrator 3015, the interference filter 3021 can be located at any position in the exposure apparatus as long as it does not affect the imaging performance there. Further, it is of course possible that, instead of the interference filter 3021 located in the exposure apparatus, means such as a dichroic mirror or a glass filter having absorption property can be used to select the exposure wavelength λ1 for first exposure and the exposure wavelength λ2 for second exposure.

As described previously, FIG. 38 is a drawing to show a schematic cross section of construction of reticle as the first embodiment, which is an enlarged drawing of reticle 3018 as the photo-mask in FIG. 37. On a reticle substrate 3033 a one-dimensional periodic pattern is formed of an optical thin film constituting an interference filter. As shown in FIG. 38, portions 3031 (hatched portions) having characteristics of transmitting λ1 and non-transmitting λ2 and portions 3032 (dotted portions) having opposite characteristics of non-transmitting λ1 and transmitting λ2 are alternately arranged in the same width. When this reticle pattern is illuminated first with illumination light of wavelength λ1 and then with illumination light of λ2, periodic patterns are formed in light intensity distributions with bright and dark portions inverted between the two wavelengths, as shown in FIG. 39. Under such circumstances, a fine pattern surpassing the resolution limit can be obtained by using a photosensitive material having the non-linear sensitivity property of latent image reaction density against intensity of incident light with the wavelengths λ1, λ2.

The above embodiment showed an example where the reticle as the photo-mask had the one-dimensional periodic pattern. However, normal reticles rarely have such a simple arrangement of one-dimensional periodic pattern, but often have complex patterns.

Figure 41:
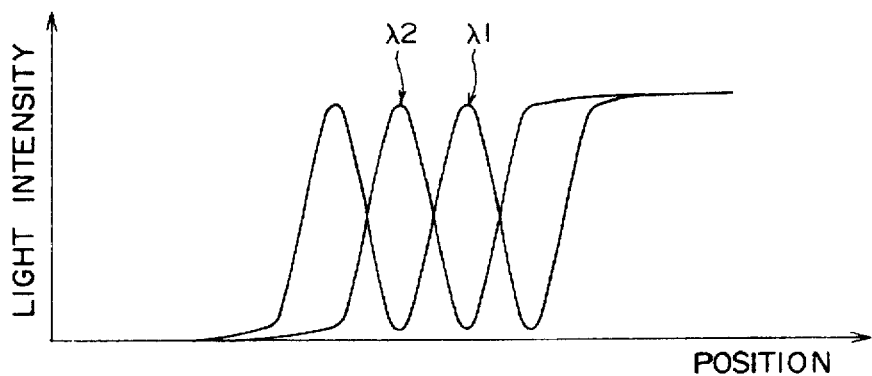
FIG. 41 shows light intensity distributions on an image plane in the second embodiment.

Thus, the second embodiment is given as an example where degrees of freedom of usable patterns are increased by adding portions transmitting both the wavelengths and portions transmitting neither of the two wavelengths on the pattern. FIG. 40 shows a cross section of a reticle employed in the second embodiment. The reticle 3040 has portions 3041 (dotted portions) having characteristics of transmitting λ1 and non-transmitting λ2, and portions 3042 (hatched portions) having opposite characteristics of non-transmitting λ1 and transmitting λ2, which are alternately arranged, and further has additional portions which are a perfectly opaque portion 3043 (black portion) non-transmitting either λ1 or λ2 on the left end side and a perfectly transparent portion 3044 (white portion) transmitting both λ1 and λ2 on the right end side. Patterns of light intensity distributions as shown in FIG. 41 are obtained upon image formation with respective illumination light of wavelengths λ1, λ2 using the reticle.

Under such circumstances, a fine pattern surpassing the resolution limit can be obtained using a photosensitive material having the non-linear sensitivity property of latent image reaction density against intensity of incident light of wavelengths λ1, λ2.

Next described is the third embodiment employing a photoresist which is a synthetic photosensitive material obtained by mixing a photosensitive component 1 sensitive only to the wavelength λ1 with a photosensitive component 2 sensitive only to the wavelength λ2.

Figure 42:
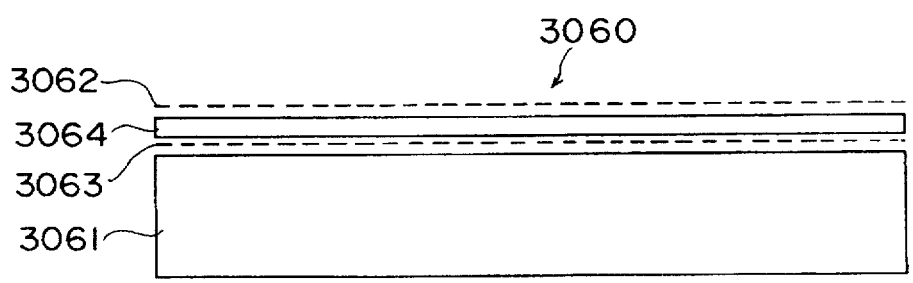
FIG. 42 is a cross-sectional view of schematic construction of a reticle in the third embodiment.

FIG. 42 is a drawing to show a schematic cross section of construction of reticle used in the third embodiment. The reticle 3060 is so arranged that a first pattern is formed of an optical thin film 3062 having characteristics of non-transmitting only the wavelength λ1 and transmitting wavelengths other than the wavelength λ1 on a reticle substrate 3061, that a second pattern is formed of an optical thin film 3063 having characteristics of non-transmitting only the wavelength λ2 and transmitting wavelengths other than the wavelength λ2 on the substrate, and that with superposition of the two patterns the photosensitive component 1 in the photoresist forms only a latent image of the first pattern while the photosensitive component 2 forms only a latent image of the second pattern. Since the photoresist has the nonlinear sensitivity property of latent image reaction density against the intensity of incident light, a fine pattern surpassing the resolution limit can be obtained.

It is clear that this technique can be applied to cases where three or more types of exposure wavelengths are employed. It is preferred that the two reticle patterns 3062 and 3063 shown in FIG. 42 be formed at a suitable clearance with a transparent member 3064 inbetween. The clearance is preferably set as small as possible if the spectral characteristics necessary for the reticle 3060 are satisfied. More preferably, the clearance is within the depth of focus of the projection optical system. Even if it is out of the depth of focus, exposure is possible with slight correction of the focus position. This case also keeps the features of the present invention.

Further described in the following is the fourth embodiment using two different monochromatic light sources and a photoresist which is a synthetic photosensitive material obtained by mixing two photosensitive components different in wavelength sensitivity property with each other. Here, let λ1, λ2, λ3, λ4, λ5, and λ6 be wavelengths increasing in the named order and different from each other.

The light sources employed in the present embodiment are a laser L1 emitting monochromatic light of wavelength λ2 and a laser L2 emitting monochromatic light of wavelength λ5, which are arranged to emit rays of mixture of these chromatic light beams onto a reticle.

The reticle consists of a one-dimensional periodic pattern in which portions having characteristics of transmitting only wavelengths near the wavelength λ2 and non-transmitting the wavelengths other than the wavelength λ2 and portions having characteristics of transmitting the wavelengths near the wavelength λ5 and non-transmitting wavelengths other than the wavelength λ5 are alternately formed in a same width on a reticle substrate.

Figure 43:
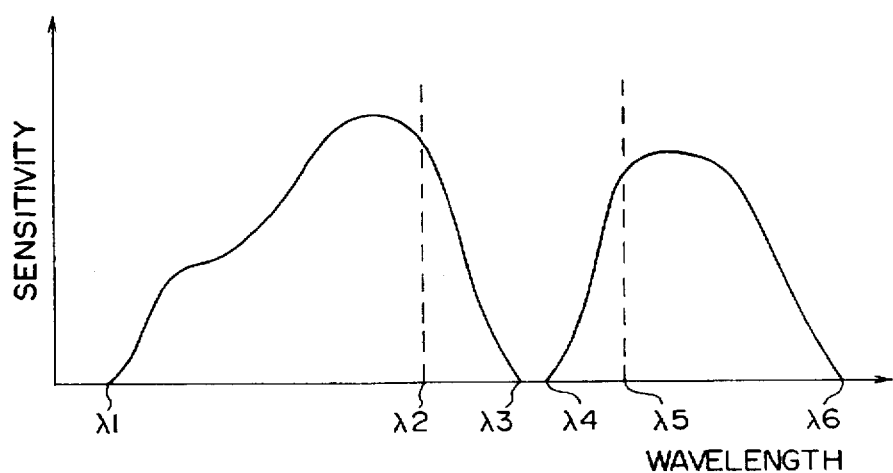
FIG. 43 is a drawing to show wavelength characteristics of a photosensitive material in the fourth embodiment.

A photoresist employed herein is a synthetic photosensitive material consisting of a photosensitive component 1 having a sensitivity to the range of from wavelength λ1 to λ3 and a photosensitive component 2 having a sensitivity to the range of from wavelength λ4 to λ6, formed on the substrate as shown in FIG. 43.

Upon full exposure using the photoresist and the two monochromatic light sources, the photosensitive component 1 is sensitive to the wavelength λ2 but not sensitive to the wavelength λ5, and, therefore, it is irrespective of a light intensity distribution formed by the wavelength λ5. Thus, a latent image is an image of a light intensity distribution formed by the wavelength λ2. Conversely, the photosensitive component 2 is sensitive to the wavelength λ5 but not sensitive to the wavelength λ2, and, therefore, it is irrespective of a light intensity distribution formed by the wavelength λ2. Thus, a latent image is an image of a light intensity distribution formed by the wavelength λ5. Since the photoresist has the nonlinear sensitivity property of the latent image reaction density against the intensity of incident light, a fine pattern surpassing the resolution limit can be obtained.

Although the full exposure was carried out at the same time using the different wavelengths in the fourth embodiment, it is of course possible that exposure can be made for each wavelength in a non-simultaneous manner. As well as the photoresist with photosensitive component 1 and photosensitive component 2 having the wavelength sensitivity characteristics in which the wavelengths increase in the above order of λ1, λ2, λ3, λ4, λ5, and λ6, the same results as the fourth embodiment can be obtained using a photoresist where λ4 (the short wavelength edge of the photosensitive component 2)<λ3 (the long wavelength edge of the photosensitive component 1), if λ4 (the short wavelength edge of photosensitive component 2)>λ2 (the exposure wavelength from laser L1) and if λ5 (the exposure wavelength from laser L2)>λ3 (the long wavelength edge of photosensitive component 1).

According to the present invention, two or more independent images can be thus formed on a photosensitive material without necessity of performing either of horizontal shift of reticle or wafer and exchange of reticles which require accurate positioning, thus considerably decreasing necessity of exchange of photo-masks.

Next, an exposure method or apparatus using polarizing plate or film will be described.

According to the method or apparatus using polarizing plate or film, where exposure is made using the photosensitive material having the nonlinear sensitivity property that the latent image reaction density is so formed as to be emphasized in accordance with the m-th power (m>1) of the intensity of incident light and using the linearly polarized light parallel on the image plane with the longitudinal direction of the pattern formed on the image plane, a pattern can be formed with resolution surpassing the resolution limit of the projection optical system, the reason of which will be described in the following.

First described is the effect due to the nonlinear sensitivity property.

In the conventional exposure methods, a light intensity distribution I(x) on the image plane after passage through the total system under incoherent illumination is given by the below equation, where $I_0(x)$ is a light intensity distribution of object and F(x) is a point spread function of the optical system.

(Eq 4-7)

$$I(x)=I_0(x)*F(x)$$

Here, x is a coordinate of position on the photosensitive material and * means the convolution. Then, a spectrum i of light intensity on the image plane is given by the following equation from the convolution theorem of Fourier transformation.

(Eq 4-8)

$$i(\nu)=i_0(\nu);f(\nu)$$

Here, ν is a spatial frequency, $i_0$ a spectrum of light intensity of object, and f corresponds to a so-called OTF of the optical system. Thus, the spectrum of latent image density cannot be formed over the cutoff frequency ($2NA/\lambda$) of optical system.

Also, there are suggestions to use a so-called two-photon absorption photoresist as a photosensitive material having the nonlinear sensitivity property in the conventional exposure methods. The two-photon absorption photoresist is a photoresist which forms a latent image nucleus when absorbing two photons. This is described, for example, in Proceedings of SPIE, vol. 1674, pp 776–778, 1992. In this case, the latent image density distribution $J(x)$ is formed according to the square of the exposure intensity distribution $I(x)$. Namely, the latent image density distribution is given by the following equation under incoherent illumination, where $I_0(x)$ is the light intensity distribution of object and $F(x)$ is the point spread function of optical system.
(Eq 4-9)

$$J(x)=I(x)^2=\{I_0(x)*F(x)\}^2$$

Then, a spectrum $j$ of latent image density distribution is given by the following equation from the convolution theorem of Fourier transformation, similarly.
(Eq 4-10)

$$j(v)=\{i_0(v)\cdot f(v)\}*\{i_0(v)\cdot f(v)\}$$

Since the latent image density distribution is given by Equation (4-9) for the two-photon absorption photoresist, the latent image density distribution is sharper than those for conventional photoresists. This will be specifically described with examples shown in FIG. 52A and FIG. 52B for sinusoidal exposure intensity distribution.

Figure 52A:
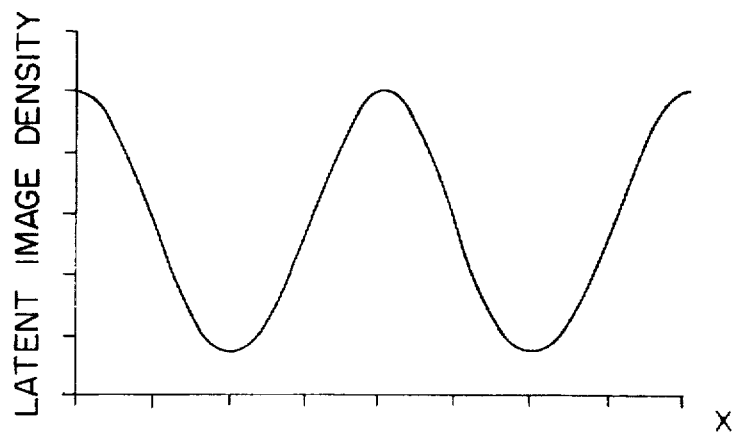
FIG. 52A and 52B include drawings to show latent image density distributions formed by the conventional exposure method.
Figure 52B:
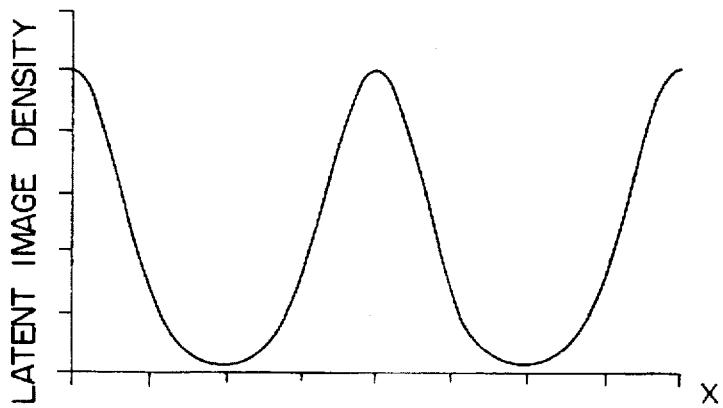

FIG. 52A shows a latent image density distribution in a normal photoresist, which is sinusoidal similarly as the exposure intensity distribution is. FIG. 52B shows a latent image density distribution in a two-photon absorption photoresist. Comparing FIG. 52A with FIG. 52B, the contrast of latent image in FIG. 52B is higher than that in FIG. 52A, but the pitch of the formed pattern in FIG. 52B is equal to that in FIG. 52A. Thus, simple use only of the two-photon absorption photoresist cannot make the pitch of the latent image density distribution formed finer than the pitch of an image formed by the optical system, thus never permitting the resolution to surpass the resolution limit of the optical system. Although in the latent image density distribution there are components with frequencies surpassing the resolution limit of optical system from Equation (4-10), the pitch of the formed pattern is still kept not surpassing the resolution limit of the optical system.

Accordingly, it is impossible to form a finer pattern than the resolution limit determined by the optical system, simply by using the photosensitive material having the nonlinear sensitivity property. However, the present invention permits a finer pattern surpassing the resolution limit of the optical system to be formed by using the photosensitive material having the nonlinear sensitivity property and further performing a plurality of separate exposure processes.

In order to describe the most basic concept of the present invention, here is considered formation of point image by the optical system in the use of a two-photon absorption photoresist with m=2, similarly as above. In this case, the two-photon absorption photoresist makes the latent image density distribution of point image sharper. It is sufficient for this case taking the point spread distribution $F(x)$ by the optical system into consideration irrespective of the illumination state. Then, supposing a desired object intensity distribution $I_0(x)$ is formed by superposition of point images and a latent image density distribution $J(x)$ is formed thereby, the density distribution can basically be expressed by the following equation, because it is superposition of light intensities given by image formation of respective point images.
(Eq 4-11)

$$J(x)=I_0(x)*\{F(x)\}^2$$

Since the latent image density distribution of point image involves $\{F(x)\}^2$, it is sharper than the point spread distribution $F(x)$ by the optical system, thus realizing high resolution. By Fourier transformation of Equation (4-11), the following equation is obtained.
(Eq 4-12)

$$j(v)=i_0(v)\cdot\{f(v)*f(v)\}$$

Then, $f*f$ can be interpreted as OTF of the optical system to obtain the latent image density distribution by this method. This means that the cutoff frequency ($4NA/\lambda$) can be achieved against the cutoff frequency ($2NA/\lambda$) of the conventional OTF or $f$ as expressed by Equation (4-8), thus doubling the resolution.

Figure 53A:
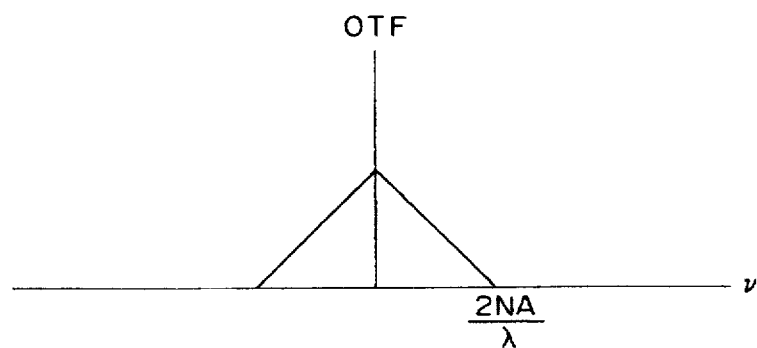
FIG. 53A and 53B include characteristic drawings of OTF.
Figure 53B:
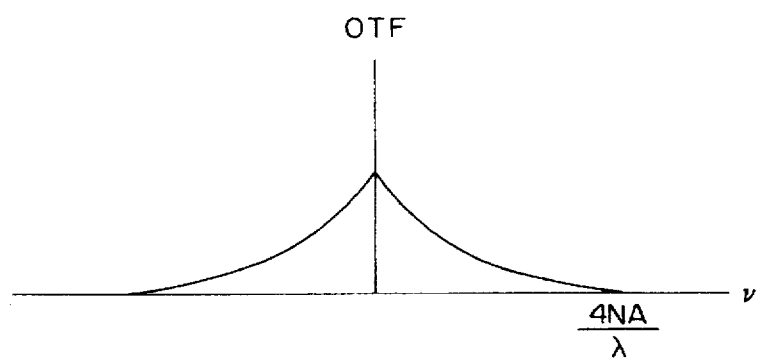

FIG. 53A and FIG. 53B diagrammatically show this comparison. FIG. 53A indicates the OTF in the conventional method, while FIG. 53B the OTF for the case where a two-photon absorption photoresist is exposed to isolated patterns. Therefore, a fine pattern can be formed with resolution over the resolution limit of the optical system when a latent image is formed using the two-photon absorption photoresist and performing a plurality of exposure processes based on isolated patterns. Accordingly, formation of a pattern with resolution over the resolution limit of the optical system becomes possible by the combination of the photosensitive material having the nonlinear sensitivity property with the plural exposure processes by isolated patterns.

Further, a pattern with resolution over the resolution limit of the optical system can also be formed, similarly as in the case of the isolated patterns, where a plurality of exposure processes are carried out using patterns which are not perfectly isolated but can be considered as nearly isolated. In this case, a spectrum $j$ of latent image density distribution is defined by the following equation.

$$j(v) = \Sigma i_{0j}(v)\cdot\{f(v)*f(v)\}$$ (Eq 4-13)
$$= i'(v)\cdot\{f(v)*f(v)\}$$
$$i'(v) = \Sigma i_{0j}(v)$$

In the above equation, $i_{0j}$ represents object spectra of mutually nearly isolated patterns, and $i'$ is considered as an object spectrum of an imaginary pattern constructed by superposition of the nearly isolated patterns. No spectra of conventional latent image density distributions can surpass the cutoff frequency ($2NA/\lambda$) of $f$, as shown by Equation (4-8), while the present invention permits a spectrum up to the cutoff frequency ($4NA/\lambda$) of $\{f(v)*f(v)\}$ to be formed as a latent image density distribution, as indicated by Equation (4-13).

As described above, the pitch of formed pattern never surpasses the resolution limit of the optical system by the single use of the photosensitive material having the nonlinear sensitivity property in the conventional exposure method, while in the present invention a latent image density distribution of pattern with a pitch surpassing the resolution limit of the optical system can be formed by performing a plurality of exposure processes different in light intensity distribution on such a photosensitive material so as to provide appropriate $i'$.

Although the above description is given with the so-called two-photon absorption photoresist in which the latent image density J is in proportion to the square of the exposure intensity I, that is, in which the latent image reaction density ξ is formed according to the square of the exposure intensity I, the present invention is by no means limited to it. The present invention may employ any photosensitive materials having the nonlinear sensitivity property as long as the latent image reaction density ξ is formed according to the m-th power (m>1) of the exposure intensity I. In this cased the latent image density distribution is expressed by the m-th power of the light intensity distribution F(x) of point image, so that it is a sharper distribution than the light intensity distribution F(x) of point image and the above equation (4-11) can be rewritten as follows.
(Eq 4-14)

$$J(x) = I_0(x) * \{F(x)\}^m$$

Further, the illumination state is not limited to the incoherent illumination, but may be any of the oblique illumination and various modified illumination methods, similarly forming a very fine pattern. Of course, a self-emitting object can be used.

With the Fourier transformation of Equation (4-14), it is seen from the convolution theorem of the Fourier transformation that a pattern (latent image density distribution) can be formed up to a frequency of m times the cutoff frequency of the optical system. There is a possibility of forming a further finer pattern by a plurality of exposure processes with patterns which are not completely isolated from each other in each exposure.

Although the above description concerned the cases where the power m was greater than 1 (m>1) in the above Equation (4-14), that is, where the latent image density J was emphasized more than the light intensity I, simulation results verified that a fine pattern with resolution over the resolution limit of the projection optical system could substantially be formed where the power m was smaller than 1 (m<1). Such a sensitivity property is also effective that the power m in Equation (4-14) is not constant but changes depending upon the light intensity I.

The latent image density distribution surpassing the resolution limit of optical system can be formed with further higher contrast and by a smaller number of exposure processes, if a pattern is formed with high resolution and with high contrast using the phase shift mask or using the modified illumination method in each of the plurality of exposure processes.

Figure 57A:
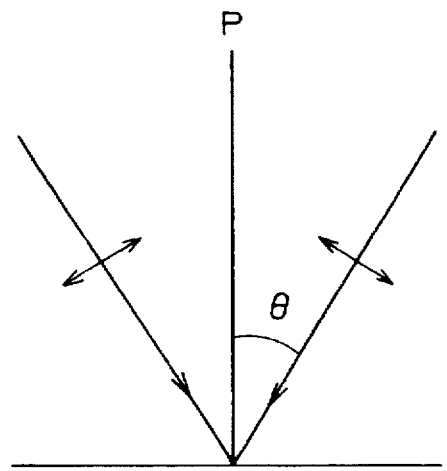
FIG. 57A and FIG. 57B include drawings to show double beam interference.
Figure 57B:
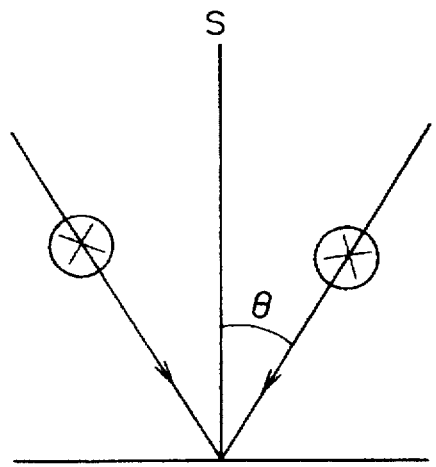
Figure 58A:
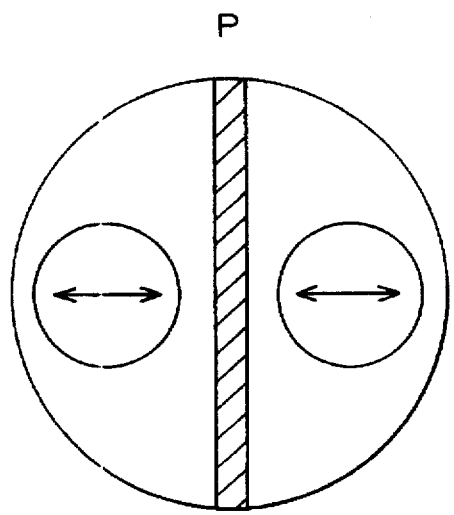
FIG. 58A and FIG. 58B include drawings to show double beam interference.
Figure 58B:
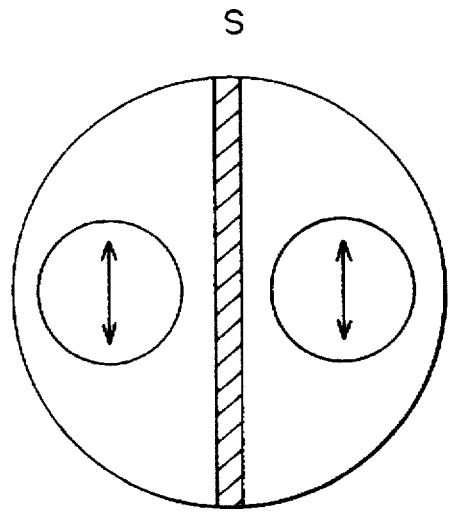
Figure 59A:
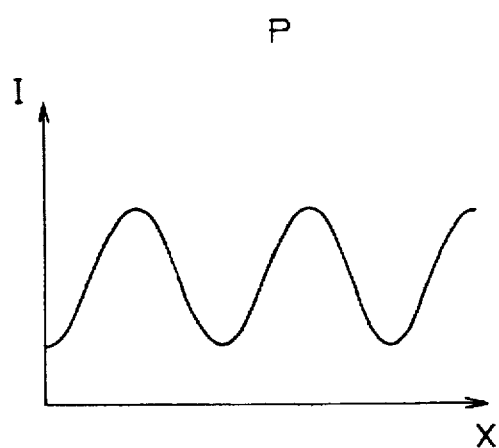
FIG. 59A and FIG. 59B include drawings to show intensity distributions by the double beam interference.
Figure 59B:
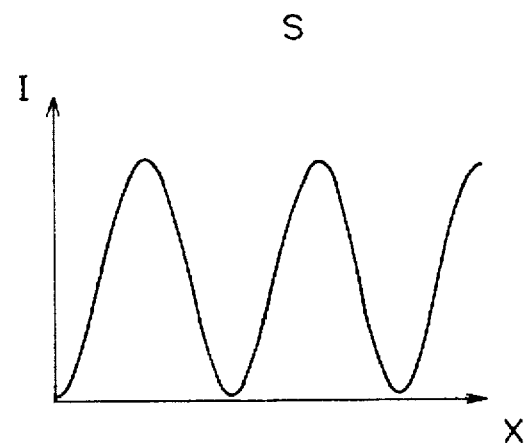

In addition to the above arrangement, the present invention further employs the linearly polarized light with the direction of polarization arranged as parallel on the image plane with the longitudinal direction of a pattern formed on the image plane. FIG. 57 to FIG. 59 show an example in which an image intensity is formed by double beam interference. FIG. 57 is a drawing to show states of rays on a plane perpendicular to the longitudinal direction of the pattern and including the optical axis. FIG. 58 is a drawing to show a plane with its normal line on the optical axis, which is a top plan view of the states of FIG. 57 and which includes a linear pattern formed as the hatched portion at the center on the image plane. In FIG. 57 and FIG. 58 double-sided arrows represent directions of polarization of rays (directions of vibration of the electric field), which are in-plane directions. In FIG. 57 each symbol indicated by a cross in a circle also represents a direction of polarization of rays (direction of vibration of the electric field), which indicates that the electric field vibrates in the direction normal to the plane of the drawing.

FIG. 59 shows image intensity distributions for a case where the direction of polarization is perpendicular on the image plane to the longitudinal direction of the pattern formed on the image plane (hereinafter referred to as p-polarization in this specification for convenience' sake) and for a case where the direction of polarization is parallel on the image plane with the longitudinal direction of the pattern formed on the image plane (hereinafter referred to as s-polarization in the specification for convenience sake), from which it is seen that the s-polarization has a greater difference between the maximum and the minimum of light intensity I than the p-polarization has. Thus, the s-polarization has higher contrast than the p-polarization.

With mathematical expression, the light intensity I for the p-polarization is given by the following equation.

$$\begin{aligned}I_p &= |\sin\theta\ [\exp((i2\pi \cdot x \cdot \sin\theta)/\lambda) - \\ &\quad \exp((-i2\pi \cdot x \cdot \sin\theta)/\lambda)]|^2 + \\ &\quad |\cos\theta\ [\exp((i2\pi \cdot x \cdot \sin)/\lambda) + \\ &\quad \exp((-i2\pi \cdot x \cdot \sin\theta)/\lambda)]|^2 \\ &= 2\cdot\sin^2\theta \cdot [1 - \cos((4\pi \cdot x \cdot \sin\theta)/\lambda)] + \\ &\quad 2\cdot\cos^2\theta \cdot [1 + \cos((4\pi \cdot x \cdot \sin\theta)/\lambda)] \\ &= 2[1 + \cos2\theta\cos((4\pi \cdot x \cdot \sin\theta)/\lambda)]\end{aligned}$$ (Eq 4-15)

For the s-polarization, $$\begin{aligned}I_s &= |[\exp((i2\pi \cdot x \cdot \sin\theta)/\lambda) + \\ &\quad \exp((-i2\pi \cdot x \cdot \sin\theta)/\lambda)]|^2 \\ &= 2[1 + \cos((4\pi \cdot x \cdot \sin\theta)/\lambda]\end{aligned}$$ (Eq 4-16)

Here, θ is an angle of the rays incident onto the image plane with the optical axis in FIG. 57.

As described above; from Equation (4-15) and Equation (4-16), the light intensity of p-polarization decreases by the rate of cos2θ (0°≦θ≦90°) while the s-polarization has no such factor of decrease, thus indicating that the s-polarization can produce higher contrast. Therefore, a beam is preferably of s-polarized light in each exposure.

Use of s-polarization is also effective for general exposure as well as the double beam interference.

As described above, using the photosensitive material having the nonlinear sensitivity property of latent image density, in other words, latent image reaction density, against intensity of incident light, using the s-polarized light with the direction of polarization arranged as parallel on the image plane with the longitudinal direction of the pattern formed on the image plane, and performing a plurality of exposure processes different in light intensity distribution on the photosensitive material, semiconductor devices can be obtained with a pattern having high resolution surpassing the resolution limit of projection optical system and high contrast.

The present invention will be described below based on embodiments thereof.

Figures 44A, 44B:
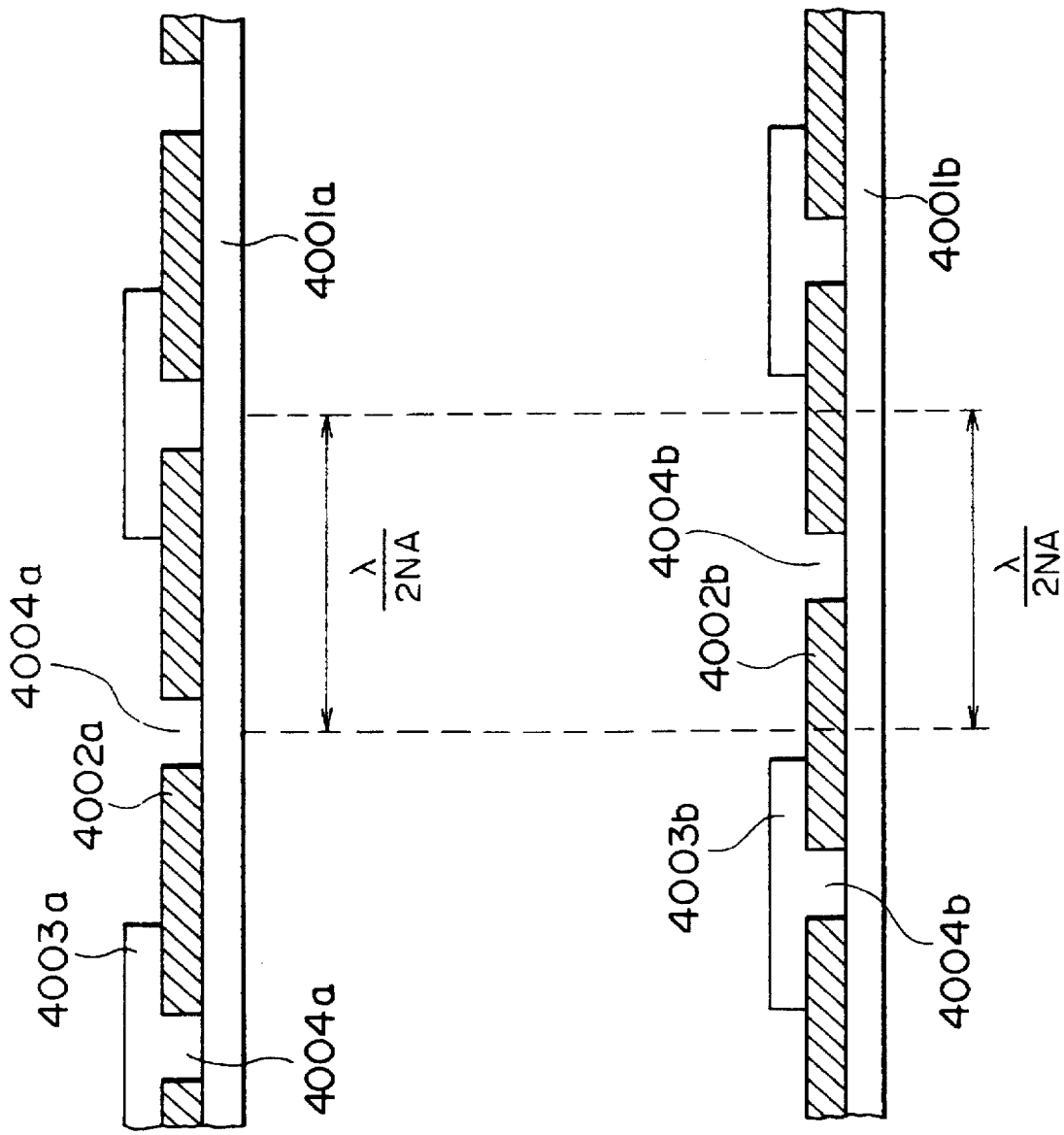
FIG. 44A and 44B includes cross-sectional views to show patterns on a first photo-mask and on a second photo-mask used in the present invention.

FIG. 44A and FIG. 44B show cross-sectional views of reticle patterns as photo-masks according to the present invention. Here the direction perpendicular to the plane of the drawing is the longitudinal direction of the pattern formed on the image plane. First exposure is made with a pattern shown in FIG. 44A of pattern and thereafter second exposure with a pattern of FIG. 44B. In the first pattern of FIG. 44A, an opaque film 4002a provided on a substrate 4001a forms open portions 4004a. A phase film 4003a is provided over either one of two mutually adjacent open portions 4004a, thus constituting a so-called phase shift mask. In the second pattern of FIG. 44B, an opaque film 4002b and a phase film 4003b are similarly provided on a substrate 4001b, thus also constituting a phase shift mask. The open portions 4004a in the first pattern are arranged to overlap with positions of the opaque film 4002b in the second pattern while the open portions 4004b in the second pattern are arranged to overlap with positions of the opaque film 4002a in the first pattern. Exposure processes of the two patterns are carried out separately from each other on a photosensitive material.

Figure 45A:
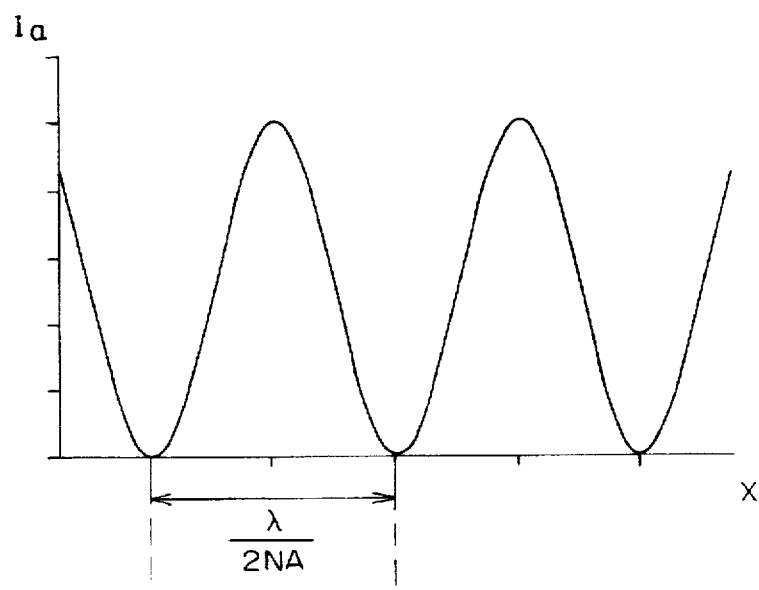
FIG. 45A and 45B include drawings to show light intensity distributions by the patterns shown in FIG. 44A and 44B.
Figure 45B:
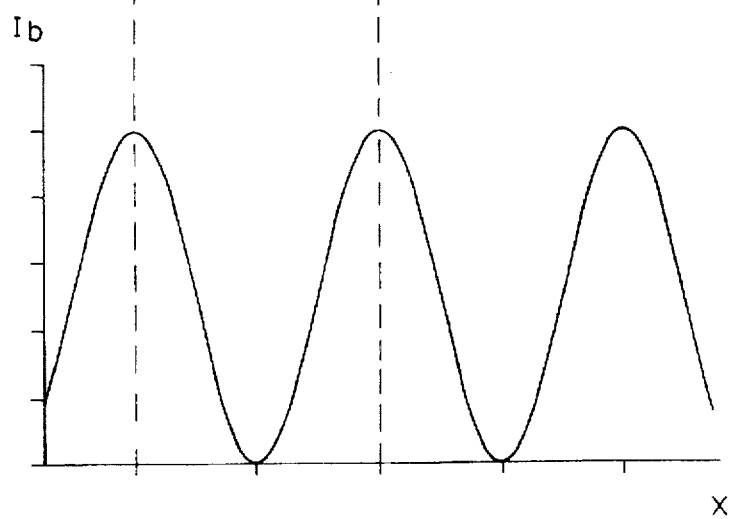
Figure 51:
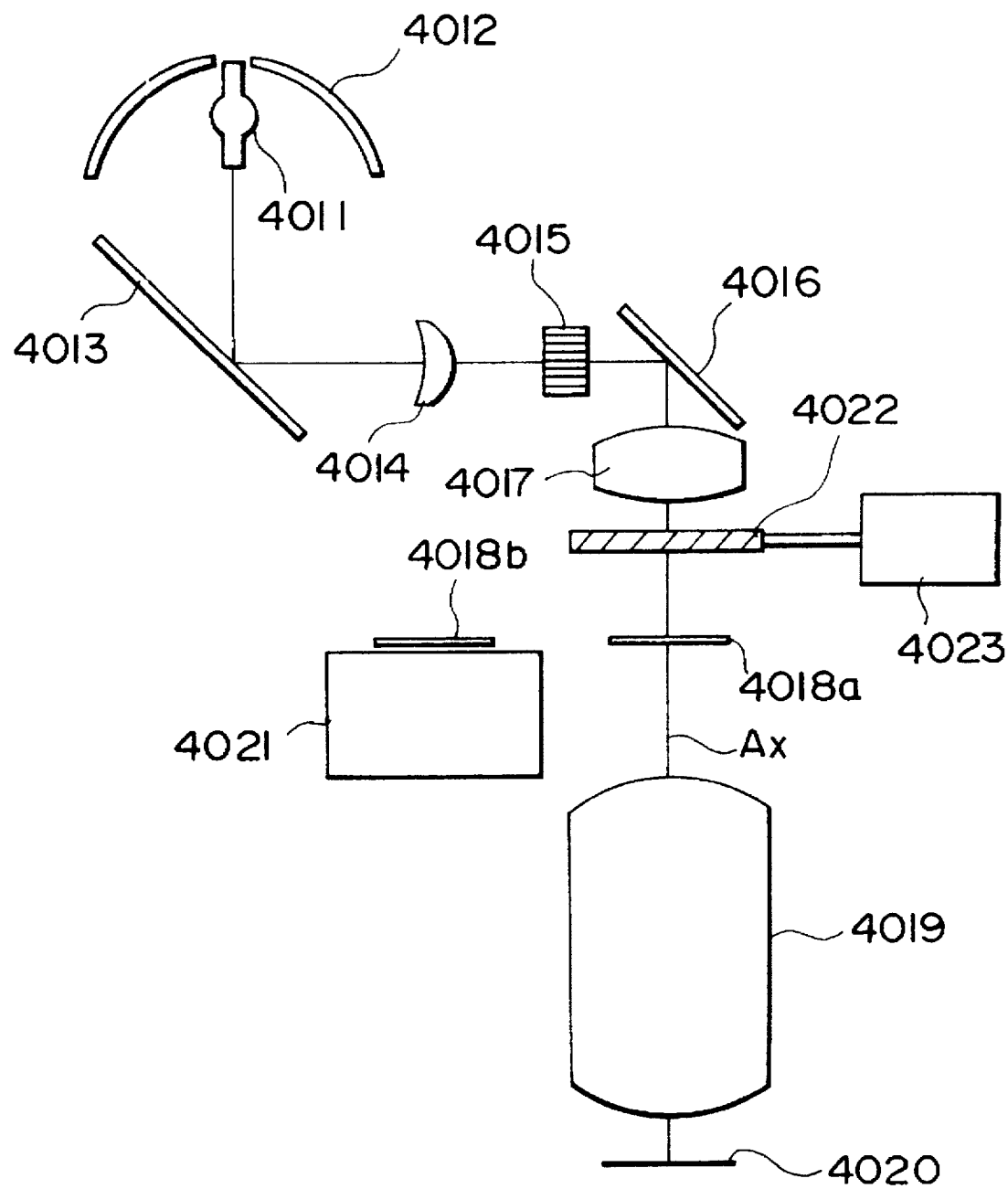
FIG. 51 is a drawing to show schematic structure of an exposure apparatus suitable for the present invention.

In order to control the direction of polarization, a polarizing plate 4022 is set between an illumination optical system for illuminating a reticle, and the reticle in an apparatus shown in FIG. 51, thus obtaining linearly polarized light in the direction normal to the plane of the drawing. The apparatus shown in FIG. 51 will be detailed later. FIG. 45A and FIG. 45B show light quantity distributions on the photosensitive material, obtained by the exposure processes with the first and second patterns. In the present embodiment, each exposure produces a sinusoidal light intensity Ia or Ib, as shown in FIG. 45A or FIG. 45B, by only±first-order diffracted light under coherent illumination. In the two exposure processes, positions of peaks in the light intensity distributions are shifted to each other by a half cycle in phase on the photosensitive material.

Now, considering cases of high resolution, let us suppose that a light intensity distribution having the frequency equal to the resolution limit of optical system is produced in each exposure. Namely, the numerical aperture is fully effectively used so that the±first-order diffracted light passes the periphery of the aperture of optical system, and then the produced pitch in each exposure is the resolution limit $\lambda/2NA$, providing light intensity distributions expressed by the following equations.

(Eq 4-17)

$$Ia(x)=1+\cos(2\pi \cdot 2NA \cdot x/\lambda)$$

(Eq 4-18)

$$Ib(x)=1+\cos(2\pi \cdot 2NA \cdot x/\lambda+\pi)$$

Figure 46A:
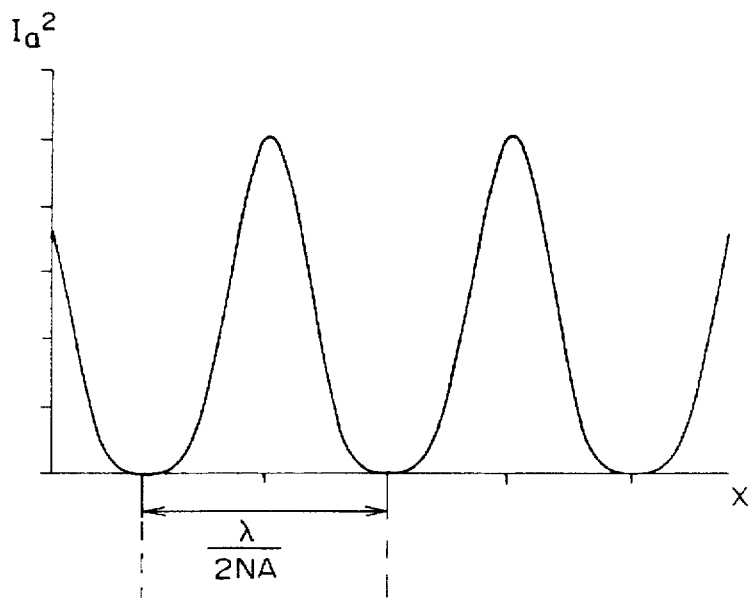
FIG. 46A and 46B include drawings to show latent image density distributions by the patterns shown in FIG. 44A and 44B.
Figure 46B:
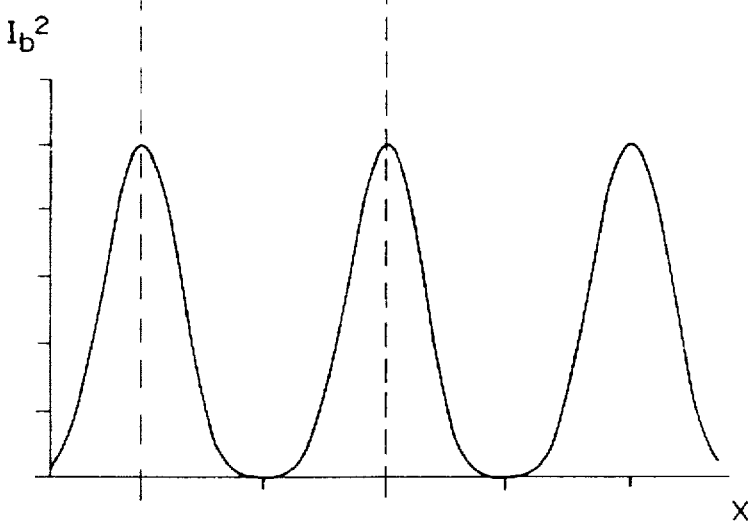

Since the latent image density in the photoresist is given by the square of the light intensity if the photoresist is a two-photon absorption photoresist, respective latent image density distributions are given by the following equations, which are shown in FIG. 46A and FIG. 46B.

(Eq 4-19)

$$Ja(x)=Ia(x)^2=3/2+2\cos(2\pi \cdot 2NA \cdot x/\lambda)+\cos(4\pi \cdot 2NA \cdot x/\lambda)/2$$

(Eq 4-20)

$$Jb(x)=Ib(x)^2=3/2+2\cos(2\pi \cdot 2NA \cdot x/\lambda+\pi)+\cos((4\pi \cdot 2NA \cdot x/\lambda)/2$$

A finally obtainable latent image density distribution after a plurality of exposure processes is a sum of Equations (4-19) and (4-20), as given by the following equation.

(Eq 4-21)

$$J(x)=Ja(x)+Jb(x)=3+\cos(4\pi \cdot 2NA \cdot x/\lambda)$$

Figure 47:
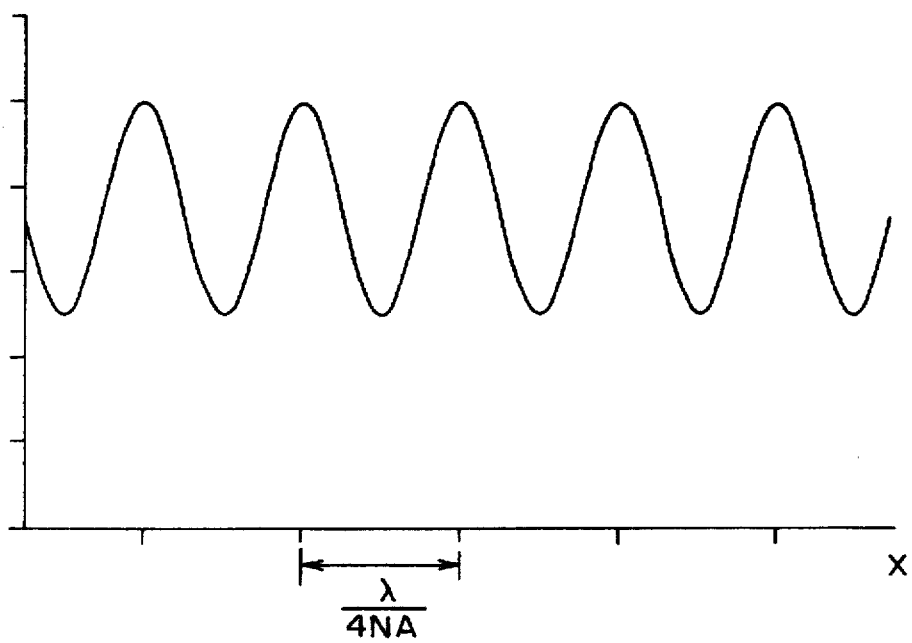
FIG. 47 is a drawing to show a synthetic latent image density distribution in the embodiment of the present invention.

As seen from Equation (4-21), the latent image density distribution J(x) in the present embodiment has a periodic arrangement of pitch ($\lambda/4NA$), which is two times finer than the limit resolution ($\lambda/2NA$) of optical system. This latent image density distribution J(x) is shown in FIG. 47. A fine photoresist pattern is formed by development after completion of the plurality of (two in this embodiment) exposure processes.

As apparent from Equation (4-12) and FIG. 53B, if a latent image is formed by superposition of perfectly isolated patterns (point objects), the latent image can be formed at the pitch ($\lambda/4NA$). However, the contrast is not so high in this case. Thus, the above embodiment employs the coherent illumination using the phase shift masks, whereby the latent image density distribution is formed with high contrast.

If the photoresist is a conventional or linear photosensitive material, it is exposed in a simple sum of the above equations (4-17) and (4-18), i.e., in a simple sum of FIG. 45A and FIG. 45B, thus forming no pattern at all.

In the present embodiment the linearly polarized light is obtained by setting the polarizing plate between the illumination optical system for illuminating the reticle, and the reticle. Because of this arrangement, if a new reticle pattern has a pattern as obtained by rotating the original reticle pattern by 90° on the plane of pattern and if the polarizing means is kept unchanged as it is, the new reticle pattern is illuminated with p-polarized light. As described previously, the contrast with p-polarized light is lower than that with s-polarized light, and therefore some means is necessary for the new reticle pattern to be illuminated with s-polarized light. To realize it, the apparatus shown in FIG. 51 and detailed later is so arranged in the present embodiment that where the new reticle pattern has a pattern obtained by rotating the original reticle pattern 90° on the plane of pattern, the polarizing plate 4022 is rotated 90° about the optical axis Ax by a drive unit 4023, thus solving the problem. Although the description concerned the example of rotation of 90°, it is of course that the arrangement allows rotation of arbitrary angle.

Figure 48:
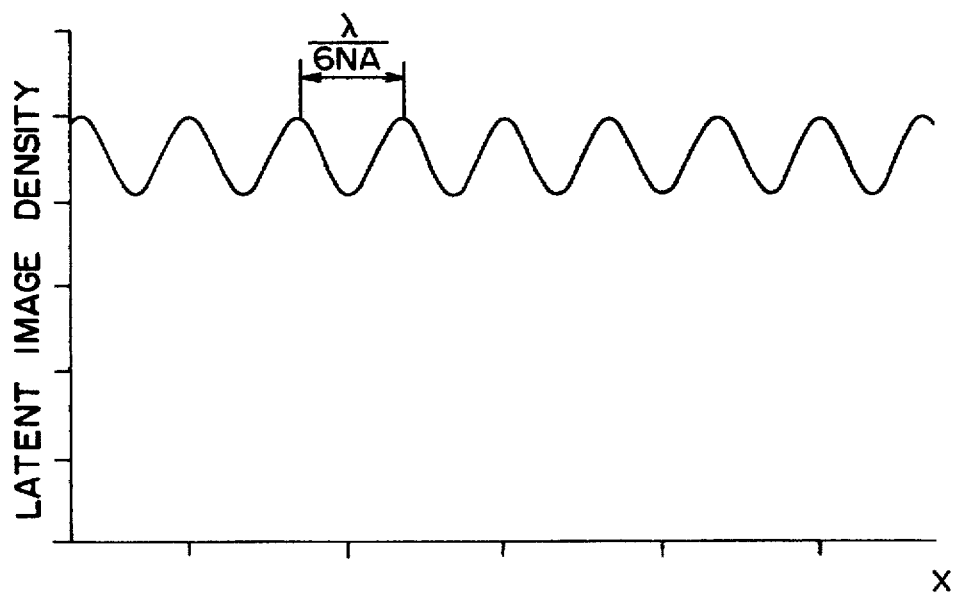
FIG. 48 is a drawing to show a synthetic latent image density distribution by three exposure processes.

The above embodiment showed a case in which the two-photon absorption photoresist was used to obtain the latent image density according to the square (m=2) of the light intensity, but much higher resolution can be expected if the latent image density is obtained in nonlinearity of the third power, the fourth power, or the higher power (m=3, 4, ...) of the light intensity. For example, a latent image density distribution shown in FIG. 48 shows an example in which the latent image density distribution is obtained according to the cube (m=3) of the light intensity distribution, which was obtained by performing three exposure processes while shifting the pattern on the photo-mask shown in FIG. 44A by one third pitch each, i.e., by ($\lambda/6NA$) each in this example, a periodic arrangement of pitch ($\lambda/6NA$) is obtained as shown, which is three times finer than the resolution limit ($\lambda/2NA$) of optical system.

Figure 49:
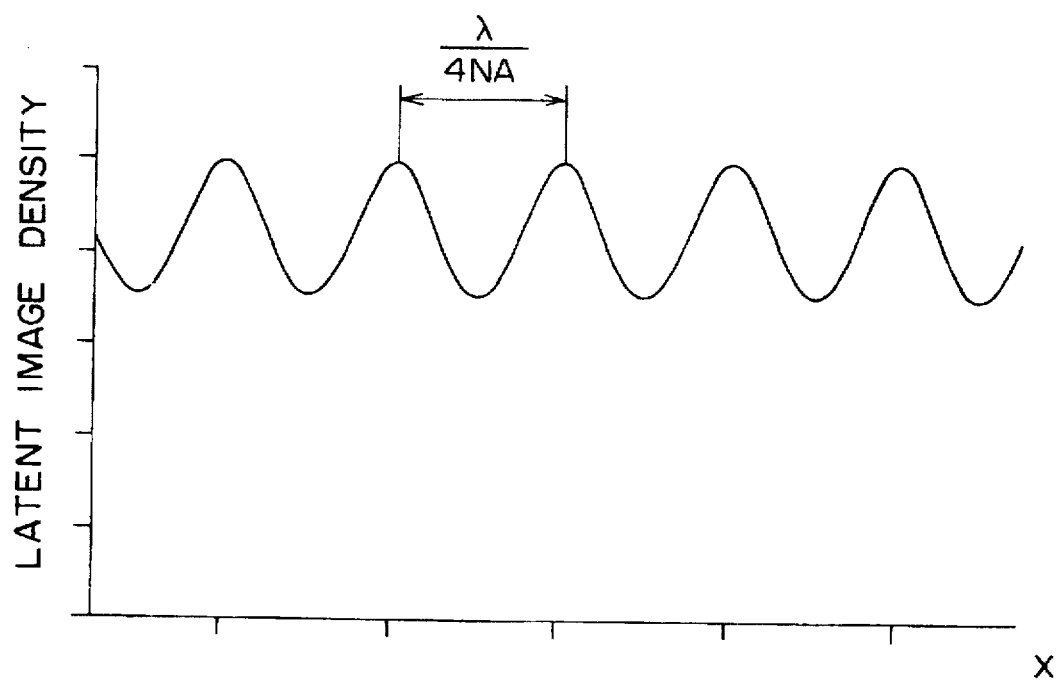
FIG. 49 is a drawing to show a synthetic latent image density distribution in another embodiment.

Also,the present invention allows use of photosensitive materials in which the latent image density is obtained according to the power 1.5 (m=1.5) of the light intensity. FIG. 49 shows a latent image density distribution obtained by separate exposure processes for the respective reticles shown in FIG. 44A and FIG. 44B in the case of m=1.5, indicating that the latent image density distribution is obtained two times finer than the resolution limit of the optical system. The contrast in this case can also be enhanced by coherent illumination on the phase shift masks.

It is general that the resist pattern after development is formed approximately in proportion with the latent image reaction density. However, further emphasizing the contrast in the development process, a resist pattern can be formed with much higher contrast.

Next, FIG. 50A and FIG. 50B show an embodiment in which a polarizing film is directly set on a photo-mask, saving trouble to rotate the polarizing plate depending upon the pattern on the reticle.

FIG. 50A and FIG. 50B show cross-sectional views of reticle patterns as photo-masks according to a present invention. First exposure is made with the pattern shown in FIG. 50A and thereafter second exposure with a pattern of FIG. 50B. In the first pattern of FIG. 50A, an opaque film 4002a provided on a substrate 4001a forms open portions 4004a. Then, a phase film 4003a is provided over either one of two mutually adjacent open portions 4004a, thus constituting a so-called phase shift mask. Further, a polarization film 4005a is provided over the entire surface in the above arrangement so that the direction of polarization is parallel with the longitudinal direction of pattern (the direction normal to the plane of FIG. 50A and FIG. 50B). In the second pattern of FIG. 50B an opaque film 4002b and a phase film 4003b are similarly provided on a substrate 4001b, also constituting a phase shift mask. Also, similarly as the first pattern, a polarization film 4005b is provided over the entire surface in the arrangement so that the direction of polarization is parallel with the longitudinal direction of pattern. Separate exposure processes are effected on a photosensitive material in such an arrangement that the open portions 4004a in the first pattern are located to overlap with positions of the opaque film 1b in the second pattern or that the open portions 4004b in the second pattern are located to overlap with positions of the opaque film 1a in the first pattern.

Using the above reticle patterns, a fine latent image can be formed over the limit resolution of projection optical system and with high contrast. Although the above embodiment was so arranged that the polarization films were provided on the open portion side of substrates 4001a and 4001b, the polarization films can be provided on the opposite lower side (where no open portion is provided) of substrates 4001a and 4001b.

Further described is an embodiment where the power m is smaller than 1 (m<1). Described is an example where a photosensitive material with m=0.5 is used. Using the photosensitive material with m=0.5, the latent image density is formed according to the power 0.5 of the light intensity. Namely, it is given by the following equation.
(Eq 4-22)

$$J(x) = I(x)^{0.5}$$

Figure 54:
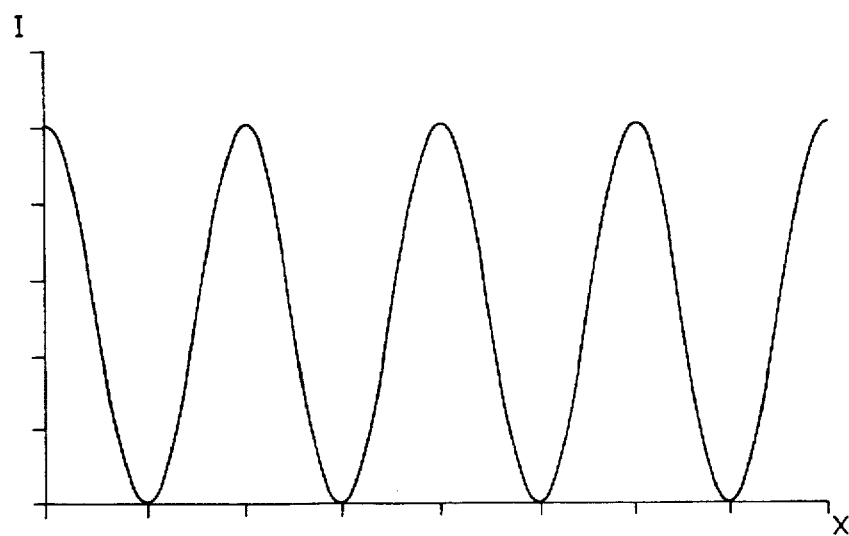
FIG. 54 is a drawing to show a light intensity distribution by the patterns shown in FIG. 44A and 44B.

Here, x is a coordinate value. Described is a case where a line-and-space pattern is printed using the reticles with phase shifters shown in FIG. 44 as described previously under coherent illumination and a polarizing plate is set between a projection lens and a photosensitive material to obtain linearly polarized light in the direction normal to the plane of the drawing. The period of the reticles is the resolution limit $\lambda/2NA$ of projection optical system. FIG. 54 is a drawing to show a light intensity distribution formed on the image plane. The light intensity distribution I(x) has a sinusoidal distribution as shown. Namely, it is expressed as follows.
(Eq 4-23)

$$I(x) = 1 + \cos(2\pi \cdot 2NA \cdot x/\lambda)$$

Figure 55A:
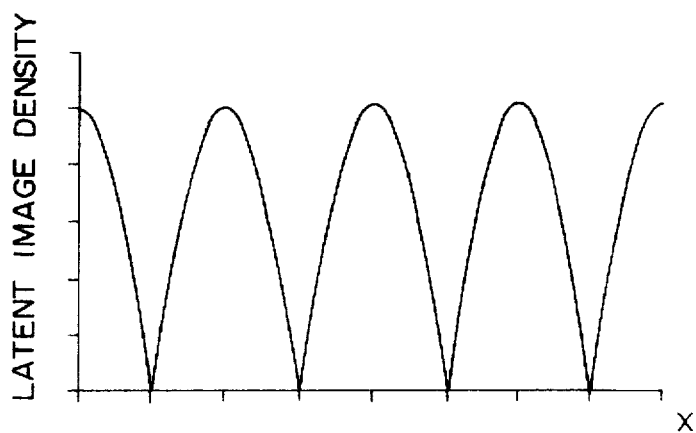
FIG. 55A–55C include drawings to show synthetic density distributions of latent images by another embodiment.

Further, FIG. 55A shows a latent image density distribution J(x) obtained from Equation (4-23).
(Eq 4-24)

$$J(x) = (1 + \cos(2\pi \cdot 2NA \cdot x/\lambda))^{0.5}$$

As shown in FIG. 55A, the latent image density distribution J(x) is more gently sloping near bright portions but becomes rapidly darker and very thinner in width in dark portions than the light intensity distribution I(x). However, it is clear that since the latent image density distribution J(x) is formed in the same period as the light intensity distribution I(x) is, a pattern cannot be formed exceeding the limit resolution of projection optical system in this state.

Figure 55B:
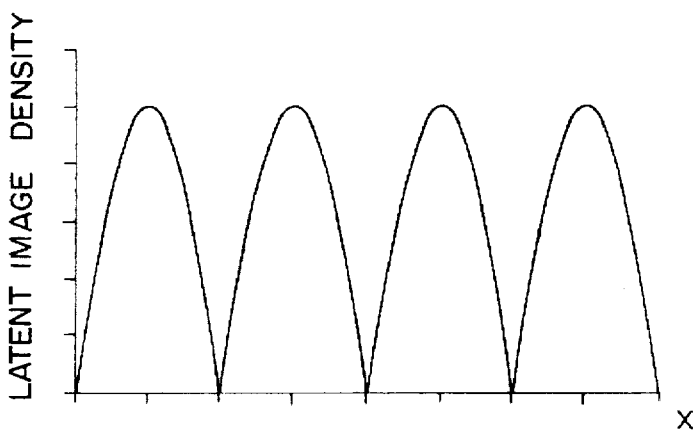
Figure 55C:
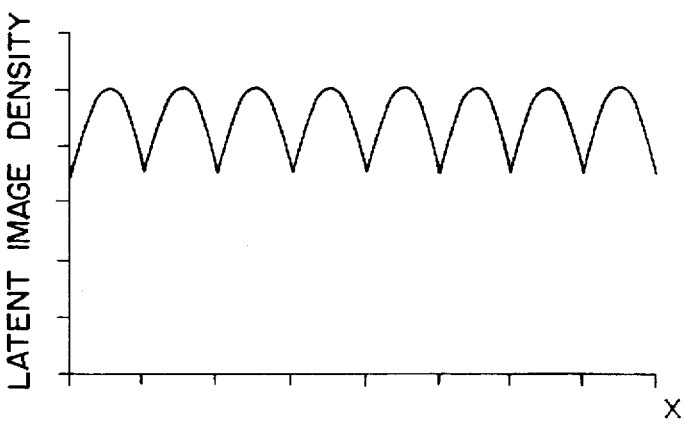

On the other hand, since a pattern can be formed in finer structure as shown in FIG. 55C on the image plane by superimposing a latent image density distribution J(x) (FIG. 55B) obtained with a pattern shifted by a half period on FIG. 55A, the pattern will have a periodic arrangement two times finer than the limit resolution.

Figure 56:
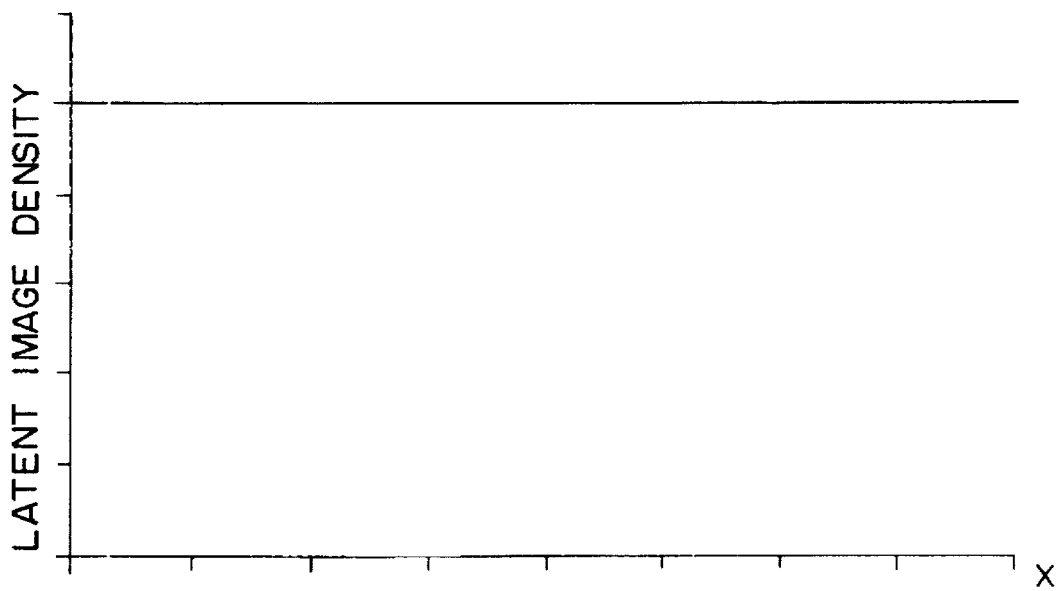
FIG. 56 is a drawing to show a synthetic latent image density distribution when a linear photoresist is used.

In contrast, in case of a photosensitive material of m=1 being used, the latent image density distribution J(x) would be perfectly coincident with the light intensity distribution I(x) of FIG. 54 and in superimposing this on a half-shifted pattern, J(x) obtained would become flat as understood from the following equation, which is of no use (FIG. 56).
(Eq 4-25)

$$J(x) = 1 + \cos(2\pi \cdot 2NA \cdot x/\lambda) + 1 - \cos(2\pi \cdot 2NA \cdot x/\lambda) = 2$$

As described, a finer latent image than the resolution limit of projection optical system can be formed even using photosensitive materials of m<1.

The present embodiment is also arranged in the same manner as the previously described embodiments, so that in order to control the direction of polarization in the apparatus shown in FIG. 51 a polarizing plate 4022 is set between the illumination optical system for illuminating the reticle and the reticle to obtain linearly polarized light. If a reticle has a pattern obtained by rotating the original reticle pattern 90° on the plane of pattern, the polarizing plate 4022 is rotated 90° about the optical axis Ax by the drive unit 4023.

It is needless to mention that either a positive photoresist or a negative photoresist can be employed in the present invention. However especially, it is considered that the cases of m<1 are advantageous for positive photoresists, and extremely fine left lines can be formed in the case of the example shown in FIG. 55A–55C.

FIG. 51 shows schematic structure of an exposure apparatus for performing a plurality of exposure processes different in light intensity distribution on the photosensitive material as described above. An illumination beam from a light source 4011 is collected by an elliptic mirror 4012, is guided by a mirror 4013 into a collimator lens 4014 to become a bundle of nearly parallel rays, and is then incident into a fly's eye integrator 4015. Beams emergent from the fly's eye integrator 4015 are guided by a mirror 4016 into a main condenser 4017 to uniformly illuminate a reticle 4018a as a photo-mask. A predetermined pattern on the photo-mask 4018a is projected through a projection optical system 4019 onto a wafer 4020 coated with a photosensitive material to effect exposure thereon. Here, after completion of exposure, the reticle 4018a is exchanged for another reticle 4018b having a different pattern by a reticle loader 4021, and second exposure is then conducted.

Instead of the exchange of different patterns by the reticle loader 4021, the apparatus may be so arranged that after the first exposure with the reticle 4018a, the reticle 4018a is moved by a predetermined amount in the direction perpendicular to the optical axis Ax of projection optical system 4019 to then effect second exposure. This predetermined amount is ($\lambda/4NA$) when converted as a coordinate value on the wafer for example in the case using the pattern of FIG. 44A as described previously where the latent image density of photosensitive material is proportional to the square of the light intensity. Where the latent image density of photosensitive material is proportional to the cube of the light intensity, it is effective to set the predetermined value as ($\lambda/6NA$) when converted as a coordinate value on the wafer.

Unless the reticle in which the polarization film is directly provided on the photo-mask is used, the polarizing plate 4022 is inserted into the above optical apparatus. In the embodiment shown in FIG. 51, it is inserted between the main condenser 4017 and the photo-mask 4018a. Here, the polarizing plate 4022 is so arranged that it can be rotated or reciprocated by the drive unit 4023 such as a motor, and is set so that the direction of polarization becomes parallel with the longitudinal direction of the pattern formed on the wafer 4020. Although the polarizing plate 4022 is inserted between the main condenser 4017 and the photo-mask 4018a in this example, the polarizing plate 4022 can be so arranged as to be inserted between the photo-mask 4018a and the projection optical system 4019, between the projection optical system 4019 and the wafer 4020, or at the position of aperture stop of the projection optical system 4019 in order to obtain a constant polarization state.

Meanwhile, it is to be desired that an exposure amount in the second exposure is finely adjusted relative to that in the first exposure for photoresists not perfectly ideal.

It is of course for cases where a same reticle pattern is used for plural exposure processes that the wafer itself can be arranged to move for each of plural exposure processes, instead of moving the reticle.

Effective alignment between the plural exposure processes is the so-called latent image alignment in which alignment is performed observing the latent image.

The embodiment of FIG. 51 was described keeping in mind so-called steppers for fabricating semiconductors in fine structure by successively repeating exposure processes, but the present invention can of course be applied to so-called slit scan exposure apparatus for scanning an exposure area, used when the screen size of optical system is small, instead of full exposure over the entire surface.

Incidentally, as in the embodiment shown in FIG. 44A and FIG. 44B, it is effective in the present invention to use the phase shift patterns in order to form a high-resolution pattern. It is also effective to employ the annular illumination proposed in Japanese Laid-open Patent Application No. 61-91662 or to employ the so-called SHRINC illumination proposed in Japanese Laid-open Patent Application No. 4-225358, for example.

The method of using the phase shift patterns or mask is described in Optics, vol.23, No.1, pp 29–37, 1994; and in SPIE vol.1780, Lens and Optical Systems Design, pp 117–131, 1992. The annular illumination is described in U.S. patent application Ser. No. 166,153. The SHRINC illumination is described in U.S. patent application Ser. No. 7,91138.

Further, it is also effective to increase the depth of focus by provision of a filter giving a phase difference on the pupil of the imaging optical system. Although the above embodiments did not illustrate in particular, it is also effective to change the shape of the secondary light source, the wavelength band, etc. as illumination conditions in each exposure.

The present invention has such a major feature that the plane of polarization is made parallel on the image plane with the longitudinal direction of the pattern formed on the image plane, but the invention is by no means limited to the strictly parallel arrangement. It is thus of course that the present invention involves modifications in which the plane of polarization is nearly parallel on the image plane with the longitudinal direction of the pattern formed on the image plane.

As described above, the present invention enables a fine pattern surpassing the resolution limit of projection optical system to be formed, using the photosensitive material showing the nonlinear sensitivity property, using the s-polarization, and performing a plurality of exposure processes with different patterns. In addition, a high-resolution pattern can be formed with little changing the conventional exposure wavelength and optical system.

With the exposure method according to the present invention, semiconductor devices can be fabricated with very fine circuit pattern which was impossible with the conventional projection exposure apparatus, thus achieving the great effect of highly increasing the degree of integration of integrated circuits.

Next, an exposure method according to present invention using a transmitting film having nonlinear characteristics will be described. The photoresist as a photosensitive material is coated with the transmitting film having such a property that the intensity of outgoing light is equal to $I^n$ ($n \neq 1$) where I is the intensity of incident light. This changes the light intensity distribution of incident light into the photoresist.

When exposure light passes through the above transmitting film, the latent image reaction density $\xi$ appearing in the photoresist can be expressed by the following equation instead of Equation (4-1).

(Eq 5-6)

$$\xi = \exp(-CD), D = H \cdot t = I^n \cdot t$$

Here, I represents exposure intensity, t an exposure time, and C a constant determined by the photosensitive material. Further, n is an exponent indicating linearity, which is defined as linear with n=1 and nonlinear with n≠1. In the present invention, as described below, n≠1 can be achieved by changing the effective exposure intensity I for the photoresist. For easy recognition, H replaces $I^n$ as in the above equation and H is called as an effective exposure intensity.

If the transmittance of the transmitting film is unchanged (or constant), the intensity of transmitted light will be proportional to the intensity of incident light. Namely, n=1.

Next described in the following is the principle of capability of forming a pattern surpassing the resolution limit of projection optical system while using a transmitting film having such a nonlinear property that the intensity of transmitted light is formed so as to be emphasized in accordance with the power n (n>1) of the intensity of incident light.

In the conventional exposure methods, a light intensity distribution I(x) on the image plane after passage through the total system under incoherent illumination is given by the below equation, where $I_0(x)$ is a light intensity distribution of object and F(x) is a point spread function of the optical system.

(Eq 5-7)

$$I(x) = I_0(x) * F(x)$$

Here, x is a coordinate of position on the photosensitive material and * means the convolution. Then, a spectrum i of light intensity on the image plane is given by the following equation from the convolution theorem of Fourier transformation.

(Eq 5-8)

$$i(v) = i_0(v) \cdot f(v)$$

Here, v is a spatial frequency, $i_0$ a spectrum of light intensity of object, and f corresponds to a so-called OTF of the optical system. Thus, the spectrum of exposure intensity (light intensity on the image plane) cannot be formed over the cutoff frequency ($2NA/\lambda$) of optical system.

However, where the transmitting film having such a property that the intensity of transmitted light is emphasized in accordance with the power n (n>1) of the intensity of incident light is formed on the photosensitive material, a fine pattern can be formed as described below. Described is an example of n=2, i.e., a case where the effective exposure intensity distribution H(x) is formed in accordance with the square of the transmitted light intensity distribution I(x). The effective exposure intensity distribution is given by the following equation under incoherent illumination, where $I_0(x)$ is the light intensity distribution of object and F(x) is the point spread function of optical system.
(Eq 5-9)

$$H(x)=I(x)^2=\{I_0(x)*F(x)\}^2$$

Then, a spectrum h of effective exposure intensity distribution is given by the following equation from the convolution theorem of Fourier transformation, similarly.
(Eq 5-10)

$$h(v)=\{i_0(v) \cdot f(v)\}*\{i_0(v) \cdot f(v)\}$$

Since the effective exposure intensity distribution is given by Equation (5-9) for the cases of n=2, the effective light intensity distribution is sharper than those for conventional photoresists given by Equation (5-7). This will be specifically described with examples shown in FIG. 68A and FIG. 68B for sinusoidal exposure intensity distribution.

Figure 68A:
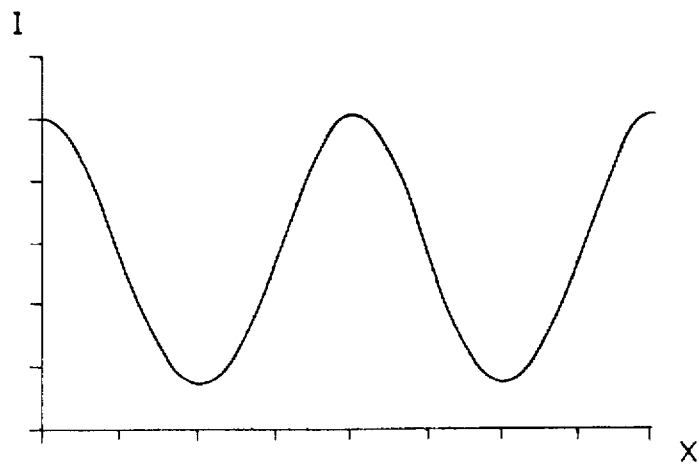
FIG. 68A and 68B include drawings to show a light intensity distribution and an effective exposure intensity distribution on the transmitting film according to the present invention.
Figure 68B:
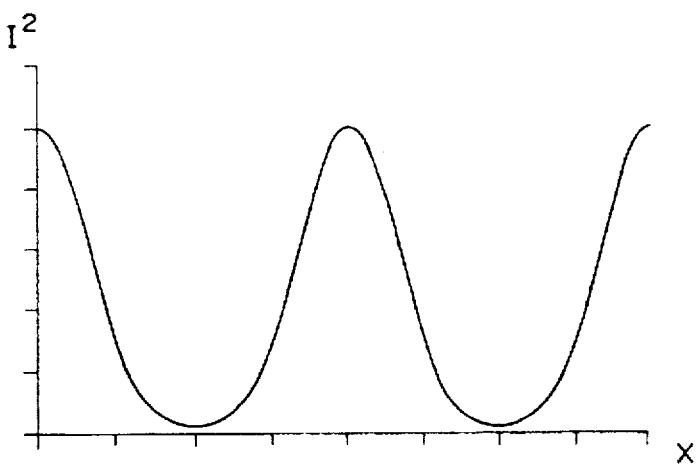

FIG. 68A shows a light intensity distribution in normal exposure, which is sinusoidal similarly as the exposure intensity distribution is. FIG. 68B shows an effective exposure intensity distribution in a case of n=2. Comparing FIG. 68A with FIG. 68B, the contrast in FIG. 69B is higher than that in FIG. 68A, but the pitch of the formed pattern in FIG. 68B is equal to that in FIG. 68A. Thus, simple setting only of n=2 cannot make the pitch of the effective exposure intensity distribution formed finer than the pitch of an image formed by the optical system, thus never permitting the resolution to surpass the resolution limit of the optical system. Although in the effective exposure intensity distribution there are components with frequencies surpassing the resolution limit of optical system from Equation (5-10), the pitch of the formed pattern is still kept not surpassing the resolution limit of the optical system.

Accordingly, it is impossible to form a finer pattern than the resolution limit determined by the optical system, simply by using the transmitting film having such a property that the intensity of transmitted light is emphasized in accordance with the intensity of incident light. However, the present invention permits a finer pattern surpassing the resolution limit of the optical system to be formed by using the transmitting film having such a property that the intensity of transmitted light is emphasized in accordance with the intensity of incident light and further performing a plurality of separate exposure processes.

In order to describe the most basic concept of the present invention, here is considered formation of point image by the optical system in the case of n=2, similarly as above. In this case, the point-spread-distribution point image passing through the transmitting film becomes sharper. Further, it is sufficient for this case taking the point spread distribution F(x) by the optical system into consideration irrespective of the illumination state. Then, supposing a desired object intensity distribution $I_0(x)$ is formed by superposition of point images and an effective exposure intensity distribution H(x) is formed thereby, the density distribution can basically be expressed by the following equation, because it is superposition of light intensities given by image formation of respective point images.
(Eq 5-11)

$$H(x)=I_0(x)*\{F(x)\}^2$$

Since the effective exposure intensity distribution of point image involves $\{F(x)\}^2$, it is sharper than the point spread distribution F(x) by the optical system, thus realizing high resolution. By Fourier transformation of Equation (5-11), the following equation is obtained.
(Eq 5-12)

$$h(v)=i_0(v) \cdot \{f(v)*f(v)\}$$

Then, f*f can be interpreted as OTF of the optical system to obtain the effective exposure intensity distribution by this method. This means that the cutoff frequency (4NA/λ) can be achieved against the cutoff frequency (2NA/λ) of the conventional OTF or f as expressed by Equation (5-8), thus doubling the resolution.

Figure 69A:
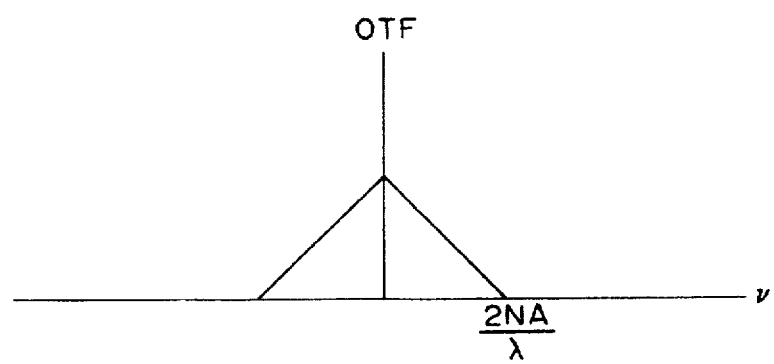
FIG. 69A and 69B include characteristic drawings of OTF.
Figure 69B:
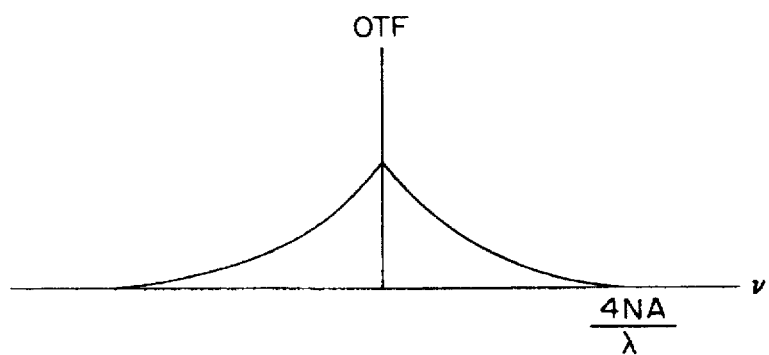

FIG. 69A and 69B diagrammatically show this comparison. FIG. 69A indicates the OTF in the conventional method, while FIG. 69B the OTF for the case where a photoresist is exposed to isolated patterns, using the transmitting film of n=2. Therefore, a fine pattern can be formed with resolution over the resolution limit of the optical system when a latent image is formed using the transmitting film of n=2 and performing a plurality of exposure processes based on isolated patterns. Accordingly, formation of a pattern with resolution over the resolution limit of the optical system becomes possible by the combination of the transmitting film having the nonlinear property with the plural exposure processes by isolated patterns.

Further, a pattern with resolution over the resolution limit of the optical system can also be formed, similarly as in the case of the isolated patterns, where a plurality of exposure processes are carried out using patterns which are not perfectly isolated but can be considered as nearly isolated. In this case, a spectrum h of effective exposure intensity distribution is defined by the following equation.

$$h(v) = \Sigma i_{0j}(v) \cdot \{f(v)*f(v)\} \qquad \text{(Eq 5-13)}$$
$$= i'(v) \cdot \{f(v)*f(v)\}$$
$$i'(v) = \Sigma i_{0j}(v)$$

In the above equation, $i_{0j}$ represents object spectra of mutually nearly isolated patterns, and i' is considered as an object spectrum of an imaginary pattern constructed by superposition of the nearly isolated patterns. No spectra of conventional effective exposure intensity distributions can surpass the cutoff frequency (2NA/λ) of f, as shown by Equation (5-8), while the present invention permits a spectrum up to the cutoff frequency (4NA/λ) of {f(v)*f(v)} to be formed as an effective exposure intensity distribution, as indicated by Equation (5-13).

As described above, the pitch of formed pattern never surpasses the resolution limit of the optical system by the single use of the transmitting film having the nonlinear property in the conventional exposure method, while in the present invention an effective exposure intensity distribution of pattern with a pitch surpassing the resolution limit of the optical system can be formed by performing a plurality of exposure processes different in effective exposure intensity distribution on the photosensitive material so as to provide appropriate i'.

Although the above description is given with the case in which the effective exposure intensity H is in proportion to the square of the exposure intensity I, the present invention is by no means limited to it. The present invention may employ any transmitting films having the nonlinear property as long as the effective exposure intensity H is formed according to the power n (n>1) of the exposure intensity L. In this case, the effective exposure intensity distribution is expressed by the n-th power of the light intensity distribution F(x) of point image, so that it is a sharper distribution than the light intensity distribution F(x) of point image and the above equation (5-11) can be rewritten as follows.
(Eq 5-14)

$$H(x) = I_0(x) * \{F(x)\}^n$$

Further, the illumination state is not limited to the incoherent illumination, but may be any of the oblique illumination and various modified illumination methods, similarly forming a very fine pattern. Of course, a self-emitting object can be used.

With the Fourier transformation of Equation (5-14), it is seen from the convolution theorem of the Fourier transformation that a pattern (effective exposure intensity distribution) can be formed up to a frequency of n times the cutoff frequency of the optical system. There is a possibility of forming a further finer pattern by a plurality of exposure processes with patterns which are not completely isolated from each other in each exposure.

Although the above description concerned the cases where the power n was greater than 1 (n>1) in the above Equation (5-14), that is, where the effective exposure intensity H was emphasized more than the light intensity I, simulation results verified that a fine pattern with resolution over the resolution limit of the projection optical system could substantially be formed where the power n was smaller than 1 (n<1). Such a transmission property is also effective that the power n in Equation (5-14) is not constant but changes depending upon the light intensity L.

The effective exposure intensity distribution surpassing the resolution limit of optical system can be formed with further higher contrast, if a pattern is formed with high resolution and with high contrast using the phase shift mask or using the modified illumination method in each of the plurality of exposure processes.

As described above, semiconductor devices having patterns with high resolution surpassing the resolution limit of projection optical system can be attained by using the transmitting film having the nonlinear transmission property for effective exposure intensity and performing a plurality of exposure processes different in light intensity distribution on the transmitting film.

The present invention will be described below based on embodiments thereof.

FIG. 1 shows cross-sectional views of reticle patterns as photo-masks according to the present invention. First exposure is made with a pattern shown in FIG. 60A of pattern and thereafter second exposure with a pattern of FIG. 60B. In the first pattern of FIG. 60A, an opaque film 5002a provided on a substrate 5001a forms open portions 5004a. A phase film 5003a is provided over either one of two mutually adjacent open portions 5004a, thus constituting a so-called phase shift mask. In the second pattern of FIG. 60B, an opaque film 5002b and a phase film 5003b are similarly provided on a substrate 5001b, thus also constituting a phase shift mask. The open portions 5004a in the first pattern are arranged to overlap with positions of the opaque film 5002b in the second pattern while the open portions 5004b in the second pattern are arranged to overlap with positions of the opaque film 5002a in the first pattern. Exposure processes of the two patterns are carried out separately from each other on a photosensitive material with a transmitting film provided thereon.

Figure 61A:
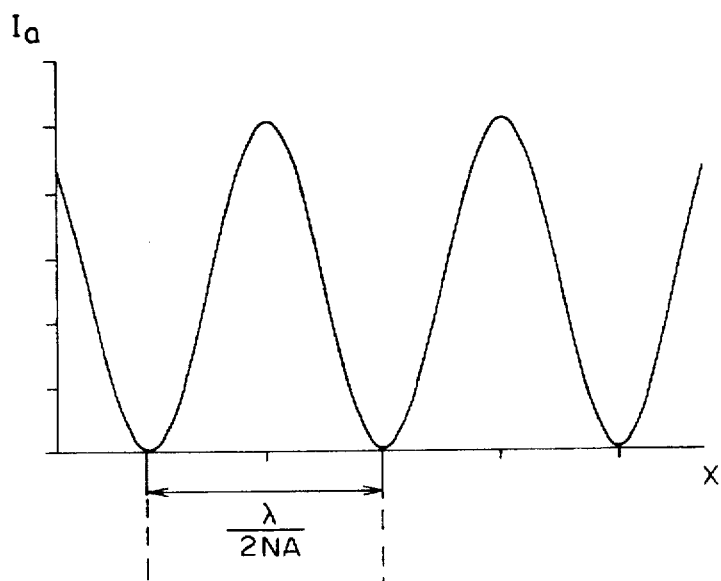
FIG. 61A and 61B include drawings to show light intensity distributions on a transmitting film by the patterns shown in FIG. 60a and 60B.
Figure 61B:
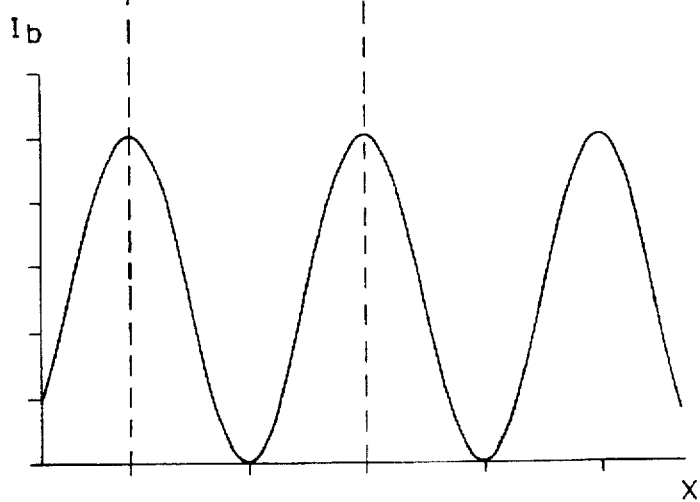

FIG. 61A and FIG. 61B show light quantity distributions on the transmitting film, obtained by the exposure processes with the first and second patterns. In the present embodiment, each exposure produces a sinusoidal light intensity Ia or Ib, as shown in FIG. 61A or FIG. 61B, by only±first-order diffracted light under coherent illumination. In the two exposure processes, positions of peaks in the light intensity distributions are shifted to each other by a half cycle in phase on the transmitting film.

Now, considering cases of high resolution, let us suppose that a light intensity distribution having the frequency equal to the resolution limit of optical system is produced in each exposure. Namely, the numerical aperture is fully effectively used so that the±first-order diffracted light passes the periphery of the aperture of optical system, and then the produced pitch in each exposure is the resolution limit λ/2NA, providing incident light intensity distributions expressed by the following equations.
(Eq 5-15)

$$Ia(x) = 1 + \cos(2\pi \cdot 2NA \cdot x/\lambda)$$

Figure 62A:
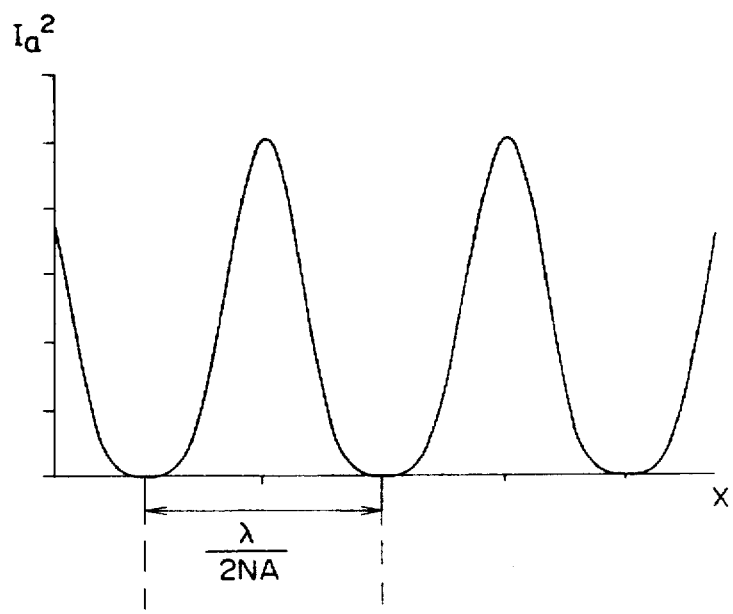
FIG. 62A and 62B include drawings to show effective exposure intensity distributions by the patterns shown in FIG. 60A and 60B.
Figure 62B:
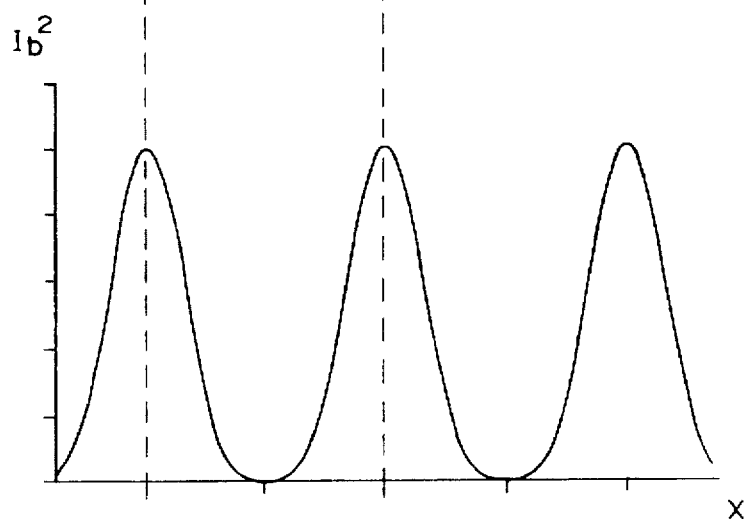

(Eq 5-16)

$$Ib(x) = 1 + \cos(2\pi \cdot 2NA \cdot x/\lambda + \pi)$$

Where the effective exposure intensity transmitted is given by the square of the light intensity because of the property of the coating film on the photoresist, respective effective exposure intensity distributions are given by the following equations, which are shown in FIG. 62A and FIG. 62B.
(Eq 5-17)

$$Ha(x) = Ia(x)^2 = 3/2 + 2\cos(2\pi \cdot 2NA \cdot x/\lambda) + \cos(4\pi \cdot 2NA \cdot x/\lambda)/2$$

(EQ 5-18)

$$Hb(x) = Ib(x)^2 = 3/2 + 2\cos(2\pi \cdot 2NA \cdot x/\lambda + \pi) + \cos(4\pi \cdot 2NA \cdot x/\lambda)/2$$

A finally obtainable effective exposure intensity distribution after a plurality of exposure processes is a sum of Equations (5-17) and (5-18), as given by the following equation.
(Eq 5-19)

$$H(x) = Ha(x) + Hb(x) = 3 + \cos(4\pi \cdot 2NA \cdot x/\lambda)$$

Figure 63:
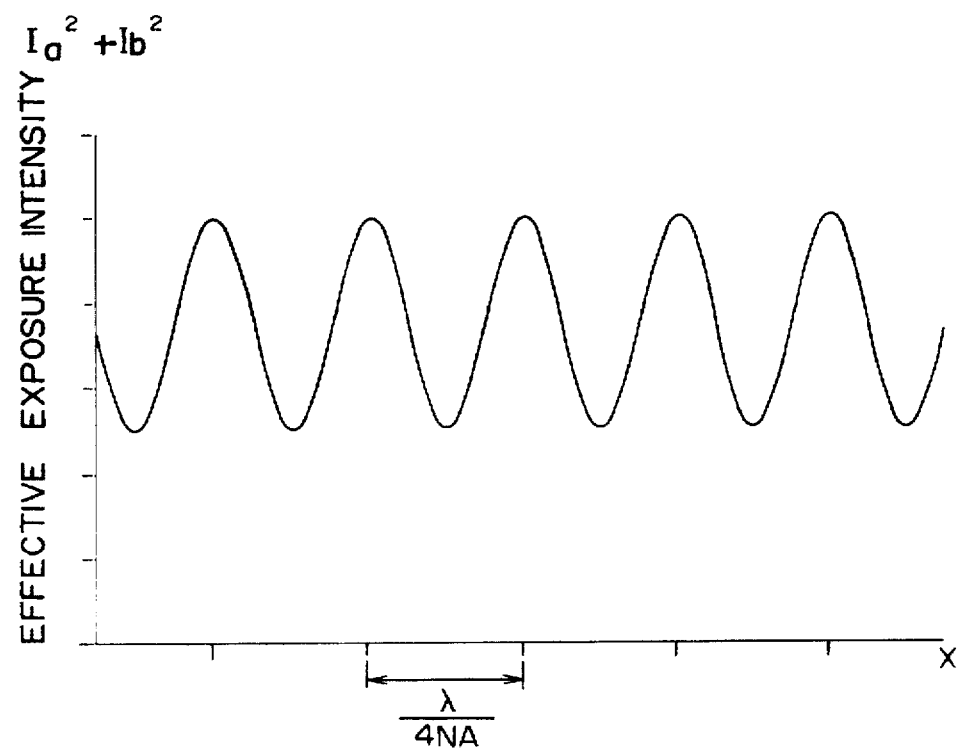
FIG. 63 is a drawing to show a synthetic effective exposure intensity distribution in an embodiment of the present invention.

As seen from Equation (5-19), the effective exposure intensity distribution H(x) in the present embodiment has a periodic arrangement of pitch (λ/4NA), which is two times finer than the limit resolution (λ/2NA) of optical system. This effective exposure intensity distribution H(x) is shown in FIG. 63. A fine photoresist pattern is formed by development after completion of the plurality of (two in this embodiment) exposure processes.

As apparent from Equation (5-12) and FIG. 69B, if a latent image is formed by superposition of perfectly isolated patterns (point objects), the latent image can be formed at the pitch (λ/4NA). However, the contrast is not so high in this case. Thus, the above embodiment employs the coherent illumination using the phase shift masks, whereby the effective exposure intensity distribution is formed with high contrast.

If a transmitting film with constant transmittance which is not nonlinear is used, the photoresist is exposed in a simple sum of the above equations (5-15) and (5-16), i.e., in a simple sum of FIG. 61A and FIG. 61B, thus forming no pattern at all.

Figure 64:
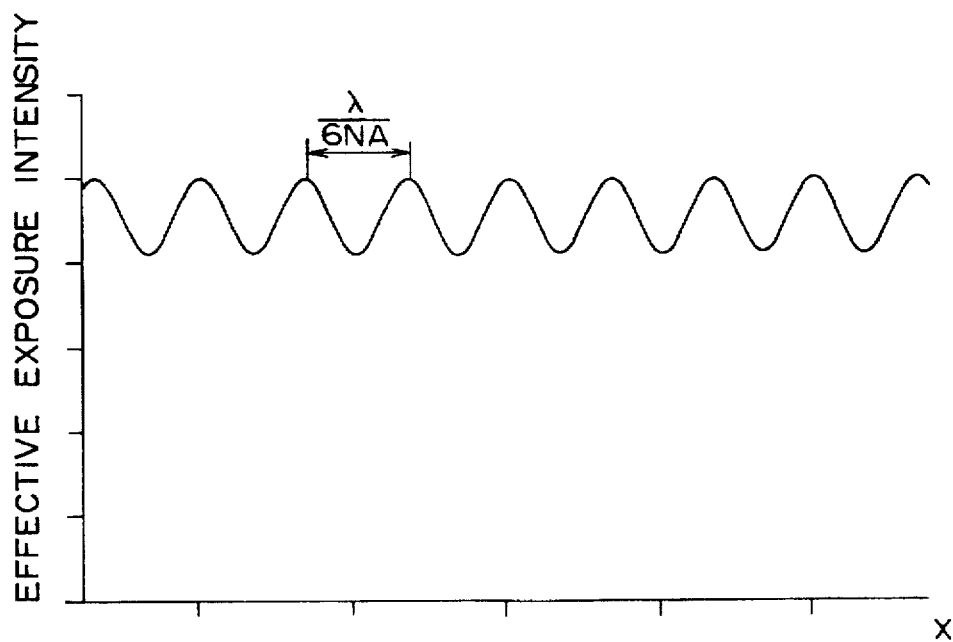
FIG. 64 is a drawing to show a synthetic effective exposure intensity distribution by three exposure processes.

The above embodiment showed a case in which the effective exposure intensity was obtained according to the square (n=2) of the light intensity, but much higher resolution can be expected if the effective exposure intensity is obtained in nonlinear property of the third power, the fourth power, or the higher power (n=3, 4, ...) of the light intensity. For example, an effective exposure intensity distribution shown in FIG. 64 shows an example in which the effective exposure intensity distribution is obtained according to the cube (n=3) of the light intensity distribution, which was obtained by performing three exposure processes while shifting the pattern on the photo-mask shown in FIG. 60A by one third pitch each, i.e., by ($\lambda$/6NA) each. In this example, a periodic arrangement of pitch ($\lambda$/6NA) is obtained as shown, which is three times finer than the resolution limit ($\lambda$/2NA) of optical system.

Figure 65:
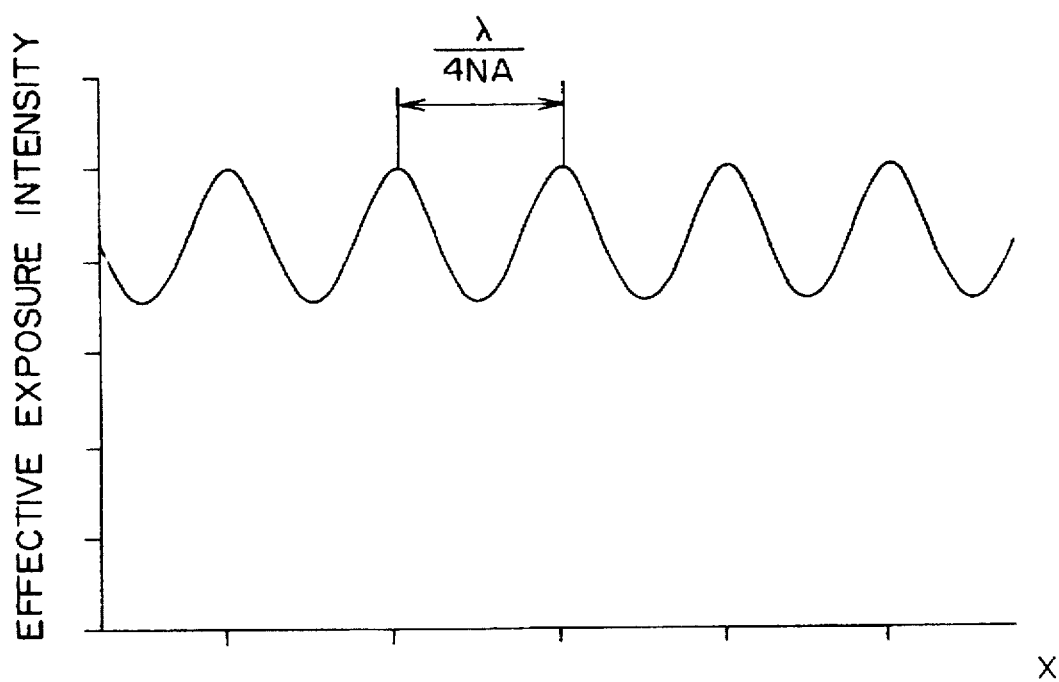
FIG. 65 is a drawing to show a synthetic effective exposure intensity distribution in another embodiment.

Also, the present invention allows use of transmitting films in which the effective exposure intensity is obtained according to the power 1.5 (n=1.5) of the light intensity. FIG. 65 shows an effective exposure intensity distribution obtained by separate exposure processes for the respective reticles shown in FIG. 60A and FIG. 60B in the case of n=1.5, indicating that the effective exposure intensity distribution is obtained two times finer than the resolution limit of the optical system. The contrast in this case can also be enhanced by coherent illumination on the phase shift masks.

Figure 67A:
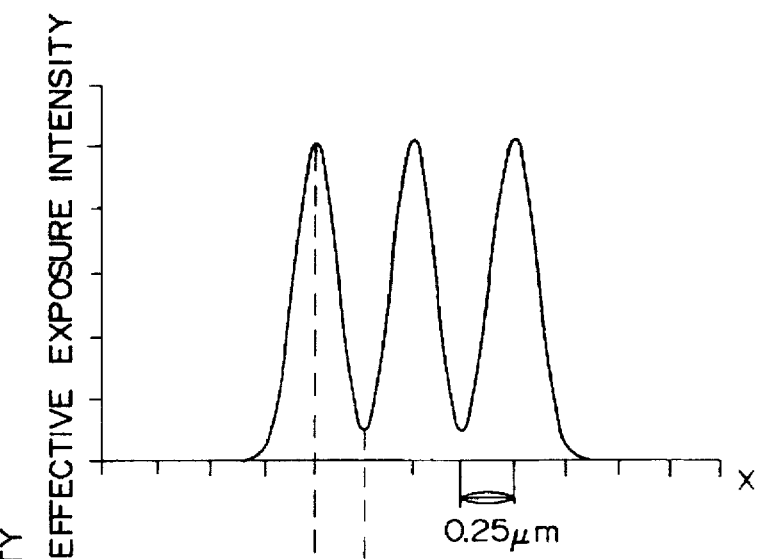
FIG. 67A–67C include drawings to show synthetic effective intensity distributions according to another embodiment.
Figure 67B:
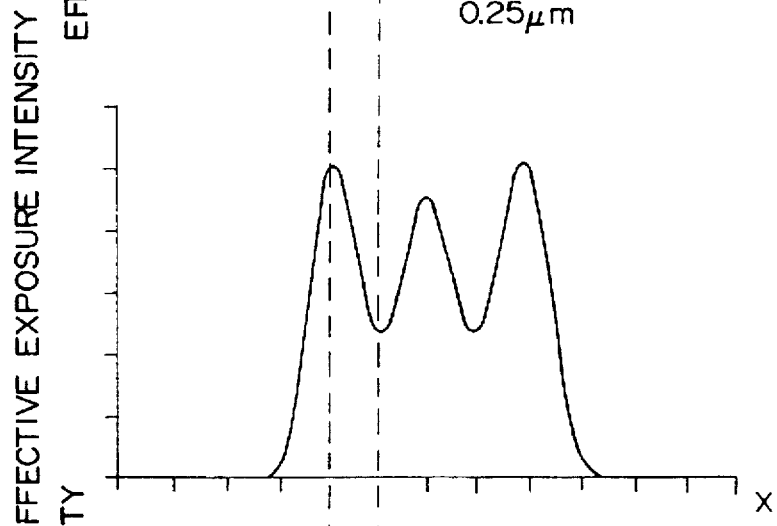
Figure 67C:
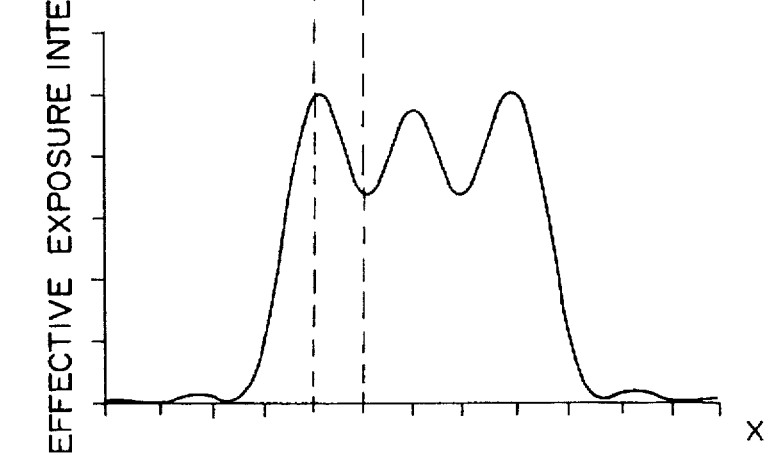

Next described is another embodiment according to the present invention. The above embodiment shown in FIG. 60A and 60B used the so-called phase shift method to form the light intensity distribution by coherent image formation, while this embodiment uses an ordinary reticle to perform partial coherent image formation. Conditions of optical system are determined as the operational wavelength X=0.365 µm, the numerical aperture NA=0.5, and the coherence factor σ=0.6. FIG. 67A shows a case of n=2, which is an effective exposure intensity distribution when three isolated lines of 0.25 µm are formed by exposure while shifting isolated lines of 0.25 µm in width three times. FIG. 67B also shows a case of n=2 which is a distribution when three lines of 0.25 µm in width are subjected to full exposure. FIG. 67C shows an exposure intensity distribution of three lines of 0.25 µm in width by the conventional method.

It is apparent from the comparison between these FIG. 67A, FIG. 67B, and FIG. 67C that the effective exposure intensity distribution, FIG. 67A, obtained by the method of the present invention is effective to form a fine pattern far excellent as compared with the other methods.

It is general that the resist pattern after development is formed approximately in proportion with the latent image reaction density. However, further emphasizing the contrast in the development process, a resist pattern can be formed with much higher contrast.

Further described is an embodiment where the power n is smaller than 1 (n<1). Described is an example where a transmitting film with n=0.5 is used. Using the transmitting film with n=0.5, the effective exposure intensity is formed according to the power 0.5 of the light intensity. Namely, it is given by the following equation.
(Eq 5-20)

$$H(x)=I(x)^{0.5}$$

Figure 70:
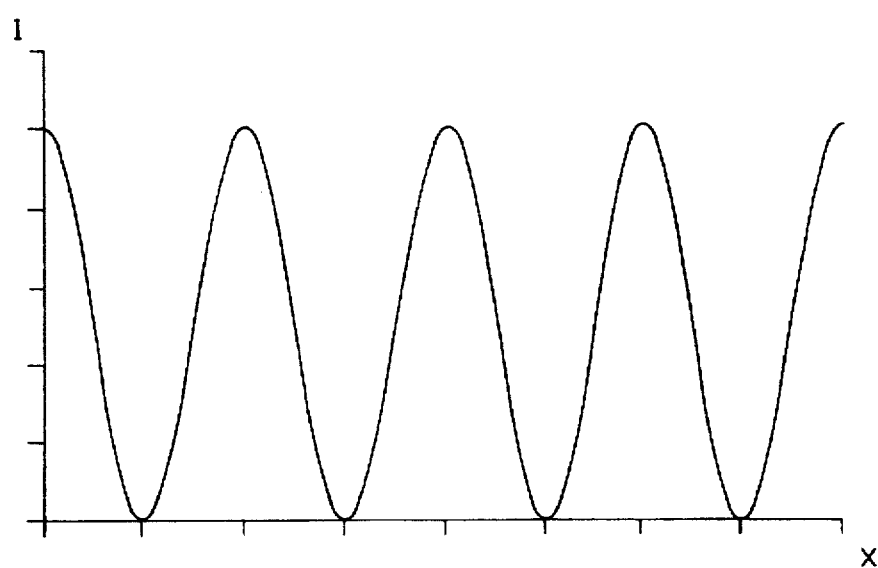
FIG. 70 is a drawing to show a light intensity distribution by the patterns shown in FIG. 60A and 60B.

Here, x is a coordinate value. Described is a case where a line-and-space pattern is printed using the reticles with phase shifters shown in FIG. 60A and 60B as described previously under coherent illumination. The period of the reticles is the resolution limit $\lambda$/2NA of projection optical system. FIG. 70 is a drawing to show an incident light intensity distribution formed on the transmitting film. The incident light intensity distribution I(x) has a sinusoidal distribution as shown. Namely, it is expressed as follows.
(Eq 5-21)

$$I(x)=1+\text{COS}\ (2\pi\cdot 2NA\cdot x/\lambda)$$

Figure 71A:
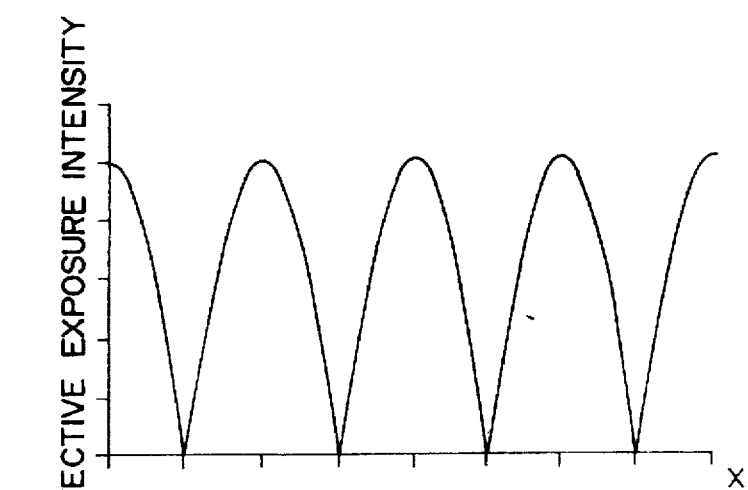
FIG. 71A–71C include drawings to show synthetic effective exposure intensity distributions according to another embodiment.

Further, FIG. 71A shows an effective exposure intensity distribution H(x) obtained from Equation (5-21).
(Eq 5-22)

$$H(x)=(1+\text{COS}\ (2\pi\cdot 2NA\cdot x/\lambda))^{0.5}$$

As shown in FIG. 71A, the effective exposure intensity distribution H(x) is more gently sloping near bright portions but becomes rapidly darker and very thinner in width in dark portions than the light intensity distribution I(x). However, it is clear that since the nonlinear exposure intensity distribution H(x) is formed in the same period as the light intensity distribution I(x) is, a pattern cannot be formed exceeding the limit resolution of projection optical system in this state.

Figure 71B:
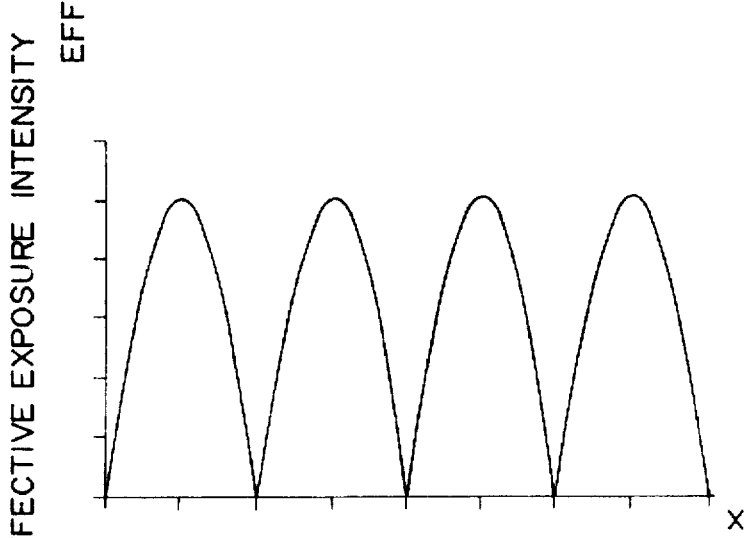
Figure 71C:
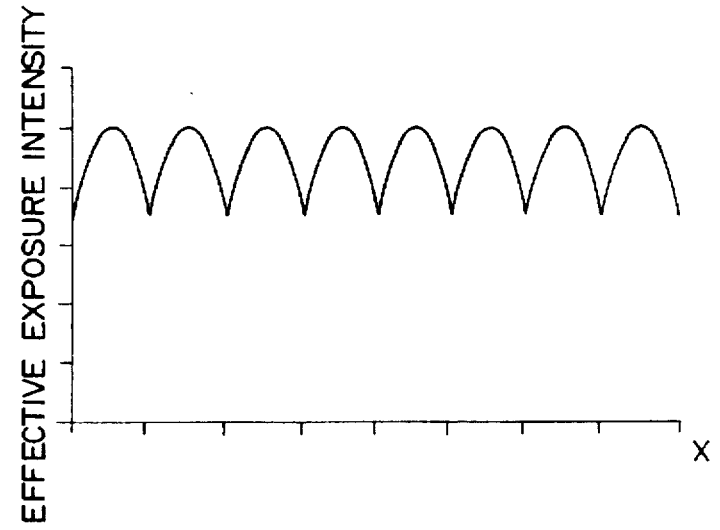

On the other hand, since a pattern can be formed in finer structure as shown in FIG. 71C on the image plane by superimposing an effective exposure intensity distribution H(x) (FIG. 71B) obtained with a pattern shifted by a half period on FIG. 71A, the pattern will have a periodic arrangement two times finer than the limit resolution.

Figure 72:
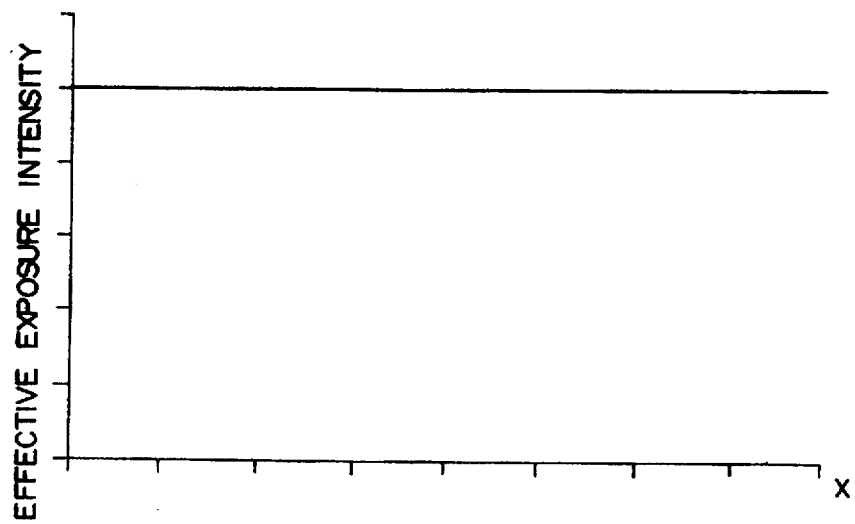
FIG. 72 is a drawing to show a synthetic effective exposure intensity distribution when a transmitting film with linear property is used.

In contrast, in case of a transmitting film of n=1 being used, i.e., where a film with constant transmittance against exposure intensity is used, the effective exposure intensity distribution H(x) would be perfectly coincident with the light intensity distribution I(x) of FIG. 70 and in superimposing this on a half-shifted pattern, the effective exposure intensity distribution H(x) obtained would become flat as understood from the following equation, which is of no use (FIG. 72).
(Eq 5-23)

$$H(x)=1+\text{COS}\ (2\pi\cdot 2NA\cdot x/\lambda)+1-\text{COS}\ (2\pi\cdot 2NA\cdot x/\lambda)=2$$

As described, a finer latent image reaction density distribution ξ(x) than the resolution limit of projection optical system can be formed even using transmitting films of n<1.

It is needless to mention that either a positive photoresist or a negative photoresist can be employed in the present invention. However especially, it is considered that the cases of n<1 are advantageous for positive photoresists, and extremely fine left lines can be formed in the case of the example shown in FIG. 71C.

Figure 66:
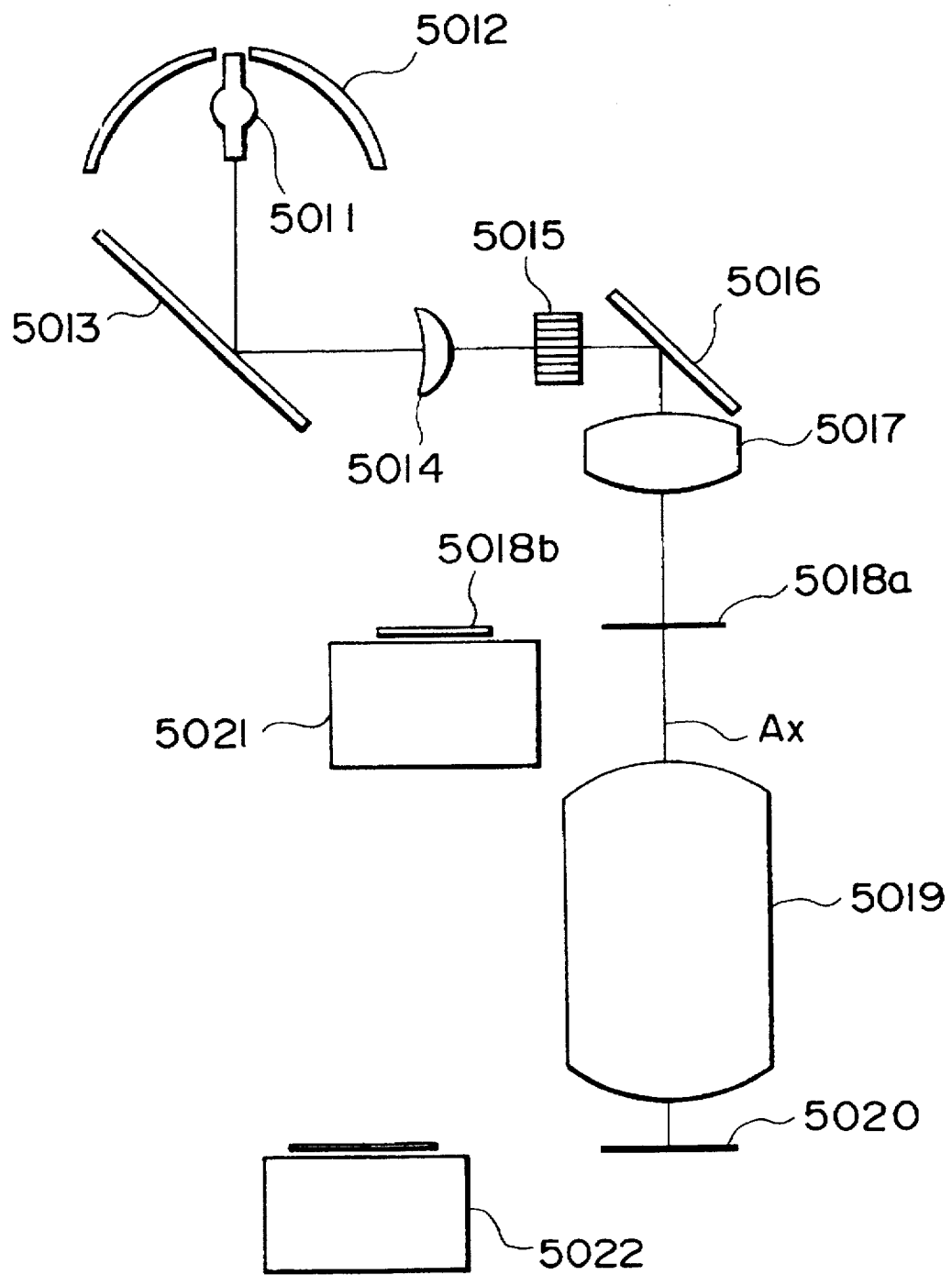
FIG. 66 is a drawing to show schematic structure of an exposure apparatus suitable for the present invention.

FIG. 66 shows schematic structure of an exposure apparatus for performing a plurality of exposure processes different in light intensity distribution on the photosensitive material with the transmitting film as described above. An illumination beam from a light source 5011 is collected by an elliptic mirror 5012, is guided by a mirror 5013 into a collimator lens 5014 to become a bundle of nearly parallel rays, and is then incident into a fly's eye integrator 5015. Beams emergent from the fly's eye integrator 5015 are guided by a mirror 5016 into a main condenser 5017 to uniformly illuminate a reticle 5018a as a photo-mask. A predetermined pattern on the photo-mask 5018a is projected through a projection optical system 5019 onto a wafer 5020 coated with a photosensitive material to effect exposure thereon. Here, after completion of exposure, the reticle 5018a is exchanged for another reticle 5018b having a different pattern by a reticle loader 5021, and second exposure is then conducted.

Instead of the exchange of different patterns by the reticle loader 5021, the apparatus may be so arranged that after the first exposure with the reticle 5018a, the reticle 5018a is moved by a predetermined amount in the direction perpendicular to the optical axis Ax of projection optical system 5019 to then effect second exposure. This predetermined amount is ($\lambda$/4NA) when converted as a coordinate value on the wafer for example in the case using the pattern of FIG. 60A as described previously where the effective exposure intensity is proportional to the square of the light intensity. Where the effective exposure intensity is proportional to the cube of the light intensity, it is effective to set the predetermined value as ($\lambda$/6NA) when converted as a coordinate value on the wafer.

It is of course for cases where a same reticle pattern is used for plural exposure processes that the wafer itself can be arranged to move for each of plural exposure processes, instead of moving the reticle.

Figure 73:
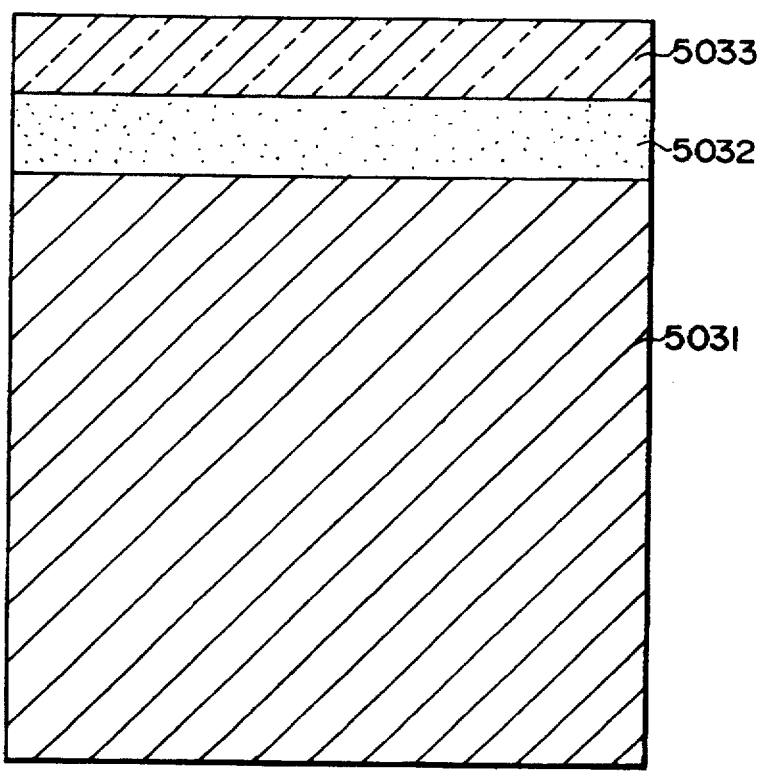
FIG. 73 is a drawing to show a layout of a transmitting film, a photoresist, and a wafer substrate.

Also, before setting the wafer at a predetermined position for predetermined first exposure, a wafer substrate 5031 is coated with a photoresist 5032 as a photosensitive material and a transmitting film 5033 having the nonlinear property, as shown in FIG. 73. First, the photoresist 5032 as a photosensitive material is applied onto the wafer substrate 5031. On this occasion, a rotation center portion of wafer is connected with the rotational shaft of a motor of an applicator, so that rotation of the motor of applicator 5022 uniformly spreads the photoresist 5032 over the wafer substrate 5031 into a thin film. Next, the transmitting film 5033 having the nonlinear property is uniformly spread over the photoresist 5032 in a thin film by the same method as the previous step. Here, the vapor deposition can be used as the method for applying the transmitting film 5033 having the nonlinear property over the photoresist 5032.

Effective alignment between the plural exposure processes is the so-called latent image alignment in which alignment is performed observing the latent image.

Incidentally, as in the embodiment shown in FIG. 60A and 60B, it is effective in the present invention to use the phase shift patterns in order to form a high-resolution pattern. It is also effective to employ the annular illumination proposed in Japanese Laid-open Patent Application No. 61-91662 or to employ the so-called SHRINC illumination proposed in Japanese Laid-open Patent Application No. 4-225358, for example. The exposure method of using the phase shift patterns or mask is described in Optics, vol.23, No.1, pp 29–37, 1994; and in SPIE vol.1780, Lens and Optical Systems Design, pp 117–131, 1992. The annular illumination is described in U.S. patent application Ser. No. 166,153. The SHRINC illumination is described in U.S. patent application Ser. No. 7,91138.

At present, in the cases of n<1, silver halides used for sunglasses are possibly available materials for the transmitting film with the intensity of transmitted light changing in accordance with the intensity of incident light, used in the present invention. Also, other possible materials are light-controlling materials such as spiro-oxazine, spiro-pyran, fluguimide, and chromel. The transmitting film having n less than 1 is described in Technique of Chemistry, vol. 3, PHOTOCHROMISM, edited by Glenn H. Brown, Wiley-Interscience, JOHN WILEY & SONS, INC.

On the other hand, in the cases of n>1, possibly available materials for the transmitting film with the intensity of transmitted light changing in accordance with the intensity of incident light, used in the present invention, are materials undergoing supersaturation absorption materials, such as fine particles of copper, cadmium sulfide (CdS), cadmium selenide (CdSe), phthalocyanine dyes, porphine dyes, etc., and materials undergoing the two-photon absorption, such as polysilicon, quinizarin, etc. Also, other possible materials are materials undergoing the three-photon absorption. The transmitting film having n more than 1 is described in The principles of Nonlinear Optics, edited by Y. R. SHEN, Wiley-Interscience Publication; and in Introduction to nonlinear laser spectroscopy, edited by M. D. Levenson, New York. Academic Press, 1988.

As described above, the present invention enables a fine pattern surpassing the resolution limit of projection optical system to be formed by a plurality of exposure processes with different patterns using the transmitting film showing the nonlinear transmission property. In addition, a high-resolution pattern can be formed with little changing the conventional exposure wavelength and optical system.

With the exposure method according to the present invention, semiconductor devices can be fabricated with very fine circuit pattern which was impossible with the conventional projection exposure apparatus, thus achieving the great effect of highly increasing the degree of integration of integrated circuits.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application Nos. 5-16267 filed on Feb. 3, 1993; 5-236031 filed on Sep. 22, 1993; 6-36750 filed on Mar. 8, 1994; 6-38794 filed on Mar. 9, 1994; 6-118966 filed on May 31, 1994; 6-157389 filed on Jul. 8, 1994; 6-177262 filed on Jul. 28, 1994; and 6-212440 filed on Sep. 6, 1994 are hereby incorporated by reference.

What is claimed is:

1. A projection exposure apparatus for exposing a photosensitive material having a characteristic in which effective light intensity is nonlinear to an intensity of incident light to be applied thereto, said apparatus comprising:

a projection optical system for projecting a first pattern from a first region of a first photo-mask and a second pattern from a second region of a second photo-mask onto said photosensitive material; and a mechanism for moving said first photo-mask related to said photo sensitive material to project said second pattern onto said photosensitive material, wherein the respective intensity distributions of said first and second patterns projected on said photosensitive material are partially overlapped and the peaks thereof are isolated, wherein no portion of the positions occupied by said first and second regions, when said first and second patterns are respectively projected, is overlapped, and wherein a distance between the peaks of the intensity distributions is less than a distance defined by the limit of resolution of the projection optical system.

2. An exposure apparatus according to claim 1, wherein said mechanism moves said first photo-mask in a direction perpendicular to an optical axis of said projection optical system.

3. A projection exposure apparatus for exposing a photosensitive material having a characteristic in which effective light intensity is nonlinear to an intensity of incident light to be applied thereto, said apparatus comprising:

a projection optical system for projecting a first pattern having a first region on a first photo-mask and a second pattern having a second region on a second photo-mask onto said photosensitive material; and a mechanism for replacing said first photo-mask with said second photo-mask to project said second pattern onto said photosensitive material, wherein the respective intensity distributions of said first and second patterns projected on said photosensitive material are partially overlapped and the peaks thereof are isolated, wherein no portion of the positions occupied by said first and second regions, when said first and second patterns are respectively projected, is overlapped, and wherein a distance between the peaks of the intensity distributions is less than a distance defined by the limit of resolution of the projection optical system.

4. An exposure apparatus to claim 3, wherein said first and second photo-masks have mutually different patterns.

5. An apparatus according to claim 3, wherein said first photo-mask is a phase shifting mask, and wherein said first pattern is projected by said incident light passed through said first photo-mask.

6. An apparatus according to claim 3, wherein said first photo-mask is a first phase shifting mask, and wherein said first pattern is projected by said incident light passed through said first photo-mask; and wherein said second photo-mask is a second phase shifting mask, wherein said second pattern is projected by said incident light passed through said second photo-mask.

7. An apparatus according to claim 3, wherein said first photo-mask is a phase shifting mask having an open portion between first and second opaque portions and a phase film arranged between said second opaque portion and a third opaque portion adjacent to said second opaque portion.

8. An apparatus according to claim 3, wherein said first photo-mask is a first phase shifting mask having an open portion between first and second opaque portions and a phase film arranged between said second opaque portion and a third opaque portion adjacent to said second opaque portion; and wherein said second photo-mask is a second phase shifting mask having an open portion between first and second opaque portions and a phase film arranged between said second opaque portion of said second photo-mask and a third opaque portion adjacent to said second opaque portion of said second photo-mask.

9. A protection exposure apparatus for exposing a photosensitive material having a characteristic in which effective light intensity is nonlinear to an intensity of incident light to be applied thereto, said apparatus comprising:

a projection optical system for projecting a first pattern on a first photo-mask onto an exposing region of said photosensitive material;

a mechanism for replacing said first photo-mask with second photo-mask having a second pattern to project said second pattern onto said exposing region of said photosensitive material; and a polarized plate being so arranged that said incident light travels therethrough.

10. A projection exposure apparatus for projecting a pattern including a line pattern onto a photosensitive material, comprising:

a projection optical system for projecting said line pattern onto said photosensitive material; and a polarized plate being so arranged that incident light to be applied thereto passes therethrough, wherein said incident light is polarized along a longitudinal direction of said line pattern.

11. A projection exposure apparatus, comprising:

a projection optical system for projecting light through a first photo-mask onto a photosensitive material;

a mechanism for replacing said first photo-mask with a second photo-mask; and a polarized plate being so arranged that said light travels therethrough.

12. A projection exposure method using a projection optical system, said method comprising the steps of:

projecting a first pattern from a first region of a first photo-mask onto a photosensitive material, wherein said photosensitive material has a characteristic in which effective light intensity is nonlinear to an intensity of incident light to be applied thereto, and projecting a second pattern from a second region of a second photo-mask onto said photosensitive material, wherein the respective intensity distributions of said first and second patterns projected on said photosensitive material are partially overlapped and the peak thereof are isolated, wherein no portion of the positions occupied by said first and second regions, when said first and second patterns are respectively projected, is overlapped, and wherein a distance between the peaks of the intensity distributions is less than a distance defined by the limit of resolution of the projection optical system.

13. An exposure method according to claim 12, wherein said photosensitive material has a nonlinear sensitivity characteristic in which the latent image is formed according to the m-th power (m≠1) of intensity of incident light.

14. An exposure method according to claim 13, wherein said photosensitive material has a nonlinear sensitivity characteristic in which the latent image is formed according to the m-th power of intensity of incident light and m>1.

15. An exposure method according to claim 13, wherein said photosensitive material has a nonlinear sensitivity characteristic in which the latent image is formed according to the m-th power of intensity of incident light and m<1.

16. A method according to claim 12, wherein said first pattern includes a first line pattern extending in a first direction on said photosensitive material from said first photo-mask, and wherein said second pattern includes a second line pattern extending in a second direction on said photosensitive material from said second photo-mask.

17. A method according to claim 12, wherein said first photo-mask is a phase shifting mask.

18. A method according to claim 12, wherein said first photo-mask is a first phase shifting mask, and wherein said second photo-mask is a second phase shifting mask.

19. A method according to claim 12, wherein said first photo-mask is a phase shifting mask having an open portion between first and second opaque portion and a phase film arranged between said second opaque portion and third opaque portion adjacent to said second opaque portion.

20. A method according to claim 12, wherein said first photo-mask is a first phase shifting mask having an open portion between first and second opaque portions and a phase film arranged between said second opaque portion and a third opaque portion adjacent to said second opaque portion; and wherein said second photo-mask is a second phase shifting mask having an open portion between first and second opaque portions and a phase film arranged between said second opaque portion of said second photo-mask and a third opaque portion adjacent to said second opaque portion of said second photo-mask.

21. A projection exposure method using a projection optical system, said method comprising the steps of:

projecting a first pattern from a first region of a first photo-mask onto a photosensitive material through a transmitting film, wherein said transmitting film has such a property that intensity of outgoing light traveling through said transmitting is nonlinear to an intensity of incident light to be applied thereto, and projecting a second pattern from a second region of a second photo-mask onto said photosensitive material, wherein the respective intensity distributions of said first and second patterns projected on said photosensitive material are partially overlapped and the peaks thereof are isolated, wherein no portion of the positions occupied by said first and second regions, when said first and second patterns are respectively projected, is overlapped, and wherein a distance between the peaks of the intensity distributions is less than a distance defined by the limit of resolution of the projection optical system.

22. A projection exposure method using a projection optical system, said method comprising the steps of:

projecting a first pattern onto a photosensitive material, wherein said photosensitive material has a characteristic in which effective light intensity is nonlinear to an intensity of incident light to be applied thereto; and projecting a second pattern onto said photosensitive material, wherein said first pattern and said second pattern are different in intensity distribution in said photosensitive material, whereby a high-resolution pattern is formed over a resolution limit of the projection optical system, and wherein said first pattern includes a line pattern, and wherein light for projecting is polarized along longitudinal direction of said line pattern.

23. A method according to claim 22, wherein said first pattern is formed by light passed through a first phase shifting mask.

24. A projection exposure method comprising the steps of:

forming a photosensitive material, wherein said photosensitive material has a nonlinear sensitivity characteristic in which effective light intensity is nonlinear to an intensity of incident light to be applied thereto; and projecting a line pattern on said photosensitive material, wherein light for projecting is polarized along a longitudinal direction of said line pattern.

25. A projection exposure method comprising the steps of:

forming a transmitting film on a photosensitive material, wherein said transmitting film has such a property that an intensity of outgoing light traveling through said transmitting film is nonlinear to an intensity of incident light to be applied thereto; and projecting a pattern onto said photosensitive material through said transmitting film.

26. A method according to claim 25, wherein said pattern is formed by light passed through a phase shifting mask.

27. A projection exposure method comprising:

forming a photosensitive material, wherein said photosensitive material has a nonlinear sensitivity characteristic in which effective light intensity is nonlinear to an intensity of incident light to be applied thereto;

projecting a first line pattern extending in a first direction onto said photosensitive material; and projecting a second line pattern extending in a second direction onto said photosensitive material.

28. A method according to claim 27, wherein said first line pattern is formed by light passed through a first phase shifting mask.

29. A method according to claim 27, wherein said first line pattern is formed by light passed through a first phase shifting mask, and wherein said second line pattern is formed by light passed through a second phase masking mask.

30. A projection exposure method comprising the steps of:

projecting a first pattern onto a photosensitive material, wherein said photosensitive material has a characteristic in which effective light intensity is nonlinear to an intensity of incident light to be applied thereto; and projecting a second pattern onto said photosensitive material, wherein intensity distributions of said first pattern and said second pattern are different in said photosensitive material, wherein a distance between the peaks of the intensity distributions is less than the distance defined by the limit of resolution of a projection optical system used for projecting said first and second pattern.

* * * * *

UNITED STATES PATENT AND TRADEMARK OFFICE
CERTIFICATE OF CORRECTION

PATENT NO. : 5,739,898

DATED : April 14, 1998

INVENTOR(S) : Toshihiko OZAWA, Masaya KOMATSU, Masato SHIBUYA, Hiroshi OOKI, Masaomi KAMEYAMA, Yoshifumi TOKOYODA.

It is certified that error appears in the above-identified patent and that said Letters Patent is hereby corrected as shown below:

Title page;

On [30] Foreign Application Priority Data, insert : "Feb. 3, 1993 [JP] Japan ......... 016267
Sep. 22, 1993 [JP] Japan ......... 236031

Signed and Sealed this

Twenty-second Day of September, 1998

Attest:

BRUCE LEHMAN

*Attesting Officer*  *Commissioner of Patents and Trademarks*